United States Patent
Asakawa et al.

[11] Patent Number: 5,986,522
[45] Date of Patent: Nov. 16, 1999

[54] PIEZOELECTRIC FILTER OF THE LADDER TYPE

[75] Inventors: Yasuteru Asakawa, Katano; Toshio Ishizaki, Kobe; Tomoki Uwano, Hirakata; Osamu Kawasaki, Kyoto; Yukihiko Ise, Toyonaka; Toru Yamada, Katano; Hiroaki Kosugi, Hirakata, all of Japan

[73] Assignee: Matsushita Electric Industrial Co., Ltd., Osaka, Japan

[21] Appl. No.: 08/588,769

[22] Filed: Jan. 19, 1996

[30] Foreign Application Priority Data

| Jan. 19, 1995 | [JP] | Japan | 7-006158 |
| Feb. 23, 1995 | [JP] | Japan | 7-035167 |
| Feb. 27, 1995 | [JP] | Japan | 7-038389 |

[51] Int. Cl.⁶ .................................. H03H 9/00
[52] U.S. Cl. ........................... 333/189; 333/190
[58] Field of Search .................... 333/186–192

[56] References Cited

U.S. PATENT DOCUMENTS

| 4,607,230 | 8/1986 | Kaku et al. | 329/50 |
| 4,651,109 | 3/1987 | Inoue | 333/190 |
| 4,716,377 | 12/1987 | Inoue | 333/190 |
| 4,837,533 | 6/1989 | Oshikawa | 333/189 |
| 4,841,264 | 6/1989 | Oshikawa | 333/189 |
| 5,077,544 | 12/1991 | Ogawa et al. | 333/189 |
| 5,332,982 | 7/1994 | Kawakami | 333/190 |
| 5,351,021 | 9/1994 | Masaie et al. | 333/189 |
| 5,559,481 | 9/1996 | Satoh et al. | 333/194 X |

FOREIGN PATENT DOCUMENTS

| 2925887 | 1/1981 | Germany . | |
| 2925893 | 1/1981 | Germany . | |
| 54-163649 | 12/1979 | Japan . | |
| 56-62416 | 5/1981 | Japan | 333/191 |
| 59-210713 | 11/1984 | Japan | 333/189 |
| 1-91328 | 6/1989 | Japan . | |
| 01314008 | 12/1989 | Japan . | |
| 4-114229 | 10/1992 | Japan . | |
| 4-121124 | 10/1992 | Japan . | |
| 2254972 | 10/1992 | United Kingdom . | |

OTHER PUBLICATIONS

Takeshi Inoue et al., "Construction Method for Ladder Filters Employing Piezoelectric Ceramic Resonators", *Transactions of the IECE of Japan*, vol. E69, No. 7, Jul. 1986, pp. 788–795.

Copy of Communication, European Search Report No. EP 96100701 dated Mar. 13, 1998, and Annex.

Patent Abstracts of Japan vol. 008, No. 268 (E–283), Dec. 7, 1984, & JP 59–140713A (Murata Seisakusho:KK), Aug. 13, 1984.

*Primary Examiner*—Seungsook Ham
*Attorney, Agent, or Firm*—Smith, Gambrell & Russell, LLP

[57] ABSTRACT

A piezoelectric filter is one not changing in the holding position of resonator in spite of impulse, small in the number of parts, easy to assemble from one direction, small, thin, and stable in characteristic. For example, as shown in FIG. 7, on electrode patterns on a package 10 forming wiring electrode patterns 11, holding protrusions 13 for holding resonators, and partition boards 14 for positioning resonators, a rectangular plate type piezoelectric resonators 12 are adhered with conductive adhesive. The rectangular plate type piezoelectric resonators 12 and the package 10 are adhered and reinforced from above with a vibration absorbing member 15, and wiring is formed from above the resonators by a wire bonding 16, thereby wiring resonators in a ladder form. Or, as shown in FIG. 11, after forming electrode patterns 102 on a piezoelectric substrate 101, a rectangular plate resonator 104 is cut out from a piezoelectric substrate 101 by laser in a shape consecutive to the piezoelectric substrate 101 by the node of length expander mode, and the piezoelectric substrate 101 is enclosed by a spacer 106 and a sheet 107 from above and beneath.

11 Claims, 54 Drawing Sheets

12 Rectangular plate type piezoelectric resonator

Partition board
14
13 Holding protrusion
10 Liquid polymer package
11 Electrode pattern 15 Vibration absorbing member
Wire 16

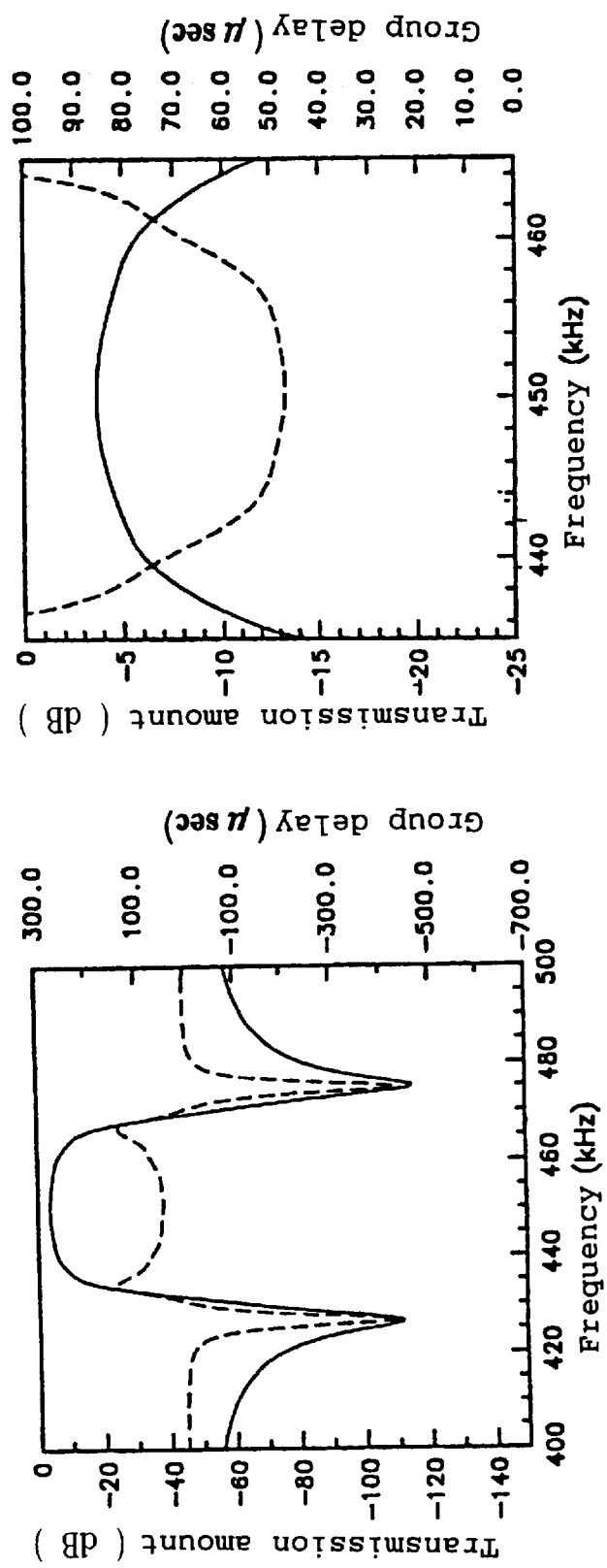

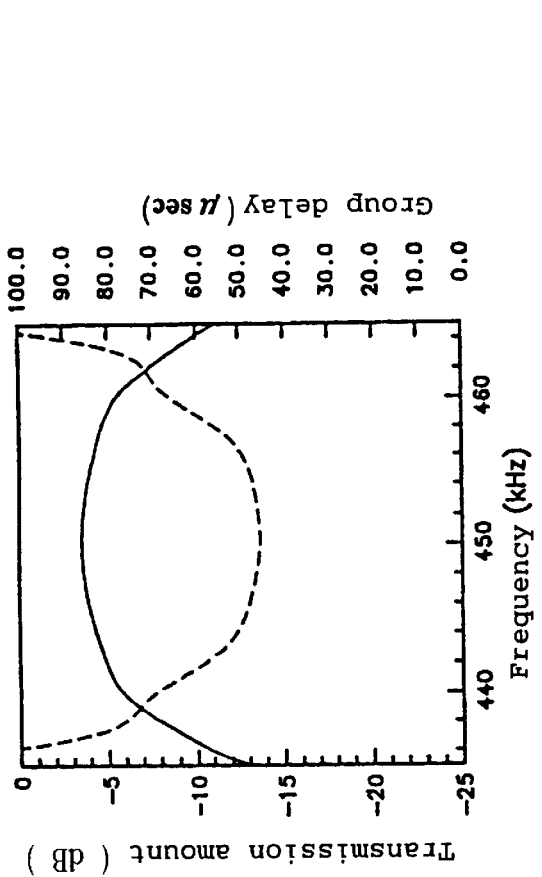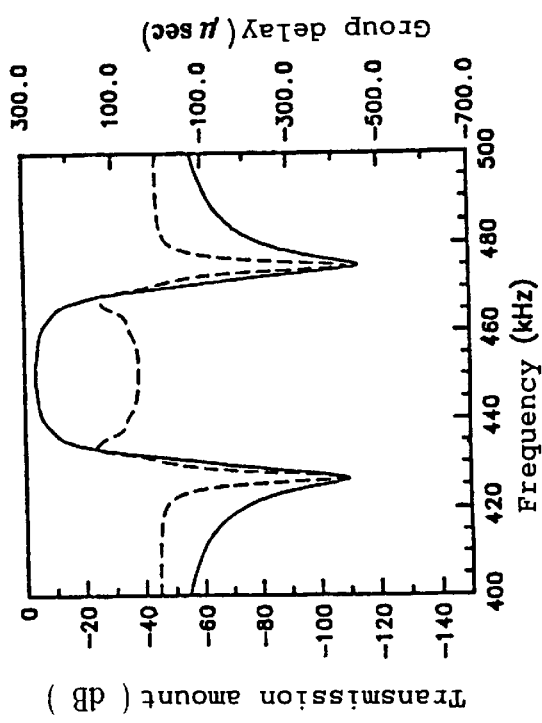
Fig. 20(A)
Fig. 20(B)
| df1 df2 df3 df4 (kHz) : | 24 24 24 24 |
| k1 k2 k3 k4 : | 1 1 1 1 |
| Q1 Q2 Q3 Q4 : | 150 150 150 150 |
——— Attenuation characteristic
----- Group delay characteristic

| | df1 | df2 | df3 | df4 (kHz) |
|---|---|---|---|---|
| | 24 | 24 | 24 | 24 |
| k1 | k2 | k3 | k4 | |
| | 0.667 | 1 | 1 | 1.5 |
| Q1 | Q2 | Q3 | Q4 | |
| | 150 | 150 | 150 | 150 |

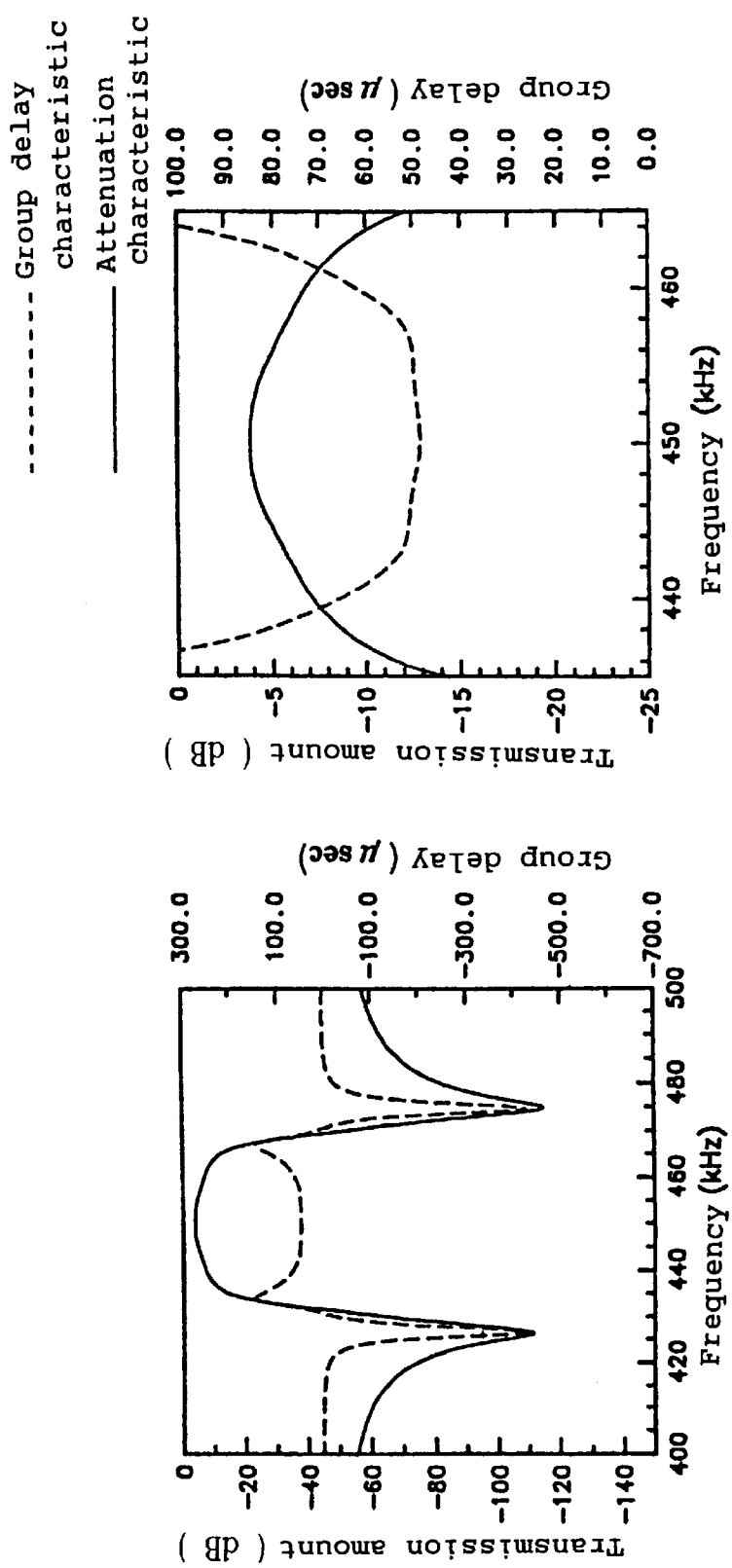

Nyquist interval ($T_0$)

PIEZOELECTRIC FILTER OF THE LADDER TYPE

BACKGROUND OF THE INVENTION

1. Field of the Invention

The present invention relates to a piezoelectric filter, especially intermediate frequency filter or the like, utilizing a piezoelectric resonator, mainly used in radio appliances such as mobile communication appliances, acoustic appliances, and others, and its manufacturing method.

2. Related Art of the Invention

Generally, as intermediate frequency filter used in radio appliances or the like, the piezoelectric filter making use of contour-extensional mode (radial mode) of a disk or square plate piezoelectric resonator is employed in a wide range. That is, these piezoelectric resonators are composed in a ladder structure, the dimension of the series elements and the dimension of parallel elements are adjusted, the resonance frequency of series elements and antiresonance frequency of parallel elements are matched to compose a passing region, and attenuation poles are formed at both sides, so that a steep filter characteristic is realized. At this time, the matching impedance of the filter is the matching impedance at the center frequency of the filter.

To realize a steep filter characteristic, each piezoelectric resonator must be supported at a position of a node of vibration of the vibration mode to be utilized in order to avoid vibration blocking. For this supporting, hitherto, the pressure between a metal leaf spring and case for package was utilized, or instead of the leaf spring, directly, electrode plates for input, for output and for earth were used to make use of the pressure against the case. At this time, the piezoelectric resonators are wired by leaf spring for wiring which is composed by preliminarily integrating the necessary electrode plates to be connected.

Referring now to the drawings, an example of such conventional piezoelectric resonator is described below.

FIG. 46 is a perspective exploded view showing a constitution of a ladder type piezoelectric ceramic filter making use of a square plate contour-extensional mode (radial mode) disclosed, for example, in Japanese Laid-open Utility Model No. 4-114229. FIG. 47 is a circuit diagram showing its equivalent circuit. In FIG. 46, reference numeral 321 is a square plate type piezoelectric resonator for series elements (hereinafter called piezoelectric resonator), and 322 is a square plate type piezoelectric resonator for parallel elements (hereinafter called piezoelectric resonator). These piezoelectric resonators 321, 322 are different in thickness and electrode area for the purpose of adjustment of electric capacity. Reference numeral 323 is an electrode plate for input, 324 is an electrode plate for output, 325 is an electrode plate for earth, and 327 is an electrode plate for wiring. In the electrically connecting portion of these electrode plates 323 to 325, 327 and the piezoelectric resonators 321, 322, an emboss 326 is formed in order to support the piezoelectric resonators 321, 322 securely at the position of a node of vibration. Moreover, reference numeral 328 is a package, and 329 is a leaf spring for applying pressure for support of the piezoelectric resonators 321, 322. Reference numeral 330 is a sealing plate to be adhered to the package after inserting the piezoelectric resonators 321, 322, electrode plates 323 to 325, 327, and leaf spring 329 into the package.

In such conventional constitution, however, since the central portion of the piezoelectric resonators 321, 322 at the node of vibration is supported by press-fitting with the electrodes plates 323 to 325 and 327 by the pressure of the leaf spring 329, assembling is difficult, and the supporting position of the piezoelectric resonators 321, 322 is deviated by external impact, the resonance characteristic of the piezoelectric resonators 321, 322 varies, the filter characteristic fluctuates, and a large change occurs in the time course.

Or, in the case of ladder type wiring by electrode plates, plural types of electrode plates 323, 324, 325, 327 are needed, and therefore the number of parts is many, the assembling process is complicated, and the cost is increased.

Besides, using a square plate type piezoelectric resonator, the shape of the piezoelectric resonator is large, and when the number of stages of the filter is increased, the filter size is extremely increased.

Structurally, furthermore, since assembling from one direction is difficult, and it is hard to automate the assembling, and mass production is difficult.

On the other hand, recently, as the mobile communication field is digitized, not only the attenuation characteristic is important, but also the group delay time characteristic comes to be regarded with special importance. Herein, the group delay time is obtained by differentiating the phase by frequency. Meanwhile, since the digital signal is modulated and demodulated by deviation of phase, accurate modulation or demodulation is not guaranteed unless the phase rotation changes linearly. For accurate modulation and demodulation, accordingly, the group delay time characteristic is utilized as the index for expressing the shift of the phase rotation from linearity by the time difference.

Referring further to the drawings, a conventional method of flattening the group delay characteristic in a required band of a piezoelectric ceramic filter having a basic structure shown in FIG. 46 is described below.

FIG. 48 shows the filter characteristic of a conventional piezoelectric filter, and FIG. 49 is a filter characteristic diagram for explaining a conventional design technique for flattening the group delay characteristic within a specific band. The solid line in FIG. 48 shows the attenuation characteristic, and the broken line denotes the group delay characteristic. In FIG. 48, the attenuation characteristic outside the passing band is extremely moderate, and hence the selective characteristic is insufficient in the portion of large attenuation amount. This is because, in order to flatten the group delay characteristic in the specific bandwidth, the bandwidth is designed broad by employing the vibration mode of large electric-mechanical coupling factor or material of large coupling factor, thereby setting preliminarily large the frequency region in which the group delay characteristic is flat, and the mechanical quality Qm is lowered by the damping resistance or conductive rubber, and the bandwidth is narrowed to the desired bandwidth while keeping large the flat region of group delay characteristic. Accordingly, the insertion loss also increases.

The above design technique is specifically described below by reference to FIG. 49.

In FIG. 49, broken line 1 denotes the attenuation characteristic in an initial design, and broken line 2 indicates the group delay characteristic at this time. Herein, the initial design bandwidth is set larger than the specific bandwidth, and therefore the portion of large group delay time is positioned at both remote ends of outside of the specific bandwidth as seen from the center frequency. In this state, the group delay characteristic in the specific bandwidth is nearly flat. By lowering Qm of the resonator in this state, the attenuation characteristic of solid line 1 is realized and a desired bandwidth is obtained. At this time, the group delay characteristic is as shown by solid line 2, and the peak value at both sides of the group delay time is small, and the flat portion of the group delay characteristic is not narrowed. Techniques for lowering the Qm of the resonator include a method of inserting a conductive rubber 331 between electrode plate and piezoelectric resonator as shown in FIG. 50 (for example, Japanese Laid-open Utility Model No. 4-114229), a method of connecting a damping resistance R332 to each resonator as shown in FIG. 51 (for exampler Japanese Laid-open Utility Model No. 4-121124), and a method of using directly a piezoelectric material with small Qm.

In other design techniques, the value of Qm of each piezoelectric resonator of series and parallel branches of input and output ends for composing the filter is set more than 1.5 times the Qm value of the piezoelectric resonator in each intermediate position (for example, Japanese Laid-open Patent No. 1-314008), the difference Δf between resonance frequency and antiresonance frequency of each piezoelectric resonator is varied and the arrangement is changed (for example, Japanese Laid-open Utility Model No. 1-091328), or the capacity ratio of piezoelectric resonators is changed (for example, Japanese Laid-open Patent No. 54-163649), and thus it has been attempted to improve the attenuation characteristic and group delay characteristic by considering the material and manufacturing process.

In such conventional methods of improvement however, if the group delay characteristic is improved by designing large the filter bandwidth, the design method for assuring the symmetricity of the filter characteristic is not established, and the selective characteristic outside the specific bandwidth is not achieved, and the design technique has its own problems. To obtain a flat group delay characteristic, by using conductive rubber or damping resistance, the number of parts increases and assembling is difficult. Moreover, to vary the Qm of the resonator or frequency difference Δf of resonance frequency and antiresonance frequency, plural piezoelectric materials are used, or piezoelectric resonators of partial electrodes or unsaturated polarization are needed, and hence the number of parts increases, the process is complicated, and stable piezoelectric characteristic is not obtained. In any case, by the lowered portion of Qm (the portion of adding the resistance), the insertion loss of the filter increases. In the conventional constitution, only the peak value of the group delay ripple deviation is lowered by adding the resistance, and nothing has been discussed about the symmetrical constitution of the group delay characteristic with respect to the center frequency.

On the other hand, a principal problem in digital signal transmission technology is increase of code errors by the inter-code interference the pulse receives, derived from the distortion of the pulse waveform generated when the pulse signal passes through the transmission path.

Usually, the frequency spectrum of square pulse theoretically has an infinite frequency component. Therefore, in order to receive accurately the square pulse waveform transmitted through the transmission path, theoretically, it is required that the transmission path can transmit an infinite frequency component. Accordingly, an extremely wide band is needed in the frequency characteristic for the transmission signal in the transmission path, and it is not desired from the viewpoint of utilization efficiency of the transmission frequency band, and, in addition, an unnecessarily extra noise portion is also received.

When the transmission path band is narrowed to decrease this noise component, the reception pulse waveform is expanded in the time axis direction, and an adverse effect is exerted on the distinguishing point of the front and rear adjacent pulses. Therefore, it is desired to equalize into pulse waveform small in the inter-code interference and small in noises, that is, minimum in the code error rate.

The most basic band limiting is the use of filter having an ideal low frequency filter characteristic. The response when an impulse is applied to this filter is a known response waveform 151 as shown in FIG. 52.

In this response waveform 151, excluding the central peak at t=0. zero point appears in every To (=½ of). In this case, interval To until t=0 to To is called a Nyquist interval 152, and by transmitting the impulse row at this Nyquist interval 152, inter-code interference can be completely avoided for momentary detection done in the middle of the reception pulse. The pulse row of smaller interval than this Nyquist interval 152 is not transmitted usually because the fundamental wave component is cut off. That is, the bit rate corresponding to the Nyquist interval 152 gives the transmission limit in its band.

It is actually extremely difficult to realize such ideal low frequency filter characteristic. Accordingly, to determine the filter condition in actual transmission path, the first standard of Nyquist is used.

According to the first standard of Nyquist, as shown in FIG. 53a, regarding the cut-off angular frequency ωo, a filter characteristic 162 of an odd-symmetric filter having an odd-symmetric property is added to a filter characteristic 161 of an ideal filter to synthesize, and when a filter characteristic 163 as shown in FIG. 53b is formed, the intersecting point on the axis of abscissas (ωto) of an impulse response waveform 165 is not changed as shown in FIG. 53d.

The filter characteristics shown in FIG. 53b and FIG. 53c can be realized, and it is characteristic that there is no inter-code interference to the impulse transmission of repeated frequency 2fo. There are infinite odd-symmetric frequency characteristics that can be added to the filter characteristic 161 of ideal filter, and hence there are also infinite synthesized filter characteristics made by such adding. Of such synthesized filter characteristics, the filter characteristic generally used widely is the filter characteristic 163 shown in FIG. 53b, which is called roll-off spectrum, and is expressed in formula 1.

$$H(\omega) = \begin{cases} 1 & 0 \leq \omega \leq \omega_0(1-\alpha) \\ \frac{1}{2}\left[1 - \sin\left\{\frac{\pi}{2\alpha\omega_0}(\omega - \omega_0)\right\}\right] & \omega_0(1-\alpha) \leq \omega \leq \omega_0(1+\alpha) \\ 0 & \omega \geq \omega_0(1+\alpha) \end{cases} \quad \text{[Formula 1]}$$

where α is a coefficient expressing the degree of inclination of band limiting, called the roll-off factor, and by varying the value of the roll-off factor α in a range of 0≤α≤1, as shown in FIG. 53c, the filter characteristic can be changed from the filter characteristic 164a at α=0 to the filter characteristic 164b at α=1. Besides, ωo is expressed as ωo=πTo by using the Nyquist interval To.

Usually, the combination of root roll-off filter characteristics by distributing the characteristic expressed in formula 1 equally into the transmission side and reception side of the transmission system is the optimum transmission system characteristic for minimizing the code error rate.

To visually observe the reception pulse waveform including the inter-code interference and noise, an eye diagram (eye pattern) schematically depicted in FIG. 54 is convenient. The eye diagram is a waveform depicted on an oscilloscope, by demodulating a digital signal row modulated by a random pulse at the reception side, and synchronizing the demodulated waveform by clock pulse.

The opening portion 171 of a waveform pattern looking like an eye near the recognition point of the eye diagram shown in FIG. 54 is called the eye, and the allowance of code discrimination can be determined from this aperture rate. Supposing the aperture rate of the eye has deterioration of $\Delta V$ in the amplitude axial direction (vertical direction) and $\Delta T$ in the time axial direction (lateral direction), as compared with the ideal eye, the eye aperture rate in the amplitude axial direction is expressed as $V_a/V_p$, and the aperture rate in the time axial direction is $T_a/T_p$, and the quality of the transmission system characteristic can be evaluated by these eye aperture rates.

This evaluation by eye aperture rate is convenient as qualitative observation because it intuitively appeals to the human senses, but it lacks quantitative evaluation.

On the other hand, as a quantitative evaluation scale of digital signal transmission system, the vector amplitude error expressing an error from an ideal modulation waveform is known. It is, as shown in FIG. 55, a vector amplitude error 182 expressing a deviation from an ideal signal 181, on the basis of the coordinate R of amplitude/phase of ideal $\pi/4$ shift QPSK signal, and coordinate S of amplitude/phase of actually measured $\pi/4$ shift QPSK signal.

Generally, the ratio of (absolute value of vector amplitude error 182)/(absolute value of amplitude of ideal signal 181) is called the modulation precision, and it is used as the evaluation scale in the digital signal transmission system. In the RCR (Research & Development Center of Radio System) standard, the modulation precision of transmission signal is specified to be within 12.5%.

Thus, in the digital transmission system, it is important to realize the transmission path capable of obtaining a response of small code error by eliminating the inter-code interference to the impulse signal, and the roll-off filter is known as a most representative filter capable realizing such impulse response. By using this roll-off filter as the intermediate frequency filter in a communication appliance in digital radio transmission system, the code error rate derived from inter-code interference can be reduced also in the digital radio transmission system.

The roll-off filter suited to digital signal transmission mentioned so far can be, of course, composed easily by using individual parts such as inductors and capacitors, and has been used conventionally. Such LC filter, however, composed by using inductors (L) and capacitors (C) has its limit in downsizing, and cannot satisfy sufficiently the demand of the days of miniaturization of communication appliances, and it is already a past item.

Accordingly, ever since piezoelectric properties are recognized in ceramic elements made of barium titanate ($BaTiO_3$), piezoelectric ceramic materials becoming capable of selecting freely the dielectric constant, piezoelectric properties, mechanical quality coefficient, temperature characteristic and others as a result of development of composition called three-component PZT come to be used widely as material for resonators owing to many features as compared with other piezoelectric materials, such as large piezoelectric property, large dielectric constant, wide range of characteristic obtained by varying the composition, free forming of shape, high stability, mass producibility, low cost, suitability to downsizing, and many others.

Therefore, this piezoelectric ceramic material can be used as the material for intermediate frequency filter in 450 Hz band used in a digital mobile communication appliance, and hitherto ceramic filters composed by using piezoelectric ceramic materials have been widely used as intermediate frequency filters in digital mobile communication appliances.

The conventional intermediate frequency filter composed of such ceramic filter has been used widely for the purpose of downsizing in the mobile communication appliances in digital radio transmission system, and is presently used as intermediate frequency filter, but in this ceramic filter, assuming the deviation of frequency by temperature characteristic and the like, the 3 dB passing band of ±10.5 kHz is designed somewhat wider, and a resistor is externally fitted to the resonator in order to decrease the group delay deviation, and the modulation precision of the required limit is achieved by such means in most cases. When using the filter of such kind in the digital transmission system, at the present, there is almost no information useful and practical for its design and manufacture, and, although the size can be reduced, the design is difficult and manufacture is not easy.

In general radio frequency signal transmission system such as digital signal transmission system using a radio signal frequency signal, such a ceramic filter is generally used only at the reception side as an intermediate frequency filter, and therefore in the digital radio transmission system, owing to the above problems, it was extremely difficult to realize the root roll-off characteristic at the reception side where the intermediate frequency filter composed of such ceramic filter is used.

SUMMARY OF THE INVENTION

It is hence a primary object of the invention to present, in consideration of the problems of the conventional piezoelectric filters, a piezoelectric filter which is easy to support the piezoelectric resonator, free from change in supporting position in spite of impact, small in the number of parts, easy to assemble from one direction, small and thin, and stable in characteristic, and its manufacturing method.

To achieve the object, the piezoelectric filter of the invention comprises a mounting member forming an electrode pattern on the surface, and a rectangular plate type piezoelectric resonator for utilizing length vibration, being mounted on the mounting member, wherein the electrode on the top of the rectangular plate type piezoelectric resonator is connected by a wire.

In this constitution, it is preferred to form a positioning sheet having a hole cut out in a specific shape for disposing the piezoelectric resonator further on the mounting member. It is also preferred to form a slit in the surface of the mounting member forming an electrode pattern. Moreover, it is preferred to have the slit existing among the rectangular plate piezoelectric resonators of the substrate. The mounting member is preferred to be composed of at least one material selected from the group consisting of liquid crystal polymer, epoxy resin impregnated glass fiber substrate and phenol resin. In addition, a partition board for positioning of the rectangular plate type piezoelectric resonator should be preferably formed integrally on the mounting surface of the mounting member. On the mounting surface of the mounting member, still more, it is preferred to form a protrusion for holding the rectangular plate type piezoelectric resonator integrally. At least part of the rectangular plate type piezoelectric resonator is preferably adhered and fixed to the mounting member or positioning sheet by means of vibration absorbing member. The part corresponding to the node of length expander of the top electrode of the rectangular plate type piezoelectric resonator is preferred to be adhered and fixed to the mounting member or positioning sheet by means of vibration absorbing member. The series resonators and parallel resonators of the piezoelectric filter are preferred to be disposed alternately. At least part of the bottom electrode of the rectangular plate type piezoelectric resonator should have a protrusion, and this protrusion is preferred to be adhered and fixed to the electrode pattern on the mounting member. The rectangular plate type piezoelectric resonator should preferably have an electrode of the same material as the wire bonding member at least in part of the surface thereof.

The manufacturing method of the piezoelectric filter is characterized by forming an electrode pattern on the mounting member, adhering the electrode pattern and bottom electrode of the rectangular plate type piezoelectric resonator with a conductive adhesive, and wiring the top electrode of the rectangular plate type piezoelectric resonator by wire bonding.

In this method, it is preferred to provide a slit by using a laser on the surface of the mounting member forming an electrode pattern. It is also preferred to form integrally a partition board for positioning of the rectangular plate type piezoelectric resonator on the mounting surface of the mounting member. On the mounting surface of the mounting member, it is further preferred to form integrally a protrusion for holding the rectangular plate type piezoelectric resonator. At least part of the rectangular plate type piezoelectric resonator making use of length expander is preferred to be adhered and fixed to the mounting member by a vibration absorbing member including a resin component. The part corresponding to node of length expander of the rectangular plate type piezoelectric resonator and the mounting member are preferred to be adhered and fixed from above by means of a vibration absorbing member. It is further preferred to place a vibration absorbing member in a gap formed by the end face of two partition board arranged in a row along the length direction and the protrusion integrally formed on the mounting surface of the mounting member.

According to the piezoelectric filter of the invention, comprising the mounting member forming an electrode pattern on the surface and a rectangular plate type piezoelectric resonator making use of length expander provided on the mounting member, the top electrode of the rectangular plate piezoelectric resonator is connected by wire, and hence it is possible to assemble from one direction, structurally, and an easy-to-manufacture piezoelectric filter is achieved.

Moreover, when a positioning sheet having a hole cut out in a specified shape for disposing the piezoelectric resonator is further provided on the mounting member, the piezoelectric resonator can be easily disposed.

When forming a slit on the surface of the mounting member forming an electrode pattern, the vibration of the piezoelectric resonator hardly circulates to affect the other piezoelectric resonators, so that a stricter filter design is enabled. In particular, the filter characteristic is excellent when a slit is present among the rectangular plate type piezoelectric resonators of the substrate.

When the mounting member is composed of at least one material selected from the group consisting of liquid crystal polymer, epoxy region impregnated glass fiber substrate, and phenol resin, these materials absorb the vibration propagating through the mounting member, so that the filter characteristic is stabilized.

Moreover, when the partition board for positioning of the rectangular plate type piezoelectric resonator is integrally formed on the mounting surface of the mounting member, the number of parts is decreased, and resonators can be disposed easily. Besides, the resonator interval can be narrowed, so that the size may be further reduced.

On the mounting surface of the mounting member, when a protrusion for holding the rectangular plate type piezoelectric resonator is integrally formed, a favorable resonant characteristic is obtained.

When at least part of the rectangular plate type piezoelectric resonator is adhered and fixed to the mounting member of positioning sheet with a vibration absorbing member, deviation of the holding position is not caused by impact, and the resonator characteristic does not change, so that a piezoelectric filter stable in characteristic is realized. In particular, the stability of the filter is enhanced when the part corresponding to node of length expander of the top electrode of the rectangular plate type piezoelectric resonator is adhered and fixed to the mounting member or positioning sheet with a vibration absorbing member.

When arranging series resonators and parallel resonators alternately, since the resonance frequency of adjacent resonators differs, and hence effects of vibration propagating through the substrate may be suppressed.

In the case at least part of the bottom electrode of the rectangular plate type piezoelectric resonator has a protrusion, and this protrusion is adhered and fixed to the electrode pattern on the mounting member, positioning of elements is not needed when assembling and fluctuations of characteristics due to deviation of holding position of an element can be suppressed.

When the rectangular plate type piezoelectric resonator has an electrode of the same material as the wire bonding material at least in part of the surface, the wire driving position is specified when manufacturing the piezoelectric filter, and the filter can be manufactured easily.

According to the manufacturing method of the piezoelectric filter of the invention, by forming an electrode pattern on the mounting member, adhering the electrode pattern and the bottom electrode of the rectangular plate type piezoelectric resonator with a conductive adhesive, and wiring the top electrode of the rectangular plate type piezoelectric resonator by wire bonding, the piezoelectric filter can be efficiently and easily assembled without requiring the complicated electrode plates as in the prior art.

When forming a slit by using laser on the surface of the mounting member forming electrode pattern, an excellent piezoelectric filter can be manufactured easily.

By forming a vibration absorbing member in the gap formed between the end faces of two partition boards disposed in a row along the length direction and the protrusion formed integrally on the mounting surface of the mounting member, the amount of the vibration absorbing member can be controlled easily, and characteristic fluctuations can be suppressed.

Thus, the invention can present a piezoelectric filter (ladder type piezoelectric ceramic filter) particularly suited to mobile communication appliances and the like.

To achieve the object, the piezoelectric filter of the invention comprises a plate resonator used in length expander mode, and a plate resonator integrally forming a node line part for supporting the plate resonator by the node of the length expander mode.

The piezoelectric filter of ladder type structure also comprises a plate resonator for series elements used in a length expander mode, a first piezoelectric substrate integrally forming a node line part for supporting the plate resonator by the node of the length expander mode, a plate resonator for parallel elements used in a length expander mode, a second piezoelectric substrate integrally forming a node line part for supporting the plate resonator by the node of the length expander mode, and a spacer forming a wiring pattern on the surface, wherein a wiring pattern for electrode distribution is formed on each piezoelectric substrate, and this wiring pattern and the wiring pattern on the spacer are electrically connected through a conductive adhesive.

The manufacturing method of the piezoelectric filter of the invention is characterized by forming an electrode pattern on a piezoelectric substrate, cutting out a plate resonator from the piezoelectric substrate by laser into a shape consecutive to the piezoelectric substrate at the node of the length expander mode, and enclosing the piezoelectric substrate by spacer and sheet from above and below.

In the piezoelectric filter of the invention, the plate resonator used in the length expander mode, and the node line part for supporting the plate resonator by the node of the length expander mode are formed integrally, so that the plate resonator may be held securely.

In the piezoelectric filter of the invention, for series elements and for parallel elements, the plate resonator, and the node line part for supporting the plate resonator by the node of the length expander mode are formed integrally in individual piezoelectric substrates, and these plate resonators are connected in a ladder type structure, so that the capacity ratio between the resonators can be determined arbitrarily.

According to the manufacturing method of the piezoelectric filter of the invention, after forming an electrode pattern on the piezoelectric substrate, the plate resonator is cut out from the piezoelectric substrate by laser in a shape consecutive to the piezoelectric substrate at the node of the length expander mode, and the piezoelectric substrate is enclosed by spacer and sheet from above and beneath, and therefore the number of parts is smaller and the assembling is easy.

Thus, according to the invention, supporting of piezoelectric resonator is easy, the support position is not changed by impact, the number of parts is smaller, assembling is easy, and stable characteristic is obtained in small and thin structure.

It is other object of the invention to provide a piezoelectric filter which is small in the number of parts, simple in assembling and adjusting processes, small in the filter insertion loss, symmetrical to the center frequency, and excellent in group delay characteristic and attenuation characteristic.

To achieve the object, in the ladder type piezoelectric filter of the invention connecting plural stages of units connecting series elements and parallel elements using piezoelectric resonators in an L-form, the bandwidth of the input stage unit out of the plural stages of units and the bandwidth of the output stage unit are substantially the same, and the bandwidth is larger than the bandwidth of the intermediate stage unit.

In the ladder type piezoelectric filter of the invention connecting plural stages of units connecting series elements and parallel elements using piezoelectric resonators in an L-form, the input side matching impedance of the entire circuit and the output side matching impedance are substantially equal, and the value of the matching impedance of the output stage unit is the value of the square of the input side matching impedance or output side matching impedance divided by the matching impedance of the input side unit, and the product of matching impedances of two units at symmetrical positions of the intermediate unit corresponding to the entire units is substantially equal to the product of the matching impedance of the output stage unit and the matching impedance of the input stage unit.

In this constitution, in the ladder type piezoelectric filter of the invention, the bandwidth of the input stage unit out of plural stage units and the bandwidth of the output stage unit are substantially the same, and the bandwidth is larger than the bandwidth of the intermediate stage unit, and therefore by composing the unit in four stages, for example, the bandwidth of the input stage unit and output stage unit is both set at maximum, and the bandwidth of the two units in the intermediate stages is set smaller than the bandwidth of the input stage unit, and therefore the group delay characteristic may be controlled without practically changing the design bandwidth.

Also according to the invention, the value of the matching impedance of the output stage unit is the value of the square of the input side matching impedance or output side matching impedance divided by the matching impedance of the input side unit, and the product of matching impedances of two units at symmetrical positions of the intermediate unit corresponding to the entire units is substantially equal to the product of the matching impedance of the output stage unit and the matching impedance of the input stage unit, so that the specific point for rotating the phase of the ladder type piezoelectric filter by $\pi/2$ may be set at a frequency point symmetrical to the center frequency. The group delay characteristic is obtained by differentiating the phase by frequency, and therefore when the specific point is symmetrical, the attenuation characteristic and group delay characteristic symmetrical to the center frequency of the filter may be realized.

Thus, according to the invention, the number of parts is small, the assembling and adjusting processes are simple, the filter insertion loss is small, and favorable group delay characteristic and attenuation characteristic symmetrical to the center frequency are obtained.

It is a further object of the invention, when used as an intermediate frequency filter of the communication appliance in a digital radio transmission system, to present an intermediate frequency filter having an excellent filter characteristic, lowered in code error rate derived from inter-code interference, easy in design and manufacture, and reduced in size.

To achieve the object, the intermediate frequency filter of the invention selects and outputs the specific frequency components of the input signal, determines the frequency width including up to 3 dB attenuation point to the input signal of the output signal at 3 dB bandwidth for allowing band passing of the input signal, and possesses a characteristic presenting a transmission loss greater than the root roll-off filter in the passing region and a characteristic presenting a transmission loss smaller than the root roll-off filter in the attenuating region, as the transient region characteristic between the passing region corresponding to within 3 dB bandwidth and attenuating region corresponding to outside 3 dB bandwidth, on the basis of the root roll-off filter with a roll-off factor of 0.5.

According to the above constitution, when used as intermediate frequency filter of communication appliance in digital radio communication system, it acts to reduce the code error rate derived from inter-code interference.

Therefore, when used as intermediate frequency filter of communication appliance in digital radio communication system, an excellent filter characteristic is provided, and the code error rate derived from inter-code interference can be reduced.

When the intermediate frequency filter is composed by using piezoelectric ceramic element, or elastic surface wave element, or integrated switched capacitor, designing and manufacturing may be much easier, and the size can be reduced.

Thus, when used as the intermediate frequency filter of portable communication appliance such as a mobile communication slave unit in a digital radio transmission system, such communication appliances may be further reduced in size.

BRIEF DESCRIPTION OF THE DRAWINGS

FIG. 19(a), (b) are filter characteristic diagrams of the ladder type piezoelectric filter in embodiment 10.

FIG. 20(a), (b) are filter characteristic diagrams of a comparative filter to be compared with the ladder type piezoelectric filter in embodiment 10.

FIG. 29(a), (b) are filter characteristic diagrams of an example of a ladder type piezoelectric filter in embodiment 14 of the invention.

PREFERRED EMBODIMENTS OF THE INVENTION

Referring now to the embodiments, the invention is specifically described below.

(Embodiment 1 )

Figure 1A:
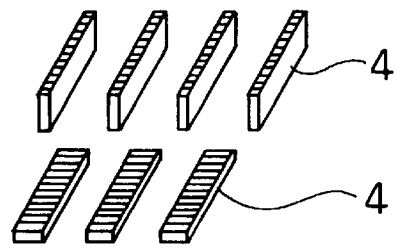
FIG. 1 is a perspective view showing a constitution of a ladder type piezoelectric ceramic filter in embodiment 1 of the invention, in which (a) is a rectangular plate type piezoelectric resonator, (b) is a positioning sheet, (c) is a substrate, and (d) is a ladder type piezoelectric ceramic filter.
Figure 1B:
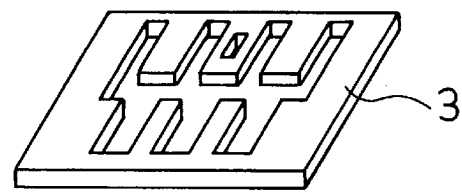
Figure 1C:
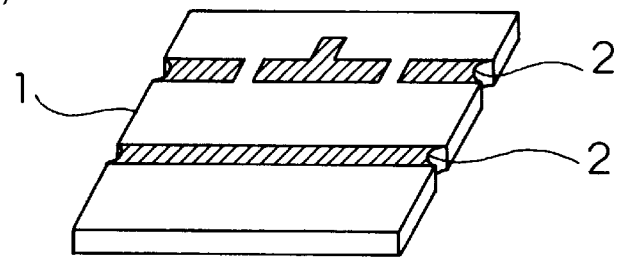
Figure 1D:
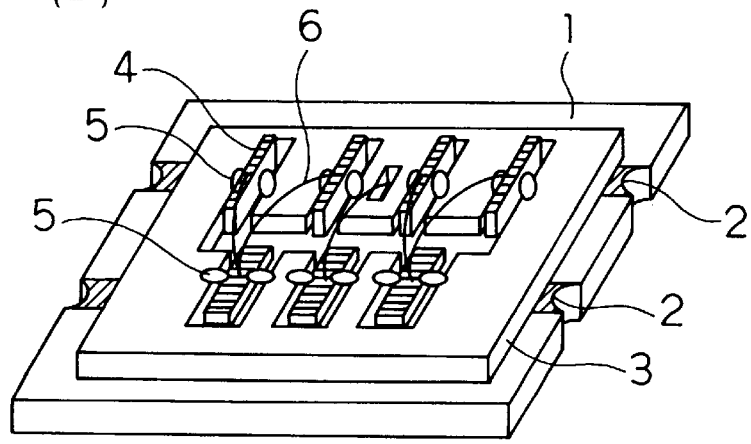

FIG. 1(a) to (c) are perspective views showing constituent parts of a piezoelectric ceramic filter in a first embodiment of the invention, and (d) is a perspective view showing the constitution of a completed piezoelectric ceramic filter.

As shown in FIG. 1(a), there are two types of rectangular plate type piezoelectric resonators 4, and slender elements smaller in the electrode area are series elements in an equivalent circuit of a ladder type piezoelectric ceramic filter, and broad elements larger in the electrode area are parallel elements. A positioning sheet 3 shown in (b) is composed of plastic, and is blanked in the positions for accommodating the rectangular plate type piezoelectric resonators 4. A substrate 1 (11.6×9.9 mm, thickness 0.25 mm) shown in (c) is made of alumina, and an electrode pattern 2 is formed on the surface.

The positioning sheet 3 of 0.25 mm in thickness is adhered on a proper place on the substrate 1, rectangular plate type piezoelectric resonators 4 are disposed in the blanked positions of the positioning sheet 3, and the node parts of length expander of the bottom electrodes of the resonators are adhered to the electrode pattern 2 on the substrate 1 by using silver paste which is a conductive adhesive. Consequently, nodes of length expander of the top electrodes of the rectangular plate type piezoelectric resonators 4 and the positioning sheet 3 are fixed with a vibration absorber 5, and the top electrode of the rectangular plate type piezoelectric resonators 4 are connected by wires 6, so that the piezoelectric ceramic filter in the embodiment shown in (d) is completed. The vibration absorber 5 in this embodiment is polysilicon, but it may be also composed of silicon, epoxy resin, or their mixture with fiber, fine powder or the like.

Figure 2:
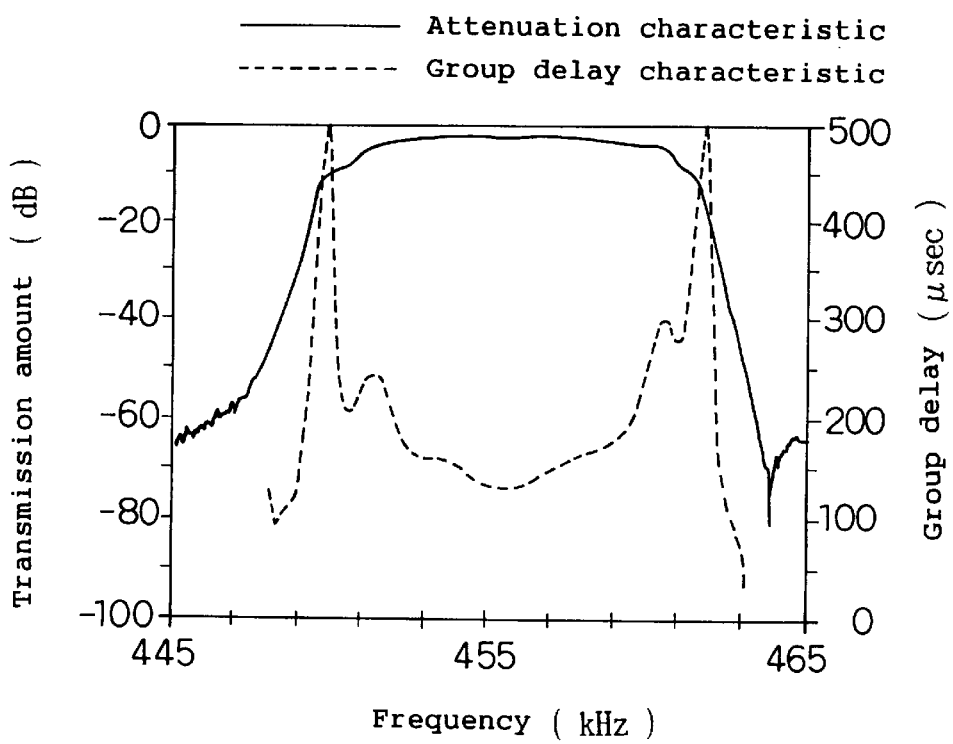
FIG. 2(a) and (b) are graphs showing characteristics of the ladder type piezoelectric ceramic filter in embodiment 1.
Figure 2:
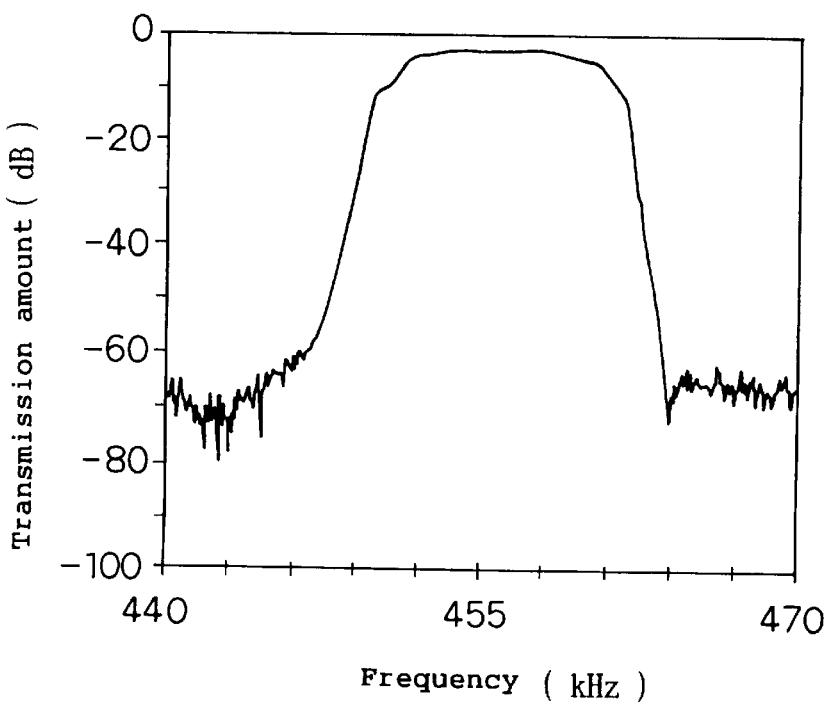
Figure 3:
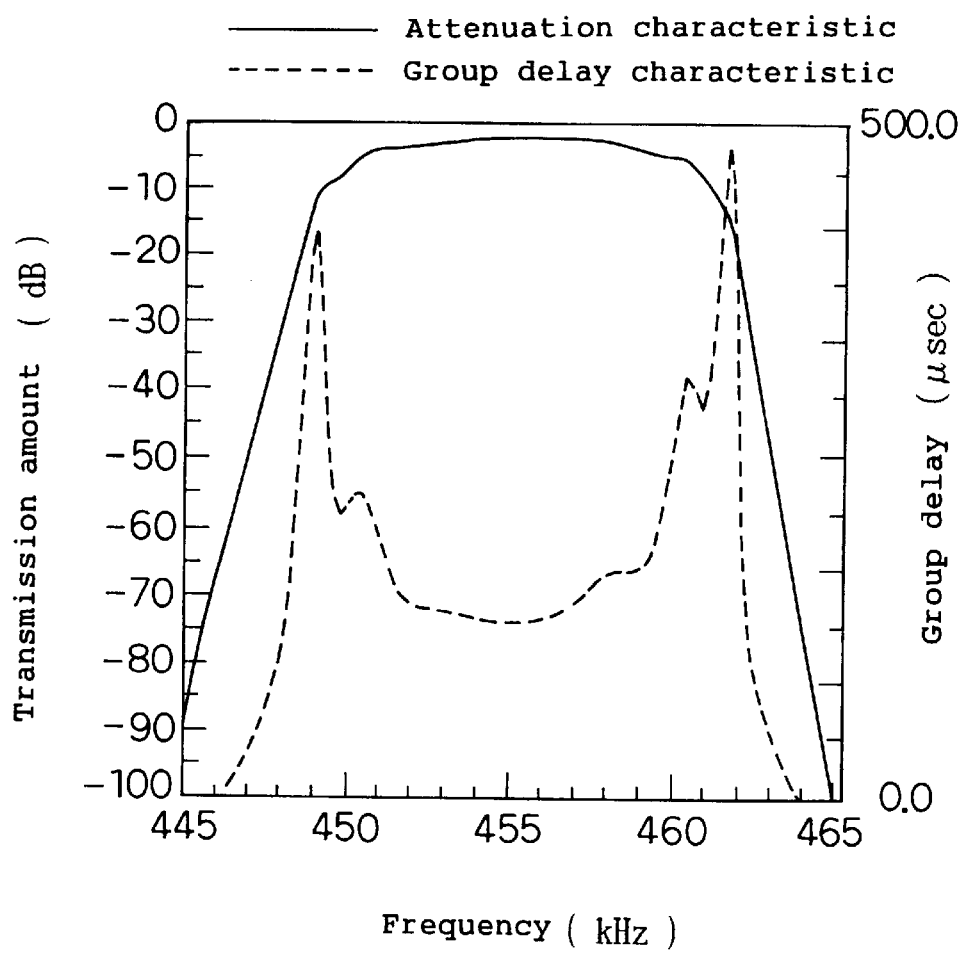
FIG. 3 is a graph showing a characteristic by calculation of the ladder type piezoelectric ceramic filter in embodiment 1.

FIG. 2(a) and (b) are graphs showing the operating characteristics of the piezoelectric ceramic filter in this embodiment, in which the axis of abscissas denotes the frequency, and the axis of ordinates denotes the transmission amount and the group delay time. In FIG. 2 (b), the range of frequency graduations in FIG. 2(a) is expanded. FIG. 3 is similarly a graph showing the operating characteristic of the piezoelectric ceramic filter in the embodiment, in which the filter characteristic is calculated from the characteristic of a single element. Comparison of FIG. 2(a) and FIG. 3 discloses a fair coincidence between the experimental result and calculated result of the characteristic in the band in embodiment 1. As clear from this embodiment, a filter of thin type which can be assembled from one direction and superior in reproducibility is realized. This filter is also excellent in mass producibility.

(Embodiment 2 )

Figure 4:
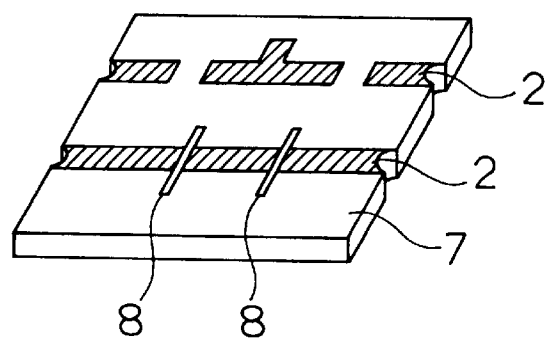
FIG. 4 is a perspective view showing a substrate of a ladder type piezoelectric ceramic filter in embodiment 2 of the invention.

FIG. 4 is a perspective view showing a constitution of a substrate used in a piezoelectric ceramic filter in a second embodiment. In FIG. 4, slits 8 are provided in an alumina substrate 7 among the parallel elements by laser. The other constituent parts than the alumina substrate 7 are same as in embodiment 1 and duplicated descriptions are omitted.

Figure 5:
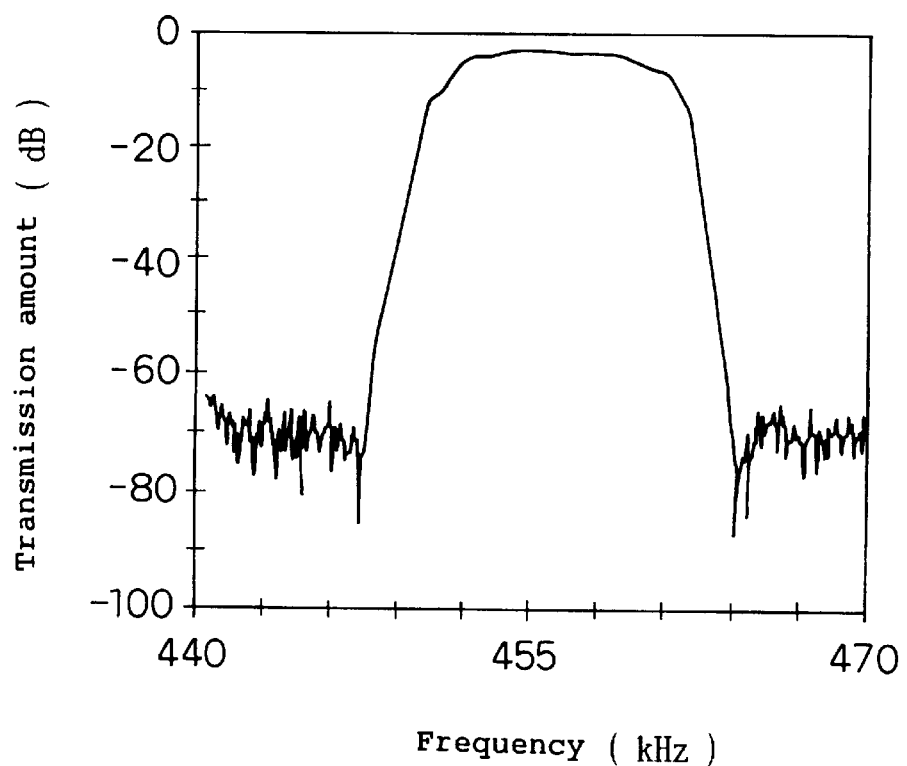
FIG. 5 is a graph showing a characteristic of the ladder type piezoelectric ceramic filter in embodiment 2.

FIG. 5 is a graph showing the operating characteristic of the piezoelectric ceramic filter in the embodiment, in which the axis of abscissas denotes the frequency and the axis of ordinates represents the transmission amount. It is known from FIG. 5 that a favorable attenuation characteristic is obtained near the low frequency side attenuation pole. This is because the vibration of the piezoelectric resonator having effects on the vibration of other piezoelectric resonators through the substrate is diffused by forming slits 8 and is reduced in effects on other piezoelectric resonators.

Thus, according to the filter of the embodiment, by forming slits among elements in the substrate, the attenuation amount near the low frequency side attenuation pole is close to the calculated value. As a result, a stricter filter design is realized. In this embodiment, slits are formed among parallel elements in the substrate, but proper slit positions vary with the disposition of elements.

(Embodiment 3 )

In this embodiment, a piezoelectric ceramic filter is composed in the same manner as in embodiment 1, except that an epoxy resin impregnated glass fiber substrate of the same size is used instead of the alumina substrate 1 in embodiment 1.

Figure 6:
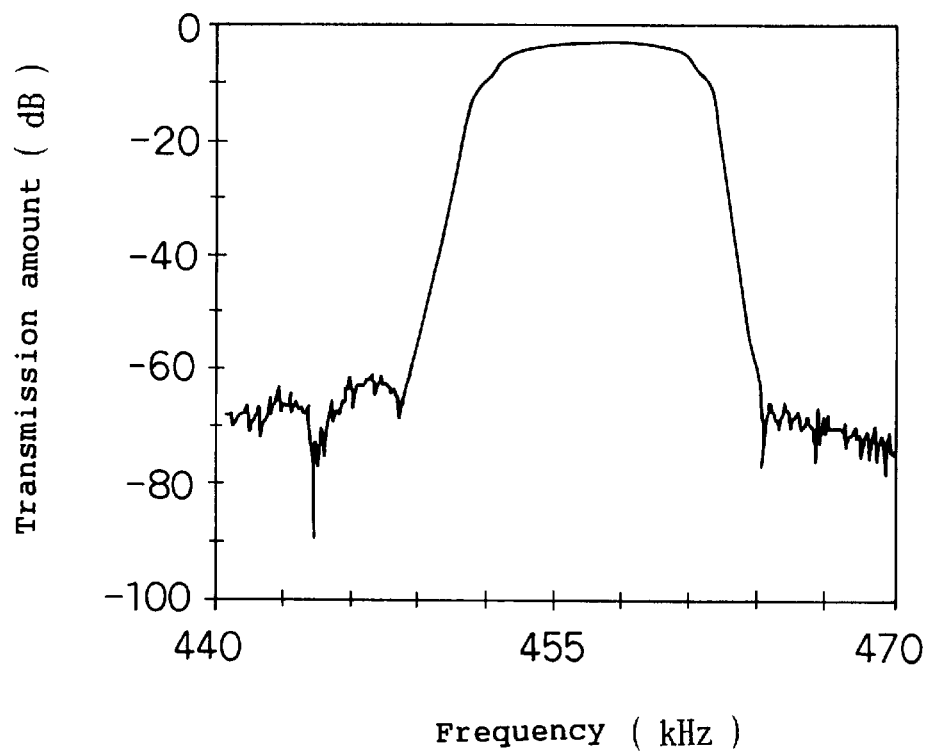
FIG. 6 is a graph showing an operating characteristic of a ladder type piezoelectric ceramic filter in embodiment 3 of the invention.

FIG. 6 is a graph showing the operating characteristic of the piezoelectric ceramic filter in the embodiment, in which the axis of abscissas denotes the frequency and the axis of ordinates represents the transmission amount. It is known from FIG. 6 that the attenuation characteristic is improved near the low frequency side attenuation pole. This is because the vibration having effects on the vibration of other piezoelectric resonators through the substrate is absorbed by the substrate by using the epoxy resin impregnated glass fiber substrate, and is reduced the propagation amount, thereby becoming smaller in effects on other piezoelectric resonators.

Thus, according to the embodiment, by composing the substrate with a material capable of absorbing vibration of resin, a favorable attenuation characteristic is obtained near the attenuation pole at the low frequency side. As a result, a favorable filter characteristic is obtained easily.

(Embodiment 4)

Figure 7A:
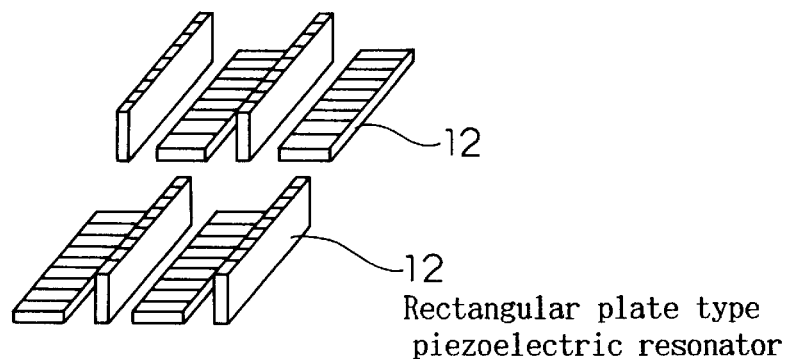
FIG. 7 is a perspective view showing a constitution of a ladder type piezoelectric ceramic filter in embodiment 4 of the invention, in which (a) is a rectangular plate type piezoelectric resonator, (b) is a package, and (c) is a ladder type piezoelectric ceramic filter.
Figure 7B:
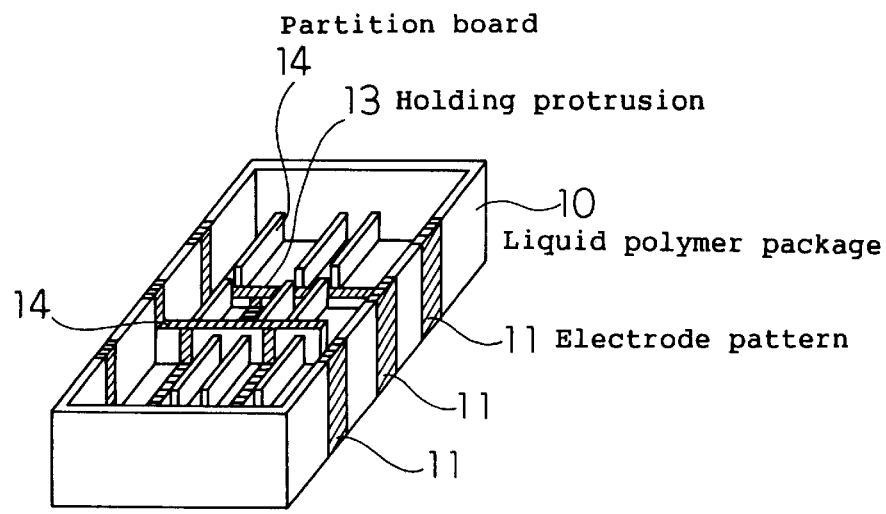
Figure 7C:
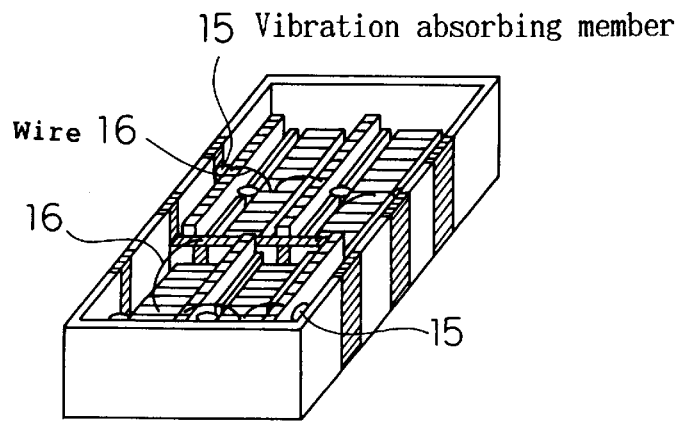

FIG. 7(a) and (b) are perspective views showing constituent parts of a piezoelectric ceramic filter of the embodiment, and FIG. 7(c) is a perspective view showing a completed piezoelectric ceramic filter. Rectangular plate type piezoelectric resonators 12 making use of length expander shown in FIG. 7(a) consist of two types, series elements (slender elements) and parallel elements (broad elements) same as in embodiment 1. The series elements (slender elements) and parallel elements (broad elements) are disposed alternately, and therefore the resonance frequency of adjacent resonators differs, so that effect of vibration propagating through the substrate may be suppressed to a maximum extent. In a package 10 formed of liquid crystal polymer shown in FIG. 7(b), holding protrusions 13 for holding the resonators 12 by the node parts of length vibration, and partition boards 14 for determining the disposition of resonators are integrally formed. Electrode patterns 11 are formed on the package 10, holding protrusions 13, and partition boards 14. In this embodiment, liquid crystal polymer is used, but the package 10 may be composed of any other material capable of absorbing the vibration propagating through the substrate, for example, epoxy resin impregnated glass fiber, phenol resin, and others that can be formed. The size of the package used in the embodiment was 10.0×6.4 mm by height of 2 mm.

The resonators 12 are adhered to the holding protrusions 13 with conductive adhesive (silver paste), and nodes of length expander of the piezoelectric resonators 12 and the package 10 are adhered and fixed with a vibration absorber 15, and connected from the top electrode of the piezoelectric resonators 12 by using wires 16, so that the piezoelectric ceramic filter as shown in FIG. 7(a) is completed.

Figure 8:
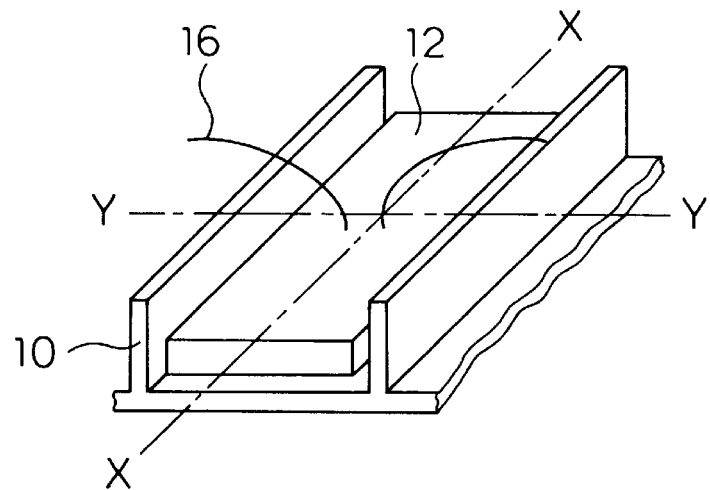
FIG. 8(a) is a partially magnified perspective view of the ladder type piezoelectric ceramic filter in embodiment 4, (b) is a sectional view of cutting part of the ladder type piezoelectric ceramic filter in embodiment 4 in Y—Y' direction, and (c) is a sectional view of cutting part of the ladder type piezoelectric ceramic filter in embodiment 4 in X—X' direction.
Figure 8:
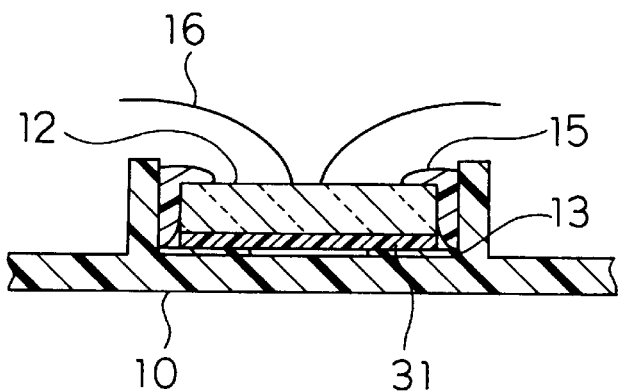
Figure 8:
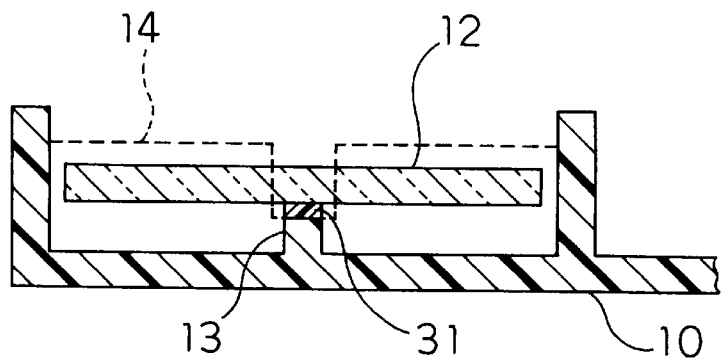

FIG. 8(a) is a partially magnified perspective view of the ladder type filter in FIG. 7, and FIG. 8(b) is a sectional view cutting part of the ladder type filter in Y—Y' direction corresponding to the width direction of the piezoelectric resonator 12. The piezoelectric resonators 12 are adhered and fixed to the package 10 with the vibration absorber 15, and the bottom electrodes of the piezoelectric resonators 12 are adhered to the holding protrusions 13 with a conductive adhesive 31. Silver paste was used as the conductive adhesive 31. Polysilicon was used as the vibration absorber 15.

FIG. 8(c) is a sectional view of cutting part of the ladder type filter in X—X' direction corresponding to the length direction of the piezoelectric resonator 12. The holding protrusion 13 is enclosed by two partition boards 14, and the vibration absorber 15 is disposed in the gap formed between the adjacent partition boards. Therefore, it is easy to control the amount of the vibration absorber 15, and fluctuations of characteristic may be suppressed.

The piezoelectric resonators 12 are held as being adhered to the holding protrusions 13 by using the conductive adhesive 31, but since the holding positions are at higher positions than the bottom, the resonators are held only in the node parts of vibration, so that a favorable resonance characteristic may be obtained. The resonators are positioned by the partition boards 14. The partition boards 14 play the role of the positioning sheet used in embodiment 1 to embodiment 3, and by integrating with the package, the number of parts is decreased, and the elements may be disposed easily.

Figure 9:
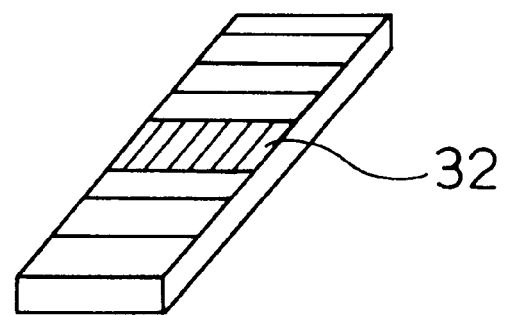
FIG. 9 is a perspective view showing a structural example of a piezoelectric resonator in an embodiment of the invention.

Besides, since the resonator interval can be narrowed, the size can be further reduced. The rectangular plate type piezoelectric resonators 12 are wired on the top electrodes by means of wires. In this case, for example, as shown in FIG. 9, by preliminarily forming, if necessary, electrodes 32 by screen printing or the like near the nodes of vibration of resonators by using electrode material such as gold and aluminum which may be easily connected to the wires, the wiring positions can be specified and assembling is easy.

Thus, according to the embodiment, by composing the package with a vibration absorbing material, and forming the holding protrusions of resonators and partition boards for positioning of resonators integrally on the package, the number of parts is decreased, and a filter of small size and stable characteristic may be obtained.

(Embodiment 5)

Figure 10:
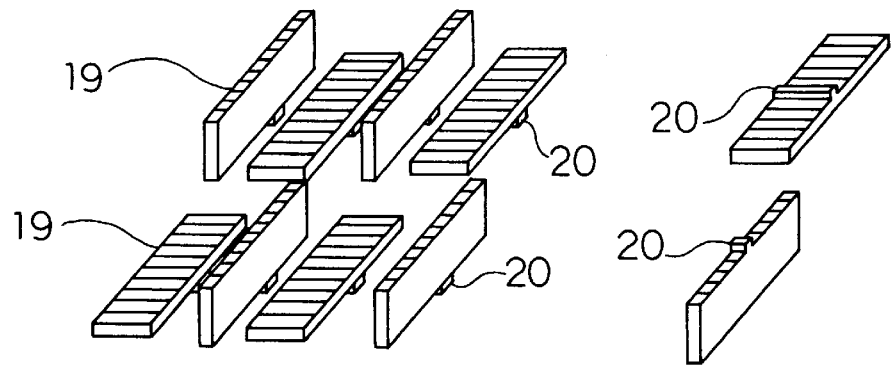
FIG. 10 is a perspective view showing a constitution of a ladder type piezoelectric ceramic filter in embodiment 5 of the invention, in which (a) is a rectangular plate type piezoelectric resonator, (b) is a liquid crystal polymer package, and (c) is a ladder type piezoelectric ceramic filter.
Figure 10:
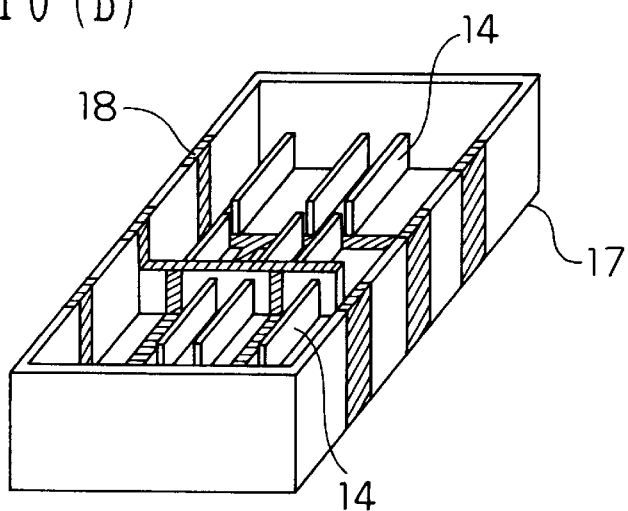
Figure 10:
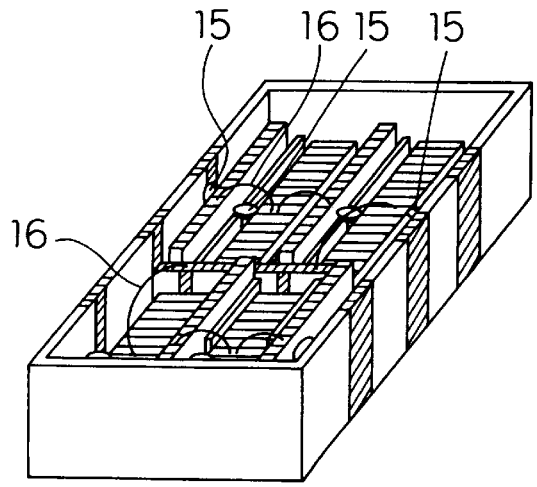

FIG. 10(a) and (b) are perspective views showing constituent parts of a piezoelectric ceramic filter of the embodiment, and FIG. 10(c) is a perspective view showing the constitution of a completed piezoelectric ceramic filter. The constituent parts are made of same materials as in embodiment 4.

On rectangular plate type piezoelectric resonators 19 shown in FIG. 10(a), protrusions 20 are formed near the nodes of length expander on one electrode surface. By adhering the protrusions 20 to the electrode pattern on the package 17 with a conductive adhesive, the resonators 19 and package 17 are fixed. The package 17 shown in FIG. 10(b) does not have holding protrusions, and the holding position of resonators is determined by the protrusions on the resonators, so that positioning of elements is not necessary when assembling, and therefore fluctuations of characteristic due to deviation of holding position of elements is suppressed. By assembling the elements in the same manner as in embodiment 4, the ladder type piezoelectric ceramic filter shown in FIG. 10(c) is completed.

Thus, according to the embodiment, by forming protrusions for holding near the nodes of vibration of the resonators, the holding position of the resonators is stabilized, and a filter with small fluctuations can be obtained.

Incidentally, the protrusions 20 may be formed by conductive resin, solder or the like. Or, by processing the resonator shape in a protruding form by sand blasting or the like, electrodes may be evaporated from above.

If the disposition of elements is other than the disposition in the embodiment, there is no great effect on the basic characteristic, and if the element disposition is changed depending on application, a similar filter characteristic is obtained. As the vibration absorber, aside from polysilicon, same characteristics are obtained when acrylic resin, epoxy resin, rubber, and other elastic materials are used.

The node parts of vibration of the rectangular plate type piezoelectric resonators are adhered with positioning sheet or mounting member of partition boards by resin vibration absorber, but same characteristics are obtained when adhered with substrate, package, or other mounting member.

(Embodiment 6)

Figure 11:
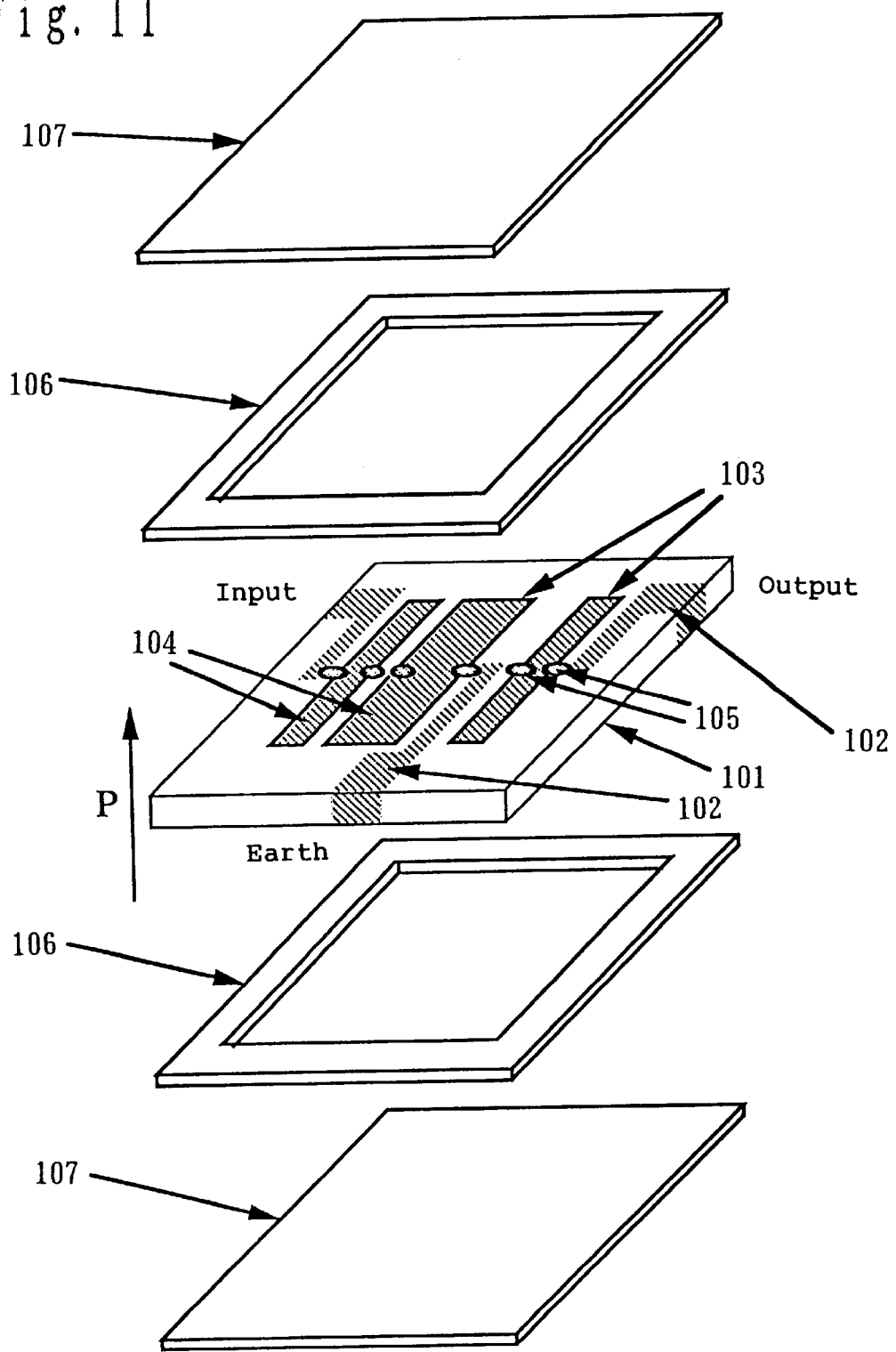
FIG. 11 is a structural diagram of a piezoelectric filter in embodiment 6 of the invention.

FIG. 11 is a structural diagram of a piezoelectric filter in a sixth embodiment of the invention. In FIG. 11, reference numeral 101 is a piezoelectric substrate such as piezoelectric ceramic polarized in the thickness direction, and arrow P indicates the direction of polarization. Reference numeral 102 shows electrodes preliminarily formed on the piezoelectric substrate 101, and wiring pattern for connecting the electrodes, being formed on the top and bottom of the piezoelectric substrate 101. Reference numeral 103 is a portion of the piezoelectric substrate 101 cut out by laser, and 104 is a rectangular plate resonator, which is obtained by cutting out from the piezoelectric substrate 101 by laser, and is mechanically connected with the piezoelectric substrate 101 in the node line portion of length expander (concealed by a vibration absorber described below in the drawing).

At this time, the width of the portion used in connection of the rectangular plate resonator 104 and piezoelectric substrate 101 (the node line part of vibration) is 0.1 mm or more for keeping the mechanical strength, and is 0.5 mm or less in order to minimize vibration impedance due to effects of holding and decrease effects between resonators due to vibration leak. Reference numeral 105 is a vibration absorber applied on the node line part of the rectangular plate resonator 104, and it is intended to realize stable support of the rectangular plate resonator 104 by preventing damage of the rectangular plate resonator 104 due to impact and decreasing effects of interference of vibration between resonators caused by vibration leak. Reference numeral 106 is a spacer for holding the piezoelectric substrate 101b an outer frame of the resonator part. In such constitution, plural rectangular plate resonators 104 formed on the piezoelectric substrate 101 can be held by a set of spacer 106, so that the assembling is easy. Reference numeral 107 is a sheet for packaging, and the piezoelectric substrate 101 is held from above and beneath through the spacer 106 and affixed with the spacer 106 so that an enclosed structure is formed.

In thus constituted piezoelectric filter of the embodiment, its function is described below while referring to FIG. 11 and FIG. 12.

Figure 12:
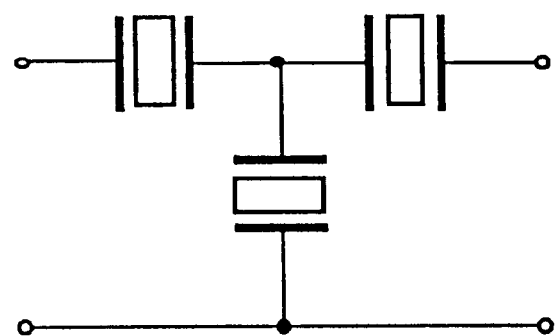
FIG. 12 is an equivalent circuit diagram of the piezoelectric filter in embodiment 6.

In the piezoelectric filter in FIG. 11 forming three rectangular plate resonators 104 making use of length expander on the piezoelectric substrate 101, a T-shaped circuit shown in FIG. 12 is formed by wiring patterns 102 on top and bottom. When composing this ladder type filter, the capacity of series elements and parallel elements is adjusted by the area of the rectangular plate resonators 104. For example, to adjust the ratio of the series element capacity and parallel element capacity to 1:3, the width of the rectangular plate resonators 104 is set at about 1:3. Besides, using the electrode as partial electrode, the ratio of capacity is adjusted. Moreover, the ratio of series element capacity and parallel element capacity is adjusted by the width of resonators and the electrode structure. The piezoelectric filter in the embodiment is a ladder type filter composed of three elements, and a multi-stage ladder filter can be structured by connecting them in cascade.

Thus, according to the embodiment, the conventional process can be substantially simplified, and small and thin piezoelectric filters can be easily composed. By cascade connection of these piezoelectric filters, a multi-stage ladder type filter can be composed. If the element width of the series elements is small, the entire resonator is handled as one part, so that handling is easy.

(Embodiment 7)

Figure 13:
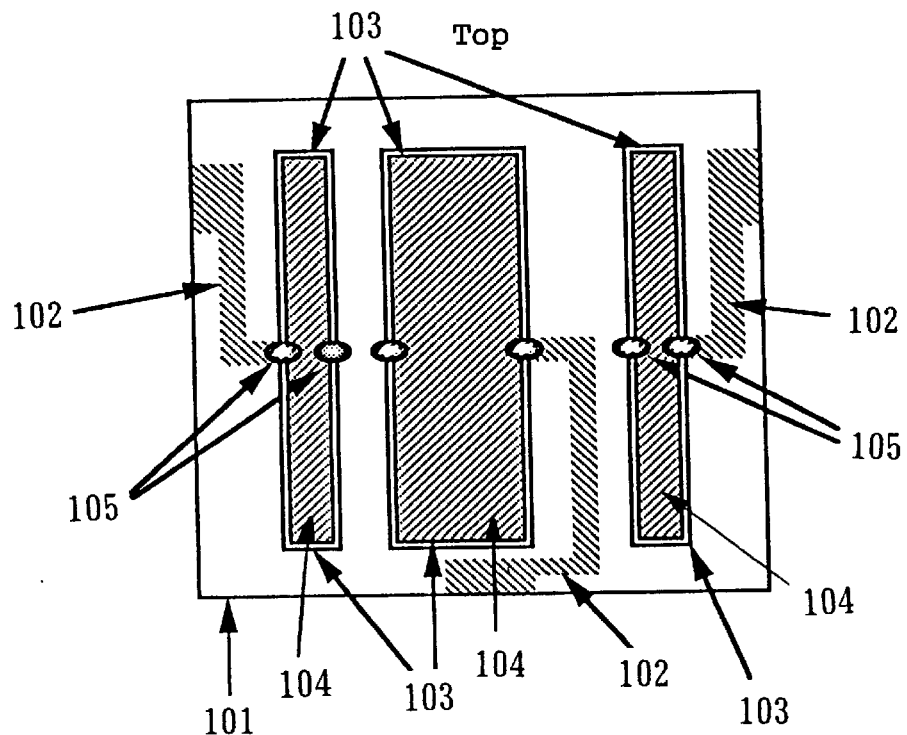
FIG. 13 A is a diagram showing the top of a piezoelectric substrate in a piezoelectric filter in embodiment 7 of the invention, and B is a diagram showing its bottom.
Figure 13:
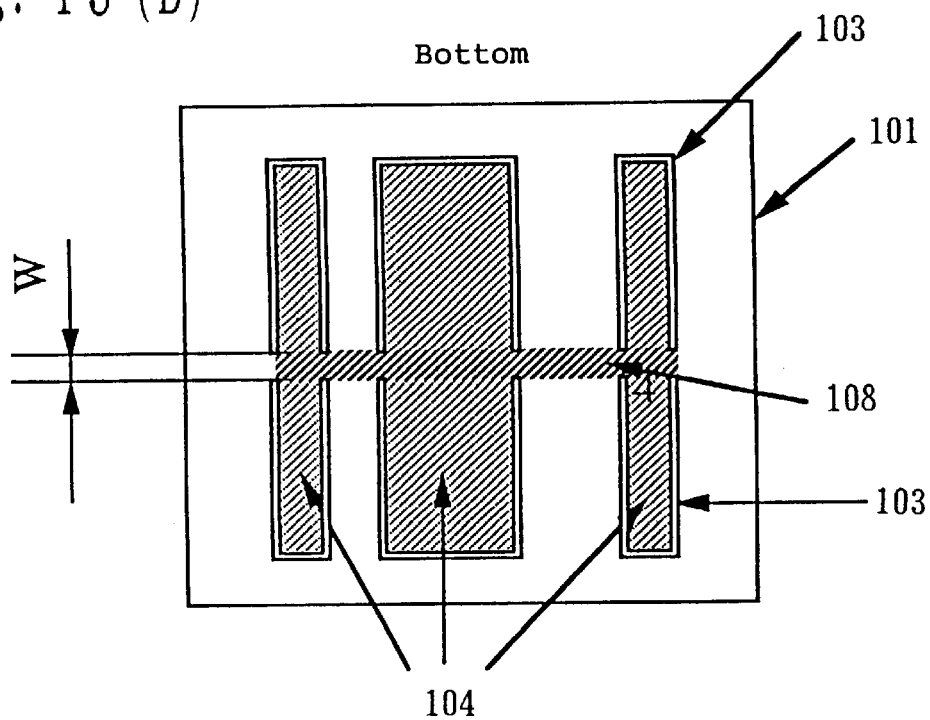

FIG. 13 is a diagram showing a piezoelectric substrate in a piezoelectric filter a seventh embodiment of the invention, and FIG. 13(a) is a top view of the piezoelectric substrate, and FIG. 13(b) is a bottom view.

In FIG. 13, reference numeral 101 is a piezoelectric substrate polarized in the thickness direction, and the direction of polarization is vertical to the sheet of paper. Reference numeral 102 denotes electrodes and wiring pattern formed preliminarily on the piezoelectric substrate 101, being formed on the face and back of the piezoelectric substrate 101. Reference numeral 103 is a part of the piezoelectric substrate 101 cut out by laser, and 104 is a node line part of the rectangular plate resonator making use of length vibration, obtained by cutting out the piezoelectric substrate 101, being connected to the piezoelectric substrate 101. At this time, the width w of the node line part is 0.1 mm or more and 0.5 mm or less in order to keep the mechanical strength and to decrease effects between resonators due to vibration leak. Reference numeral 105 is a vibration absorber applied on the node line part of the rectangular plate resonator, being composed of silicon, epoxy resin, or compounds of these resins with fiber or powder, and it is designed to prevent breakage of elements due to impact, and decrease effects of interference of vibration between resonators caused by vibration leak.

The function of the piezoelectric filter in this embodiment is described below while referring to the drawings.

In three elements of the rectangular plate resonators 104 making use of length expander formed on the piezoelectric substrate 101, wiring patterns 102 of top and bottom are formed only in the electrode areas of the rectangular plate resonators 104, and the elements are not mutually wired. Therefore, by taking out an electrode from on the node line of the rectangular plate resonator 104, the resonance characteristic of a single element can be measured. Hence, the frequency of the rectangular plate resonator 104 can be adjusted by shaping off the end face of the rectangular plate resonator 104 by laser or the like in this state. As shown in FIG. 13(b), after frequency adjustment of each element, by printing the wiring pattern 108 on the piezoelectric substrate 101, a three-element ladder type filter can be composed.

Accordingly, unlike the prior art, the process of inserting elements among electrode plates after frequency adjustment of each element is not necessary, and the ladder type filter can be composed easily. In this embodiment, the three-element ladder type filter is shown, but by cascade connection of the filters, a multi-stage ladder type filter can be also composed.

(Embodiment 8)

Figure 14:
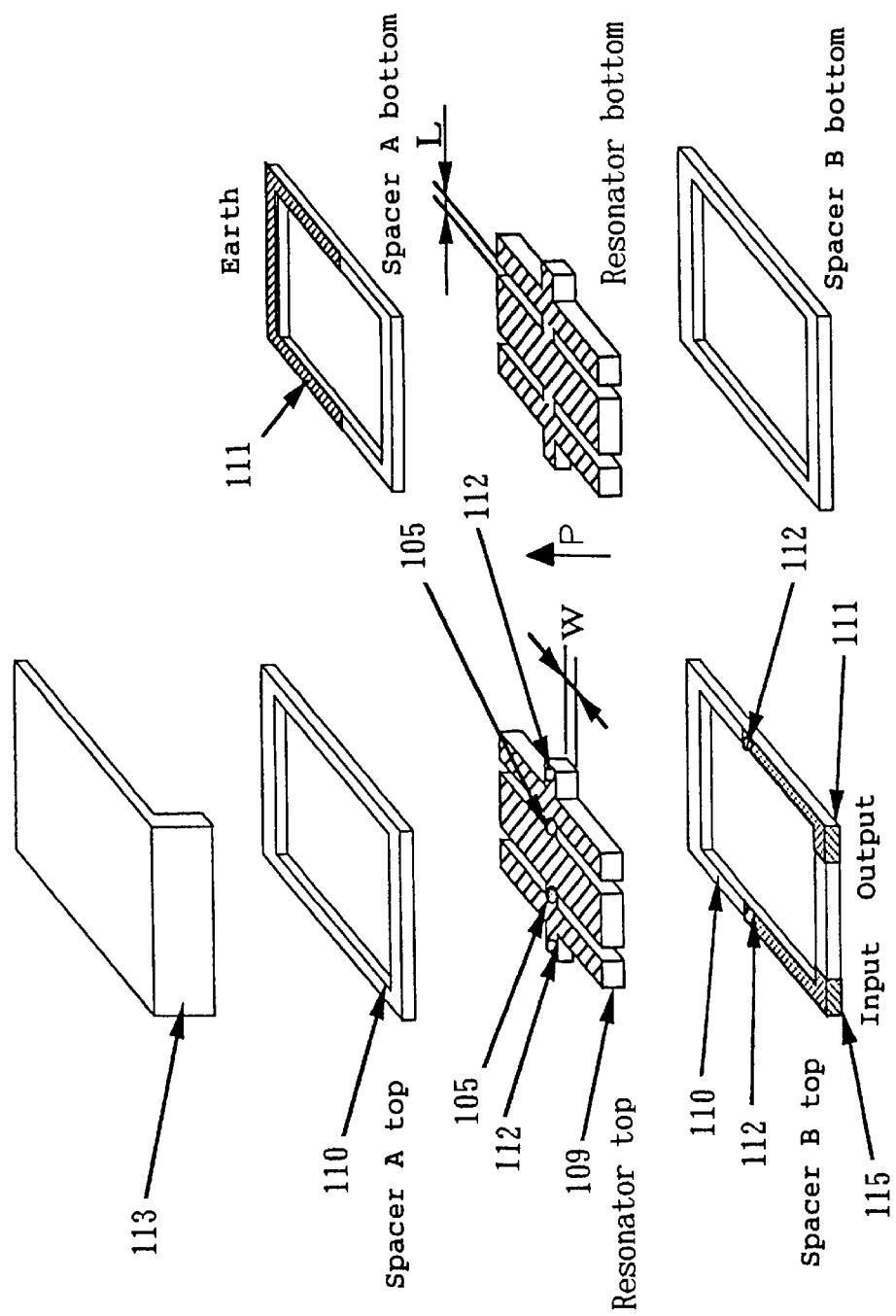
FIG. 14 is a structural diagram of a part of a piezoelectric filter in embodiment 8 of the invention.
Figure 15:
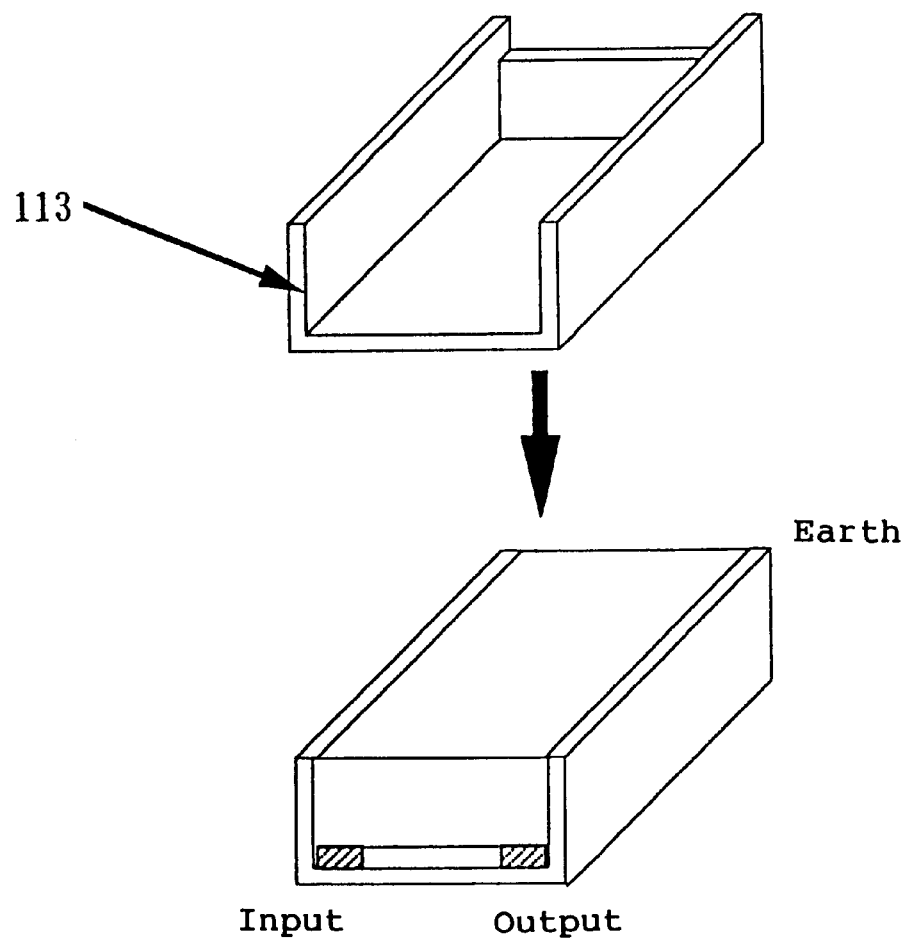
FIG. 15 is a structural diagram of a remaining portion in the piezoelectric filter in embodiment 8.

FIG. 14 and FIG. 15 are structural diagrams showing a piezoelectric filter in an eighth embodiment of the invention. In FIG. 14 and FIG. 15, reference numeral 109 is an example of plate shaped resonator, being cut out from a piezoelectric substrate polarized in the thickness direction, with plural rectangular plate resonators connected with each other by a node line of length expander mode. Reference numeral 105 is a vibration absorber applied on the node line, being composed of silicon, epoxy resin, or compound of these resins with fiber or powder, and 110 is a spacer for enclosing other portion than the rectangular plate resonators on the late shaped resonator (in FIG. 14, the portion to be coated with conductive adhesive 112 mentioned later) from above and beneath, and on each spacer 110, moreover, wiring patterns 111 for input and output and for earth are formed. Reference numeral 112 is a conductive adhesive for electrically connecting the plate shaped resonator 109 and the wiring patterns 111 on the spacer 110, and forming input and output terminals, and P indicates the direction of polarization. Reference numeral 113 is a package for enclosing. The spacer 110 is affixed to the package 113 in the outer frame part, and a piezoelectric filter is composed.

The function of the piezoelectric filter of the embodiment is described below while referring to the drawings.

In the rectangular plate resonators of the embodiment, too, the connecting part W of the node line of each resonator is 0.1 mm or more and 0.5 mm or less in order to keep the mechanical strength and decrease the effect of vibration leak between resonators, and the distance L between the resonators is defined at 0.1 mm or more and 2.0 mm or less owing to the same reasons. In the connection area of the node line of these resonators the vibration absorber 105 composed of silicon, epoxy resin, or compound of these resins with fiber or powder is applied in order to suppress the effects of vibration leak between resonators and keep the mechanical strength. On the top of the plate shape resonator 109, electrodes are formed on the whole surface, and all resonators are connected electrically. The wiring patterns on the top and bottom of the plate shaped resonator 109 are adhered to the wiring patterns 111 of the spacer A 110 and spacer B 110 through conductive adhesive 112, so that the input and output terminals and earth terminals are taken out. By this wiring, a T-shaped circuit same as in FIG. 12 is composed.

Thus, according to the embodiment, the resonators are electrically connected through the wiring patterns 111 formed on the spacers 110 and the conductive adhesive 112, and it is not necessary to compose all wiring patterns on the plate shaped resonators 109, and the large outer frame of piezoelectric substrate shown in embodiment 6 is not needed. Hence, the small and thin piezoelectric filter can be composed easily.

(Embodiment 9)

Figure 16:
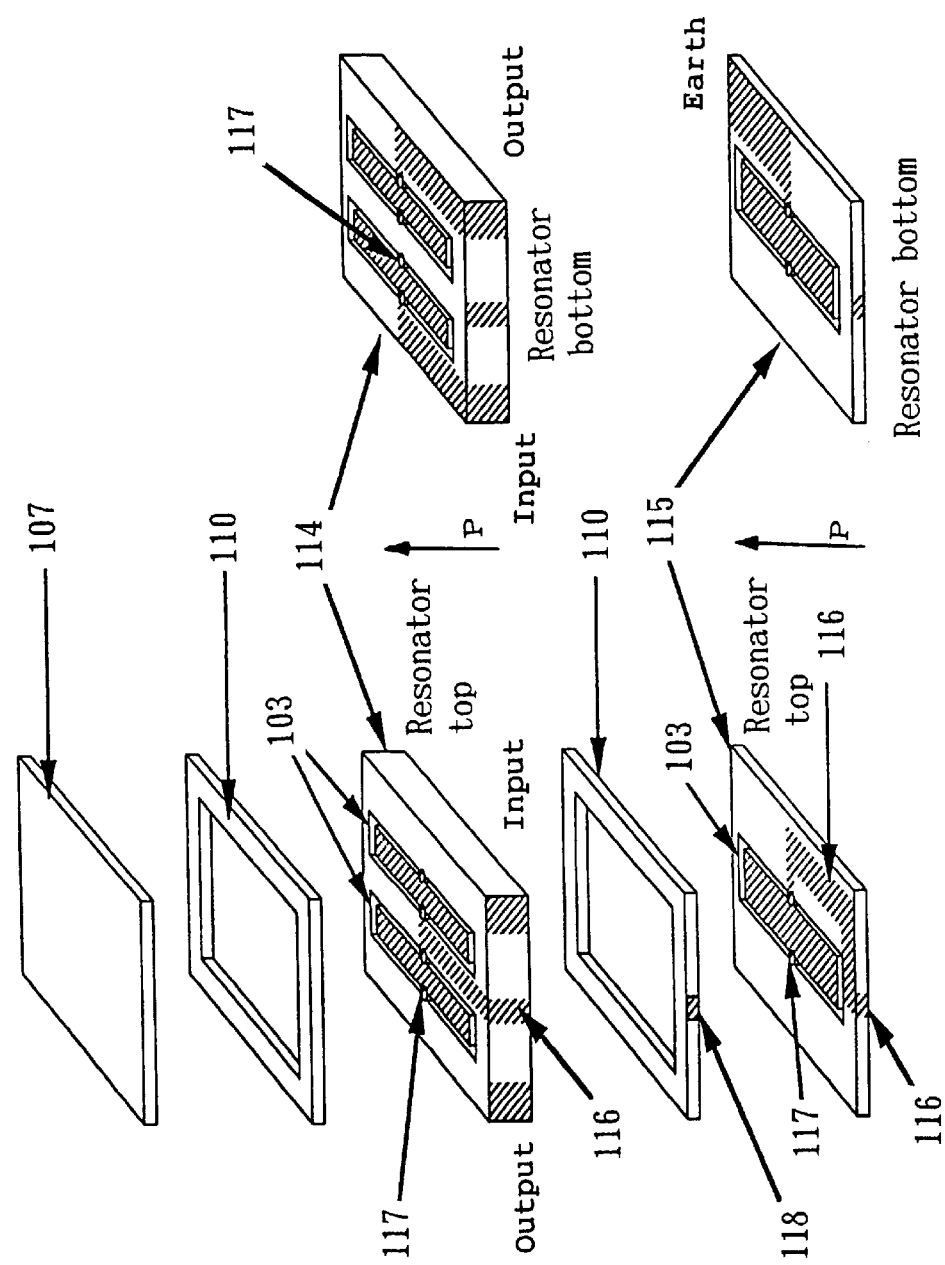
FIG. 16 is a structural diagram of a part of a piezoelectric filter in embodiment 9 of the invention.
Figure 17:
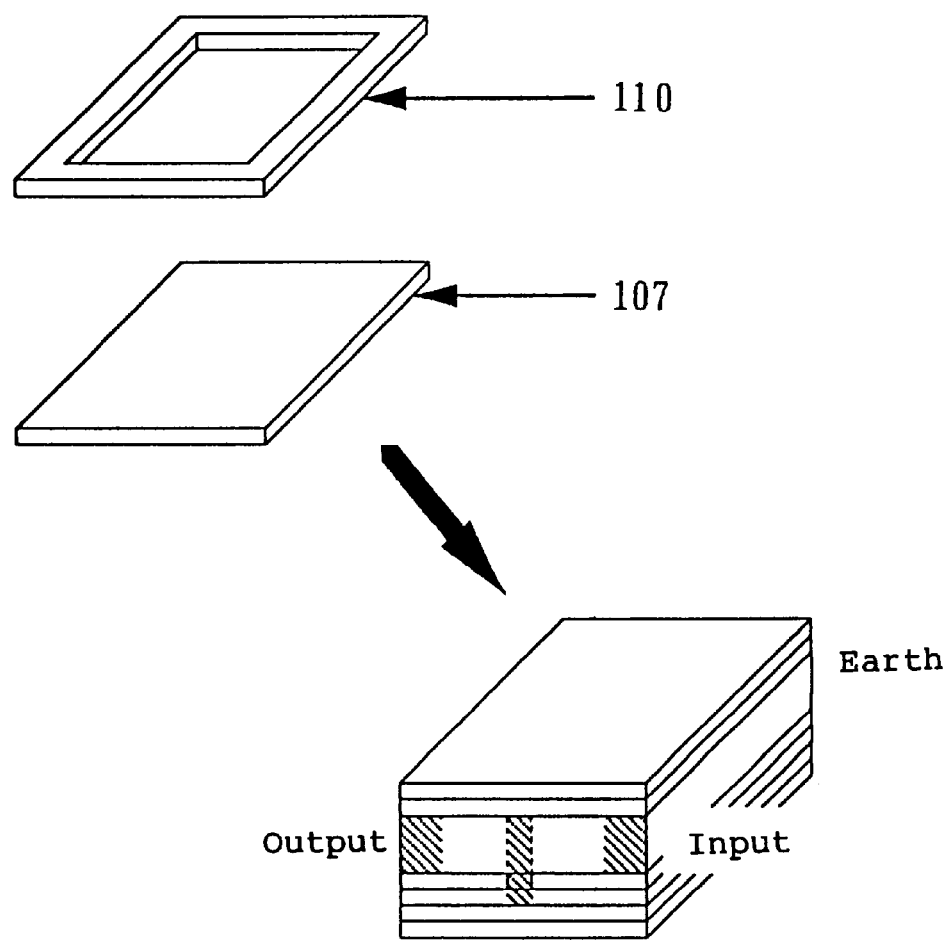
FIG. 17 is a structural diagram of a remaining portion in the piezoelectric filter in embodiment 9.

FIG. 16 and FIG. 17 are structural diagrams of a piezoelectric filter in a ninth embodiment of the invention. In FIG. 16 and FIG. 17, reference numeral 114 is a piezoelectric substrate for series elements polarized in the thickness direction, and 115 is a piezoelectric substrate for parallel elements polarized in the thickness direction. The bottom electrode pattern of each piezoelectric substrate is shown at the right side of FIG. 16. Reference numeral 103 is a portion being cut out by laser or the like. On these piezoelectric substrates 114, 115, electrodes and wiring patterns 116 are formed preliminarily, and rectangular plate resonators making use of length expander are cut out by laser or the like in the shape connected by node line parts. Reference numeral 117 is a vibration absorber applied on the connection area of the node line of resonators, being made of silicon, epoxy resin, or compound of these resins with fiber or powder, and it is intended to prevent damage of resonators and effects of interference between resonators due to vibration leak. Reference numeral 110 is a spacer for holding the piezoelectric substrates 114, 115 with the outer frame of the resonators, and electrode patterns 118 necessary for composing into a ladder circuit are formed preliminarily. The ladder type circuit is composed by electrically connecting the wiring patterns 116 on the piezoelectric substrates 114, 115 and the wiring patterns 118 on the spacer 110 with a conductive adhesive or the like. Reference numeral 107 is a sheet for affixing to the spacer 110 to form an enclosed structure.

The function of the piezoelectric filter in the ninth embodiment is described while referring to FIG. 16 and FIG. 17.

The piezoelectric substrate 114 in the embodiment comprises two rectangular plate resonators for series elements, and the piezoelectric substrate 115 comprises one rectangular plate resonator for parallel elements. The connection part W of node line of each resonator is 0.1 mm or more and 0.5 mm or less in order to keep the mechanical strength and decrease effects of vibration leak between resonators. In the connection parts of node lines of these resonators, moreover, a vibration absorber 117 composed of silicon, epoxy resin, or compound or these resins with fiber of powder is applied, and it suppresses the effects of vibration leak between resonators and keeps the mechanical strength. These piezoelectric substrates 114, 115 compose a T-shaped circuit by connecting the wiring patterns 116 and wiring patterns 118 on the spacer 110.

Herein, the blocking region attenuation amount of the ladder type filter is determined by the ratio of capacity of series elements and parallel elements. In the case of a large blocking region attenuation amount, it is necessary to reduce the capacity of series elements and increase the capacity of parallel elements, and hence the element thickness is an important design parameter as well as the element area. In this embodiment, since the piezoelectric substrates for series elements and for parallel elements are composed separately, the thickness of the series elements and parallel elements can be designed individually. Moreover, the piezoelectric substrates 114, 115 are held by the spacer 110 by the outer frame of the resonator part, and therefore effects of holding on the characteristic are small, and assembling is easy.

Thus, according to the embodiment, the ratio of capacity between resonators can be desired freely, and the blocking region attenuation amount may be made larger. Moreover, the hitherto required electrode plates and leaf springs for supporting the resonators are not needed, so that a small and thin design is realized.

As described herein, in one piezoelectric substrate polarized in the thickness direction, electrode patterns electrically connected to form a ladder type or desired circuit are formed preliminarily, and plural rectangular resonators making use of length expander are cut out by laser in a form consecutive to the piezoelectric substrate at the node line. Moreover, the connection part of the node line of rectangular plate resonator and piezoelectric substrate is reinforced by a vibration absorber such as silicon, and the structure is enclosed by spacer and sheet from above and beneath, and therefore the rectangular plate resonator making use of length expander is not supported by one point, but is fixed on the piezoelectric substrate through the node line part of the vibration, so that the resonator is held securely. As a result, the entire outer frame portion of the piezoelectric substrate is enclosed by the spacer, and characteristic changes of the piezoelectric resonator by external impulse are suppressed.

Besides, since the electrode patterns are formed directly on the piezoelectric substrate, electrode plates and leaf springs are not needed, and the number of parts is substantially decreased, so that a small and thin filter may be composed. Moreover, by applying a vibration absorber such as silicon in the node line of piezoelectric resonator and outer frame part, the impact resistance may be further enhanced, and it is possible to realize a piezoelectric filter reduced in the characteristic deterioration due to leak of vibration of the piezoelectric resonator into adjacent piezoelectric resonator, that is, mutual interference between resonators.

Therefore, as compared with the prior art, it is easy to support the resonators, the support position is not changed by impulse, the number of parts is decreased, the structure can be assembled from one direction, and a small and thin piezoelectric ceramic filter can be obtained. Moreover, since the entire resonator is handled as one part, handling is easy.

In this embodiment, the ladder type filter is composed of three elements, but not limited to this, the number of constituent elements is not specified.

Also in the embodiment, the piezoelectric ceramic filter using ceramics in the piezoelectric crystal is presented, but not limited to this, the same may be also applied to the piezoelectric filter using rock crystal, niobium lithium oxide and other piezoelectric crystal.

In the embodiment, meanwhile, the vibration absorber is applied to the node line part in order to enhance the impact resistance, but not limited to this, application is not necessary of the impact resistance of the piezoelectric substrate is sufficient.

In the embodiment, the width w of the node line part is defined in a range of 0.1 mm or more and 0.5 mm or less, but not limited, the range may be varied depending on the dimensions and material of the piezoelectric resonator. In short, the range is arbitrary as far as the mechanical strength is maintained and the effects of vibration leak between resonators are kept small.

(Embodiment 10)

Figure 18:
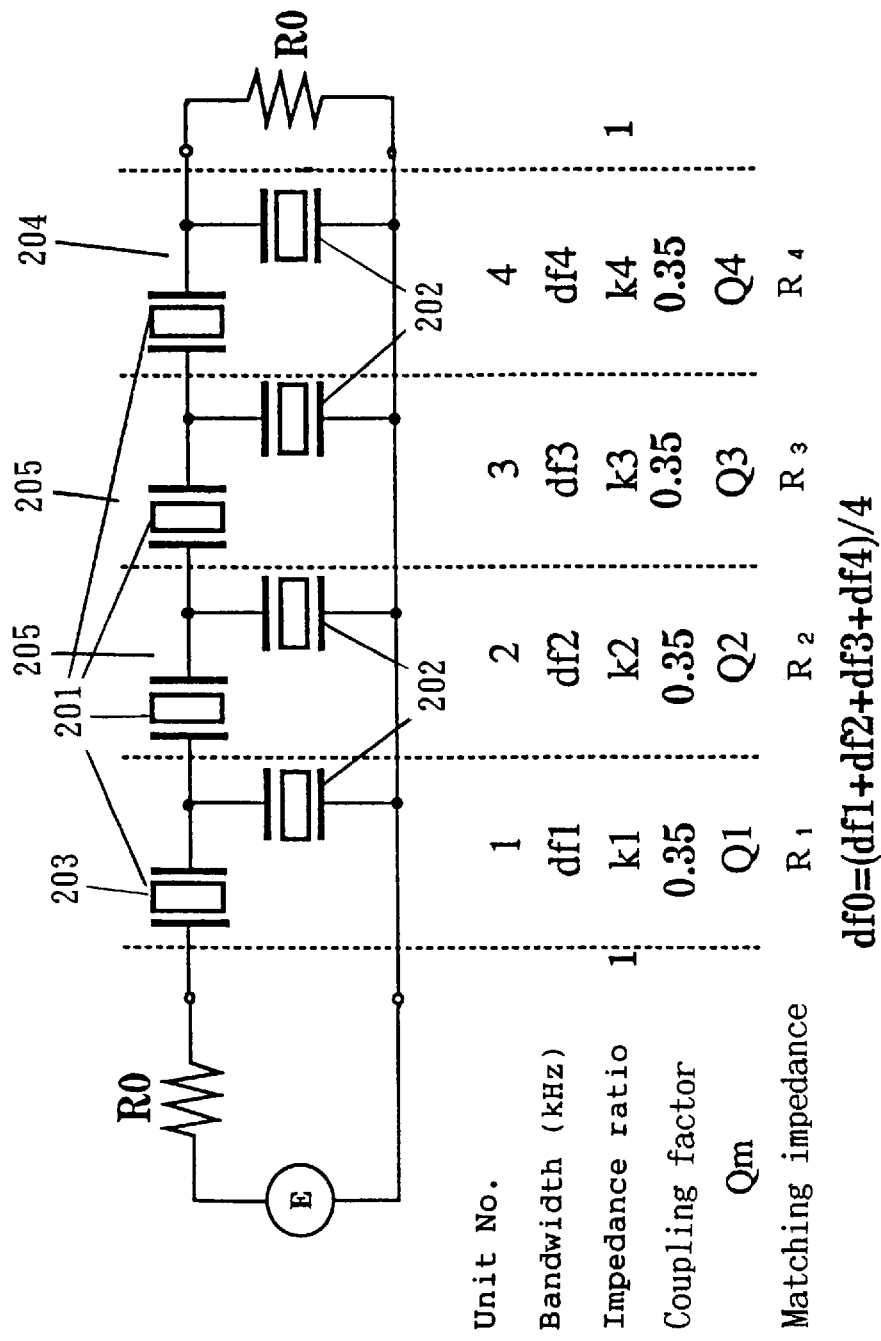
FIG. 18 is a structural diagram of a ladder type piezoelectric filter in embodiments 10 to 14 of the invention.

FIG. 18 is a structural diagram of a ladder type piezoelectric filter in a tenth embodiment of the invention. From this embodiment to embodiment 14, examples of ladder type piezoelectric filter composed of four units as shown in FIG. 18 are explained. In FIG. 18, in each unit, series elements 201 and parallel elements 202 are connected in an L-form, and these L-form elements are sequentially connected from the input side to output side in order of input stage unit 203, intermediate stage unit 205, intermediate stage unit 205, and output stage unit 204. For the convenience of explanation, herein, the units are called first, second, third and fourth unit sequentially from the input side.

The suffixes df1, df2, df3, df4 attached to the lower side of the equivalent circuit in the embodiment denote the design bandwidth of each unit from the first unit to the fourth unit which are all L-form elements. Incidentally, R1, R2, R3, R4 denote the matching impedance of each unit. Herein, the design bandwidth of the entire filter is support to be df0, and the matching impedance of the filter is R0. However, df0 is the mean of the design bandwidth df1, df2, df3, df4. Moreover, the matching impedances of the units standardized by the matching impedance R0 of the filter are k1, k2, k3, k4 (that is, the matching impedance of the entire filter is 1). The mechanical quality Qm of the piezoelectric resonators for composing each unit is expressed as Q1, Q2, Q3, Q4, respectively.

In the ladder type piezoelectric filter thus determined in design parameters, the operation is described below while referring to FIG. 18 to FIG. 21. The design parameters and number of constituent units in this embodiment are only a specific example of the invention, and the values of the design parameters and number of constituent units are not intended to limit the technical scope of the invention.

FIG. 19 is a filter characteristic diagram in the ladder type piezoelectric filter in this embodiment. In FIG. 19, the solid line in the diagram indicates the attenuation characteristic, and the broken line represents the group delay characteristic. FIG. 20 shows a filter characteristic not conforming to the embodiment, which is a filter characteristic in a comparative example for comparing with the filter characteristic of the embodiment, and the filter is composed of four units (eight elements). In diagram (b) of FIG. 19 and FIG. 20, the passing band portion of the filter characteristic diagram in (a) is magnified.

The design parameters in the comparative example in FIG. 20 are defined as follows by using the symbols in FIG. 18:

df1=df2=df3=df4=24 kHz,
k1=k2=k3=k4=1,
Q1=Q2=Q3=Q4=150, and
material with coupling factor of 0.35.

That is, the bandwidth of all units is equal. By contrast, FIG. 19(a), (b) relate to an example of ladder type piezoelectric filter, in which the design bandwidth of the input stage unit 203 and the design bandwidth of the output stage unit 204 are maximum, the design bandwidth is gradually decreased from the input stage unit 203 to the intermediate stage unit 205, and the design bandwidth is gradually increased from the intermediate stage unit 205 to the output stage unit 204, and the design parameters are as follows:

df1=df4=28 kHz,
df2=df3=20 kHz, and
k1=k2=k3=k4=1.

Herein, comparing FIG. 19(b) and FIG. 20(b), it is known that the shape of the group delay characteristic is different in the portion remote from the center frequency 450 kHz by about ±10 kHz.

Figure 21:
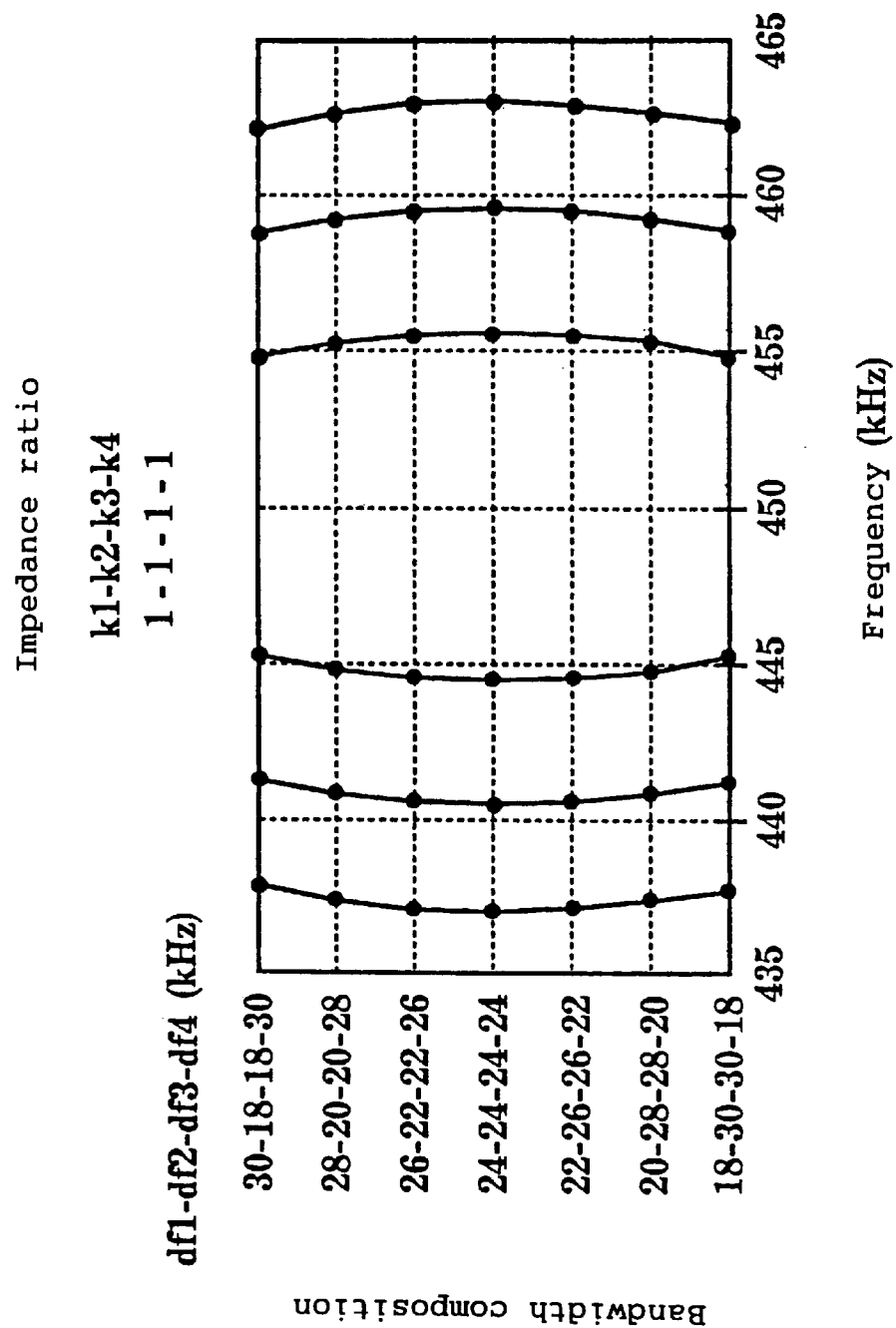
FIG. 21 is an explanatory diagram showing changes of specific point of phase rotation in the ladder type piezoelectric filter in embodiment 10.

This phenomenon is specifically described below while referring to FIG. 21. FIG. 21 is an explanatory diagram for showing changes of specific point of phase rotation by bandwidth composition. Herein, the specific point is the $\pi/2$ rotation point of phase, the axis of abscissas denotes the frequency, and the axis of ordinates represents the constituent bandwidth of each unit. By changing the phase rotation linearly, the group delay characteristic is flat, but linear change of phase rotation requires that the positions of specific points are at equal intervals. FIG. 21 shows that the position of specific point is changed by varying the constituent bandwidth between the units.

For example, as in the constitution in FIG. 20(b), when all bandwidths are constant (24-24-24-24), the frequency interval from the center frequency to the first specific point to the outside as seen from the center frequency 450 kHz is wider than the interval from the first specific point to the second specific point. Therefore, between the first and second specific points, the phase rotates more abruptly than from the center frequency to the first specific point. Accordingly, the group delay deviation is large between the first and second specific points. Likewise, this phenomenon is seen between the second and third specific points.

On the other hand, when the frequency constitution is as shown in FIG. 19(b) (28-20-20-28), the interval from the center frequency to the first specific point, and the interval from the first to second specific point are closer to equal interval as compared with the identical bandwidth constitution (24-24-24-24). Accordingly, the group delay deviation is smaller than in FIG. 20(b). That is, without practically changing the design bandwidth by the constituent bandwidth of the unit, the position of specific point can be moved symmetrically to the center frequency.

Thus, according to the embodiment, the group delay characteristic can be controlled by hardly changing the design bandwidth. Furthermore, different from the conventional method of composing with resonators different in the frequency difference $\Delta f$ between the resonance frequency and antiresonance frequency and mechanical quality coefficient Qm, the filter characteristic can be improved only by changing the bandwidth of the units, and hence a filter of small insertion loss is realized. Besides, the piezoelectric materials are composed of same materials, and the manufacturing process can be simplified.

(Embodiment 11)

Figure 22:
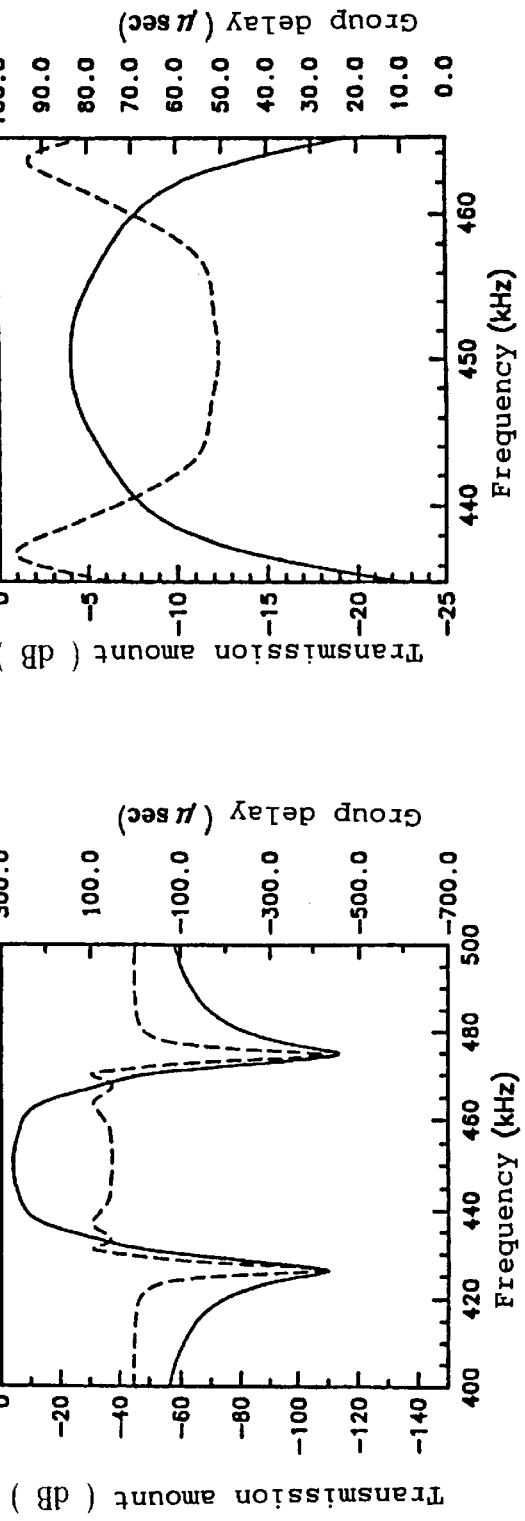
FIG. 22(a), (b) are filter characteristic diagrams of a ladder type piezoelectric filter in embodiment 11 of the invention.

FIG. 22 is a filter characteristic diagram in a ladder type piezoelectric filter in an eleventh embodiment of the invention. The solid line in FIG. 22 shows the attenuation characteristic and the broken line indicates the group delay characteristic. In FIG. 22(a), (b), the input side matching impedance and output side matching impedance of the entire circuit are nearly equal, and the matching impedance of the input and output stage units is equal to the input and output matching impedance of the entire circuit. Moreover, in this example, of ladder type piezoelectric filter, the units are arranged so that the square value of the product of the matching impedance of the second unit and the matching impedance of the third unit is nearly equal to the matching impedance of the input and output stage units. The number of units is four (eight elements), and the design parameters are df1=df2=df3=df4=24 kHz, k1=k4=1, k2=2, k3=0.5, and material with coupling factor of 0.35 are used. What differs from embodiment 10 is that the impedance composition of each unit is changed, while the bandwidths of all units are same. Comparing FIG. 20(b) and FIG. 22(b), it is known that both have filter characteristics symmetrical to the center frequency, but the flat portion of the group delay characteristic near the center frequency is slightly larger in the constitution in FIG. 22(b). Moreover, FIG. 22(b) has a small ripple in the part remote from the center frequency, and therefore the group delay characteristic including the ripple component is wider than in FIG. 20(b). This phenomenon is described below while referring to FIG. 24.

Figure 24:
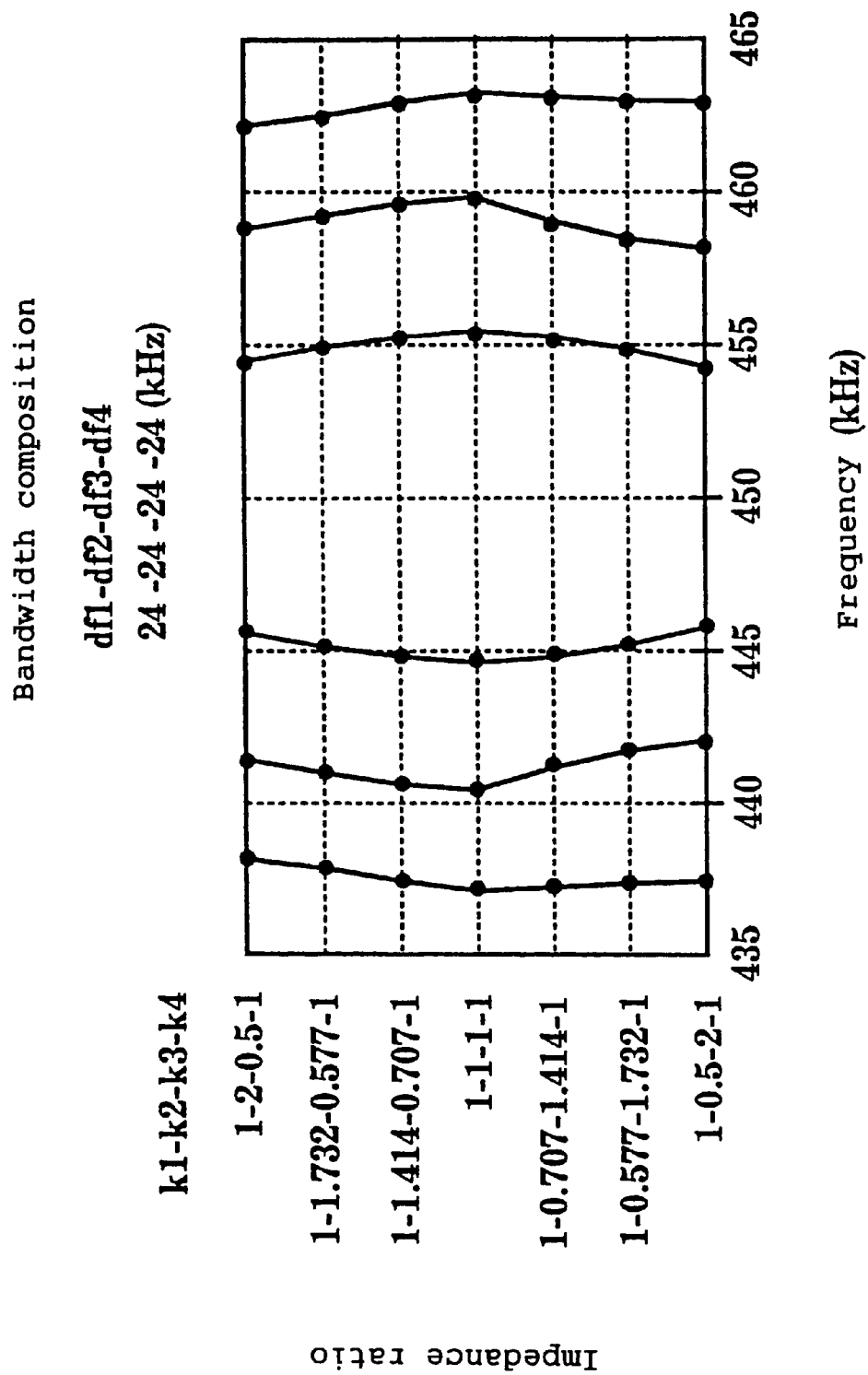
FIG. 24 is an explanatory diagram showing changes of specific point of phase rotation in the ladder type piezoelectric filters in embodiments 11 and 12.

FIG. 24 is an explanatory diagram showing changes of specific point of phase rotation by the impedance composition between units. The axis of abscissas denotes the frequency, and the axis of ordinates represents the impedance composition between units of each unit.

In the impedance composition (1-2-0.5-1) in FIG. 22(b), the interval of the second and third specific points is smaller than the interval of the first and second points from the center frequency to the outside. That is, at the frequency in this interval, since the phase inclination is large, the deviation of group delay time increases. In the impedance composition (1-1-1-1) in FIG. 20(b), the interval of the second and third specific points relative to the interval of the first and second specific points is slightly larger as compared with FIG. 22(b), and hence there is a small ripple in the part remote from the center frequency by about ±10 kHz.

FIG. 24 suggests that the position of specific point can be moved symmetrically to the center frequency by varying the impedance composition between units in the condition of this embodiment.

Thus, according to the embodiment, the group delay characteristic can be controlled without sacrificing the symmetricity of filter characteristic. Moreover, unlike the conventional method of composing with resonators differing in Δf or Qm, the filter characteristic is improved by changing the matching impedance of the units, and therefore the same piezoelectric materials can be used, and the manufacturing process is simplified.

The design parameters and number of constituent units in the embodiment are only a specific example of the invention, and the values of design parameters and the number of constituent units are not intended to limit the technical scope of the invention.

(Embodiment 12)

Figure 23:
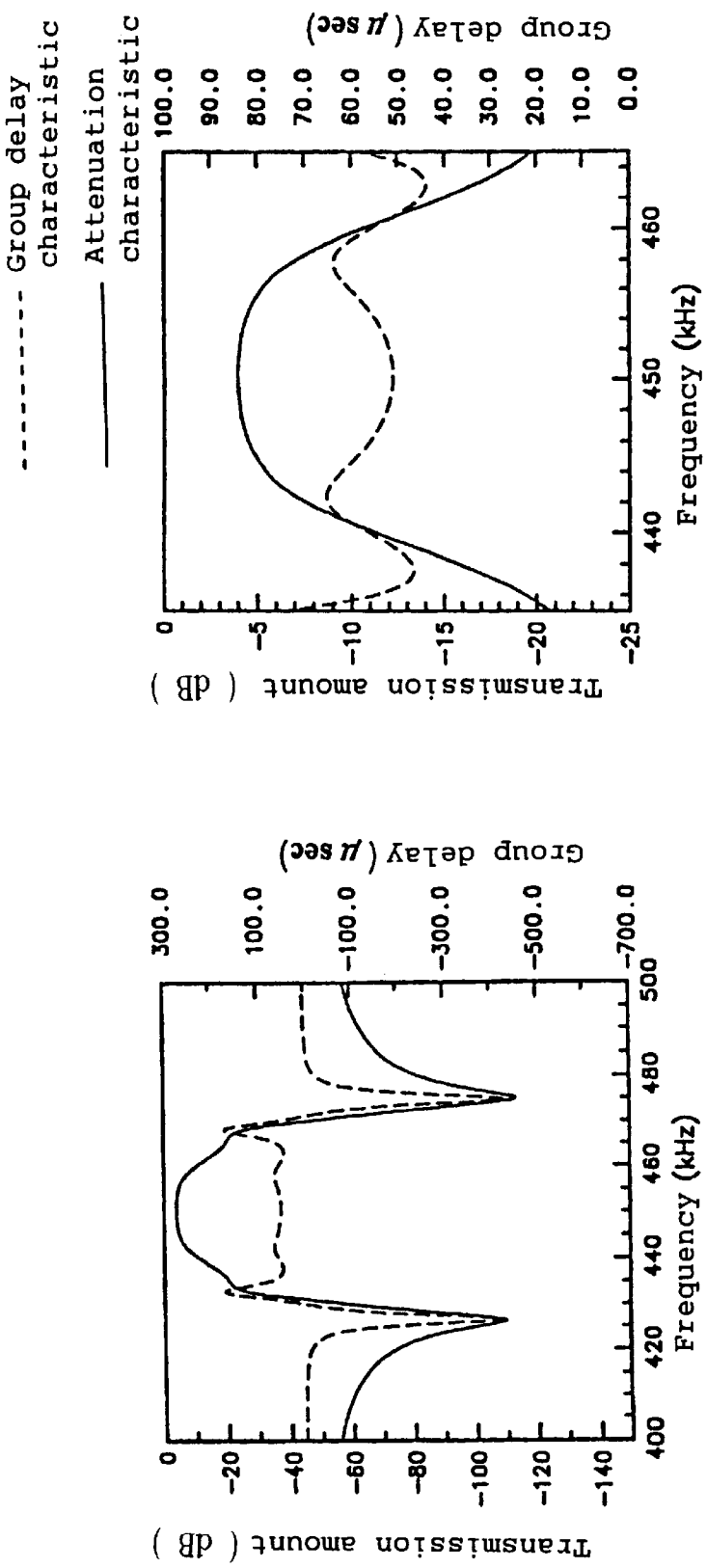
FIG. 23(a), (b) are filter characteristic diagrams of a ladder type piezoelectric filter in embodiment 12 of the invention.

FIG. 23(a), (b) are filter characteristic diagrams in a ladder type piezoelectric filter in a twelfth embodiment of the invention. Herein, FIG. 23(b) is a magnified view of passing band portion of (a). The solid line in FIG. 23 denotes the attenuation characteristic, and the broken line shows the group delay characteristic. The filter is composed of four units (eight elements), and the design parameters are, using the symbols in FIG. 18, as follows:

df1=df2=df3=df4=24 kHz, k1=k4=1, k2=0.5, k3=2,

Q1=Q2=Q3=Q4=150, and material with coupling factor of 0.35. What differs from embodiment 11 is that the second unit and the third unit are exchanged. That is, in the conditions in embodiment 11, the product of the matching impedance of the second unit and the matching impedance of the third unit having a larger value is made nearly equal to the product of the matching impedance of the input stage unit and the matching impedance of the output stage unit.

Comparing FIG. 22(b) and FIG. 23(b), the group delay characteristic of the embodiment is known to have a small ripple in the part closer to the center frequency. As far as this ripple is small enough to satisfy the specification, the group delay characteristic including the ripple component is flat in a very wide range. This phenomenon is described below by referring again to FIG. 24.

As mentioned above, FIG. 24 is an explanatory diagram showing changes of a specific point of phase rotation by the impedance constitution between units.

In the impedance composition (1-2-0.5-1) in FIG. 22(b), from the center frequency to the outside, the interval of the second and third specific points is smaller. That is, at the frequency in this interval, phase rotation occurs abruptly, and hence the deviation of group delay is large.

In the impedance composition (1-0.5-2-1) in FIG. 23, since the interval of the first and second specific points relatively to the interval of the center frequency and the first specific point is somewhat small, a ripple is formed in the frequency interval corresponding to the interval of the first and second specific points. The interval of the second and third specific points is larger relatively to the interval of the first and second specific points, and therefore the phase rotation is moderate in this interval, and the change of the group delay time is moderate.

As known from FIG. 24, by composing so that the product of the matching impedance of the second unit and the matching impedance of the third unit having a larger value may be nearly equal to the product of the matching impedance of the input stage unit and matching impedance of the output stage unit, the interval of the first and second phase rotation specific points to the outside as seen from the center frequency is smaller than the interval of the second and third phase rotation specific points, so that a ripple is formed in the part closer to the center frequency. This ripple can be controlled by the Qm of the constituent material, and the ripple is smaller in the material smaller in Qm. Moreover, in this constitution, the position of the specific point is symmetrical to the center frequency.

Thus, according to the embodiment, the group delay characteristic can be controlled without sacrificing the symmetricity of the filter characteristic. Furthermore, by designing the ripple of the group delay characteristic occurring in the part near the center frequency in a range for satisfying the specification, a flat group delay characteristic is obtained in a wider range than in the prior art. Moreover, unlike the conventional method of composing with resonators differing in Δf or Qm, the filter characteristic is improved by changing the matching impedance of the units, and therefore same piezoelectric materials can be used, and the manufacturing process is simplified.

The design parameters and number of constituent units in the embodiment are only a specific example of the invention, and the values of design parameters and number of constituent units are not intended to limit the technical scope of the invention.

(Embodiment 13)

Figure 25:
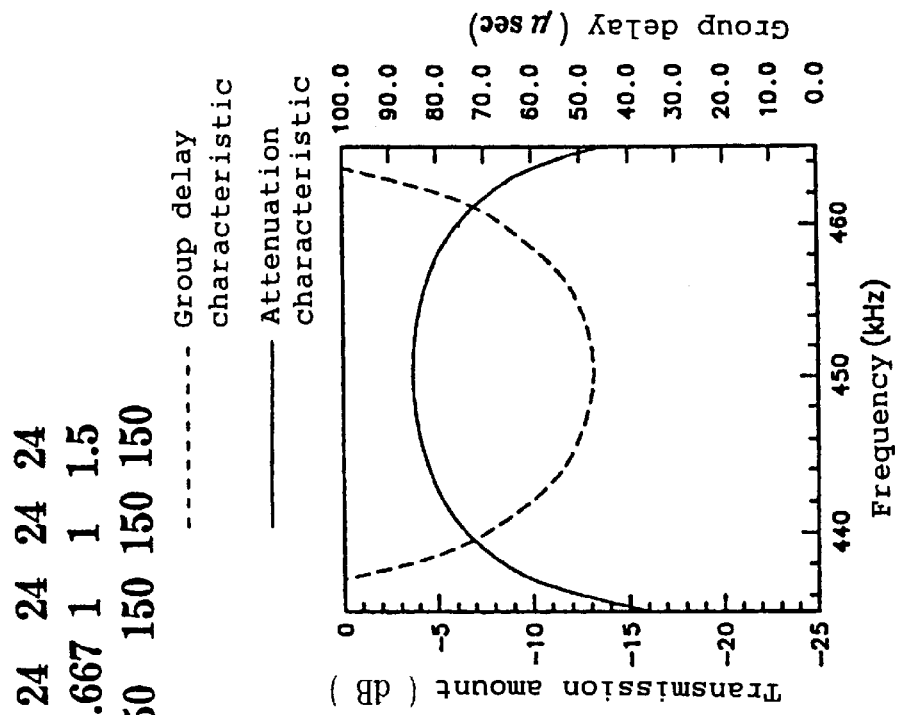
FIG. 25(a), (b) are filter characteristic diagrams of a ladder type piezoelectric filter in embodiment 13 of the invention.
Figure 25:
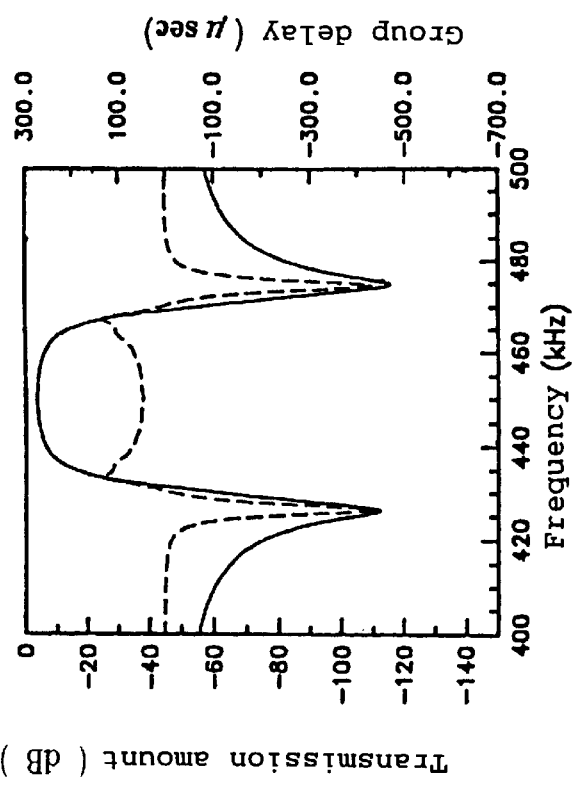

FIG. 25(a), (b) are filter characteristic diagrams in a ladder type piezoelectric filter in a thirteenth embodiment of the invention. Herein, FIG. 25(b) is a magnified view of passing band portion of (a). The solid line in FIG. 25 denotes the attenuation characteristic, and the broken line shows the group delay characteristic. The filter is composed of four units (eight elements), and the design parameters are, using the symbols in FIG. 18, as follows:

df1=df2=df3=df4=24 kHz,
k1=0.667, k2=k3=1, k4=1.5
Q1=Q2=Q3=Q4=150, and
material with coupling factor of 0.35. What differs from embodiments 10, 11, 12 is the matching impedances of the input stage unit and output stage unit are different values. That is, in this example of a ladder type piezoelectric filter, the units are disposed, in which the input side matching impedance and output side matching impedance are nearly equal to each other, this value is assumed to be the matching impedance of the entire circuit, and the product of the matching impedances of two units are symmetrical positions in the intermediate unit relative to all units is nearly equal to the product of the matching impedances of the input stage unit and output stage unit.

In FIG. 25, the attenuation characteristic of the filter characteristic is a favorable characteristic without ripple in the passing band. The group delay characteristic is a symmetrical characteristic to the center frequency, nearly free from ripple in the band.

In this constitution, the operation when changing the matching impedance of the second unit and third unit is described below by reference to the drawing.

Figure 26:
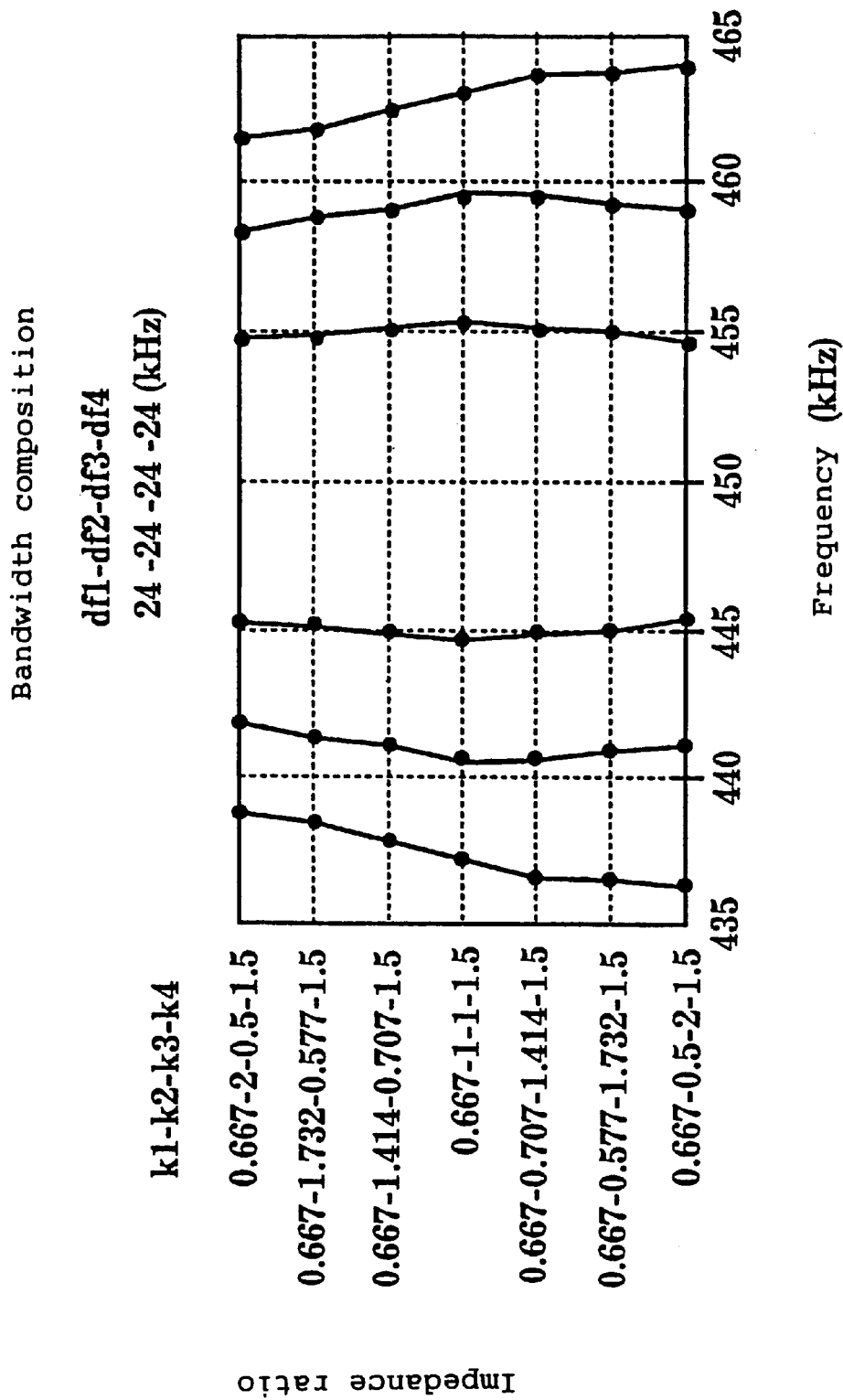
FIG. 26 is an explanatory diagram showing changes of specific point of phase rotation in the ladder type piezoelectric filter in embodiment 13.

FIG. 26 shows, in embodiment 13, the position of a specific point of phase rotation when the matching impedance of the second unit and third unit is changed in the condition in which the product of the matching impedances of the second unit and third unit is equal to the product of the matching impedances of the input stage unit and output stage unit. Herein, the axis of abscissas denotes the frequency, and the axis of ordinates indicates the composition of impedance ratio of the units.

As known from FIG. 26, when the impedance of the input stage unit is smaller than the impedance of the output stage unit, by constituting to increase the impedance of the second unit, the positions of the second and third specific points come closer to the center frequency to the outside as seen from the center frequency. At this time, the position of the first specific point slightly approaches the center frequency, but not so closely as the second and third specific points. Accordingly, the interval of the second and third specific points becomes smaller, and a ripple of group delay occurs in the frequency region corresponding to this. The ripple comes closer to the center frequency when the impedance of the second unit is larger.

To the contrary, when the impedance of the second unit becomes smaller, the third specific point is remote from the center frequency, and the interval of the second and third specific point increases, becoming closer to the interval of the first and second specific points. Accordingly, the phase rotation changes linearly, and the group delay characteristic becomes flat.

Figure 27:
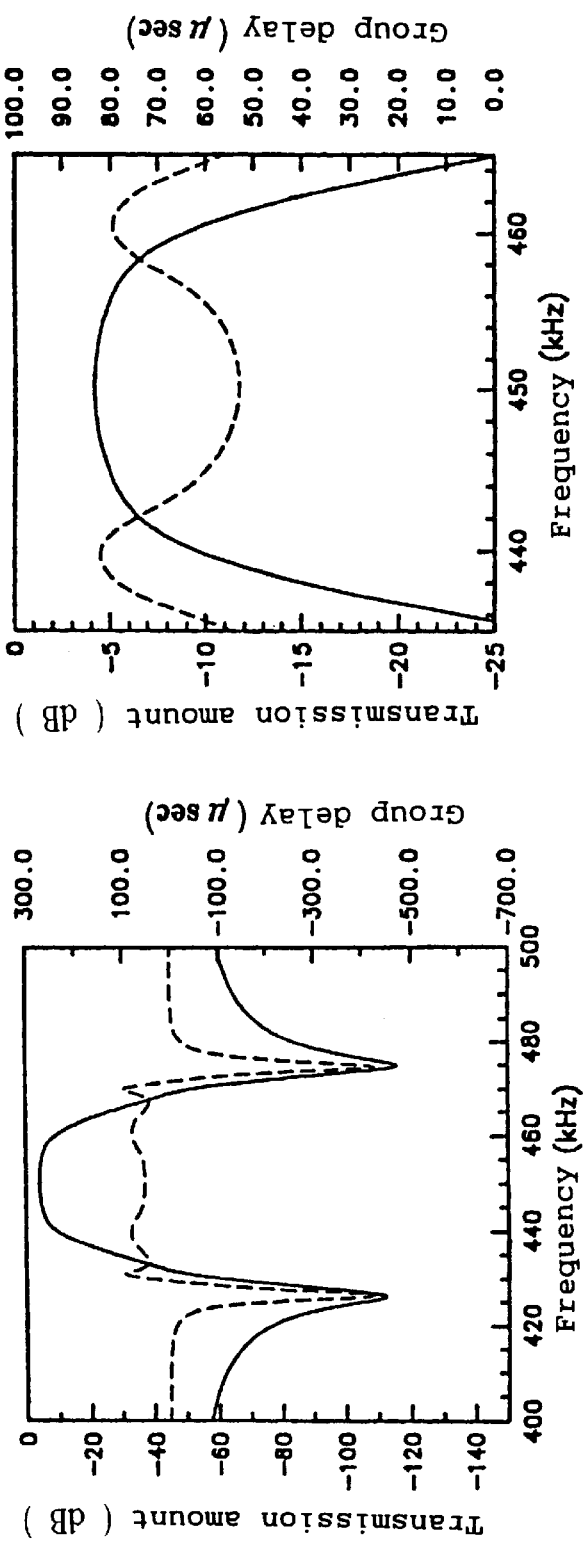
FIG. 27(a), (b) are filter characteristic diagrams of an example of the ladder type piezoelectric filter in embodiment 13.
Figure 28:
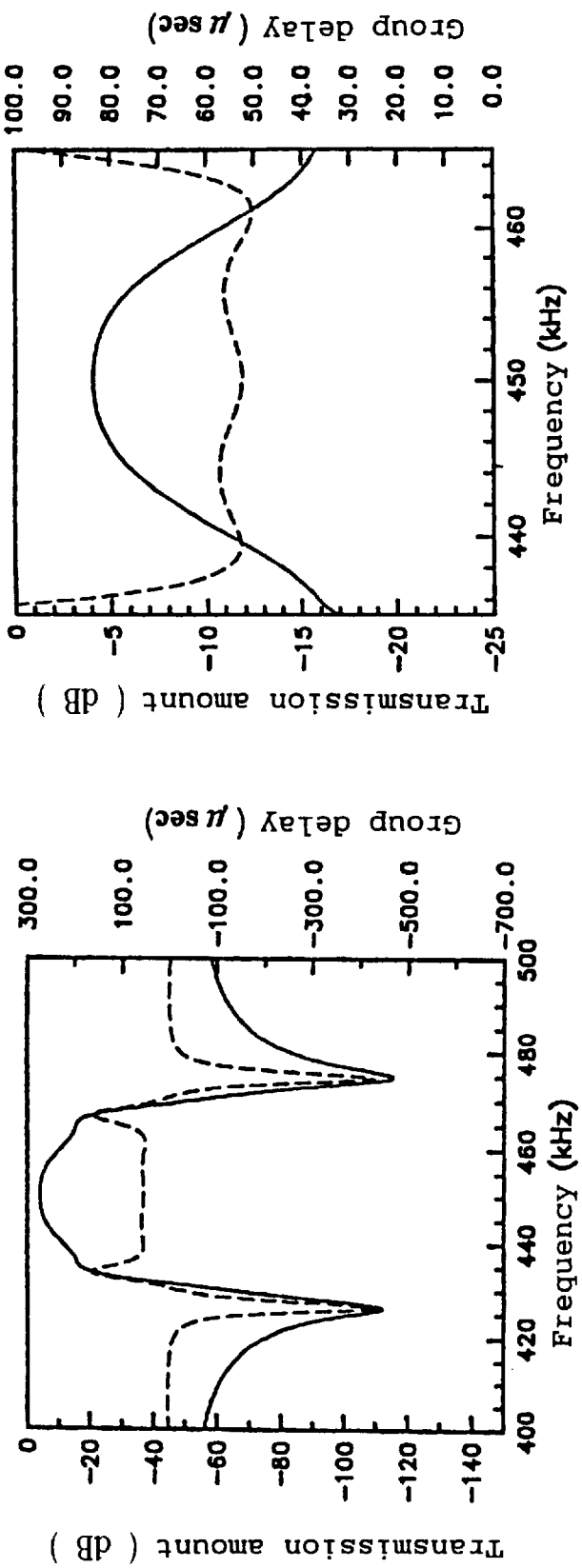
FIG. 28(a), (b) are filter characteristic diagrams of other example of the ladder type piezoelectric filter in embodiment 13.

The characteristics obtained by these impedance compositions are shown in FIG. 27(a), (b) and FIG. 28(a), (b). Herein, the solid line in FIG. 27 and FIG. 28 denotes the attenuation characteristic, and the broken line represents the group delay characteristic. In the diagrams, (b) is a magnified view of the passing band portion of (a). Using the symbols in FIG. 18, the design parameters in FIG. 27(a) are:

df1=df2=df3=df4=24 kHz,
k1=0.667, k2=2, k3=0.5, k4=1.5
Q1=Q2=Q3=Q4=150, and
material with coupling factor of 0.35, and in FIG. 28(a):
df1=df2=df3=df4=24 kHz,
k1=0.667, k2=0.5, k3=2, k4=1.5
Q1=Q2=Q3=Q4=150, and
material with coupling factor of 0.35.

Thus, according to the embodiment, without sacrificing the symmetricity of filter characteristic, the position of specific point of phase rotation can be controlled. Further regarding the passing band, a more favorable attenuation characteristic with small ripple is realized than in the constitution of equalizing the impedances of the input and output units. Moreover, unlike the conventional method of composing with resonators differing in Δf or Qm, the filter characteristic is improved by changing the matching impedance of the units, and therefore the same piezoelectric materials can be used, and the manufacturing process is simplified.

The design parameters and number of constituent units in the embodiment are only a specific example of the invention, and the values of design parameters and number of constituent units are not intended to limit the technical scope of the invention.

(Embodiment 14)

Figures 30A, 30B:
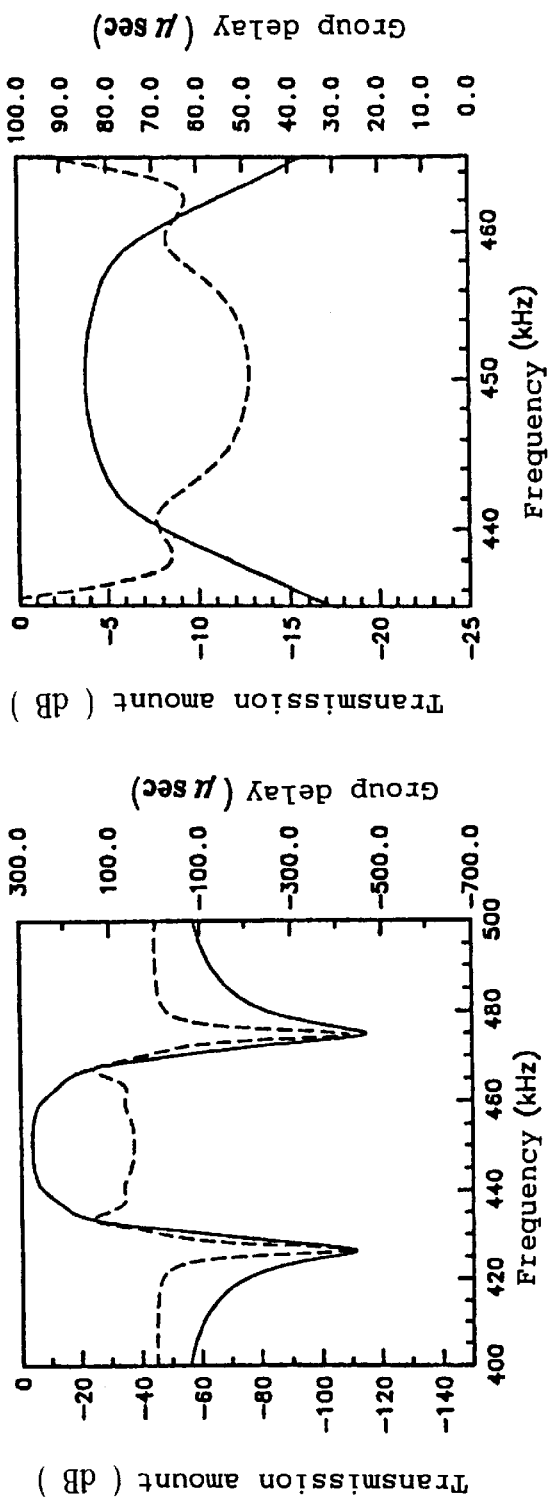
FIG. 30(a), (b) are filter characteristic diagrams of other example of the ladder type piezoelectric filter in embodiment 14.

FIG. 29(a), (b), and FIG. 30(a), (b) are filter characteristic diagrams in a ladder type piezoelectric filter in a fourteenth embodiment of the invention. Herein, the solid line in FIG. 29 and FIG. 30 denotes the attenuation characteristic, and the broken line represents the group delay characteristic. In the diagrams, (b) is a magnified view of the passing band portion of (a). The filter is composed of four units (eight elements), and using the symbols in FIG. 18, the design parameters in FIG. 29(a) are:

df1=df4=28 kHz, df2=df3=20 kHz,
k1=k4=1, k2=1.414, k3=0.707, and
Q1=Q2=Q3=Q4=150,
and in FIG. 30(a):
df1=df4=28 kHz, df2=df3=20 kHz,
k1=k4=1, k2=0.707, k3=1.414, and
Q1=Q2=Q3=Q4=150, and the material with coupling factor of 0.35 is used in both. What differs from the other embodiments is that the bandwidth of constituent units and impedance are changed simultaneously. That is, designed by the image parameter method, this is a ladder type piezoelectric filter connecting plural stages of basic units composed by connecting series elements and parallel elements in an L-form, in which the design bandwidth of the input stage unit and the bandwidth of the output stage unit are maximum, the design bandwidth of the units from the input stage unit to the intermediate stage unit is gradually decreased, and the design bandwidth of the units from the intermediate stage unit to the output stage unit is gradually increased. The input side matching impedance and output side matching impedance of the entire circuit are nearly equal, and the square of this value is divided by the matching impedance of the input stage unit, and the result is the matching impedance of the output stage unit, and moreover the units in this example of ladder type piezoelectric filter are arranged so that the product of the matching impedances of the two units at symmetrical positions of the intermediate units of the entire units is nearly equal to the product of the matching impedances of the output stage unit and input stage unit.

In thus constituted ladder type piezoelectric filter, the operation is described below while referring to FIG. 31.

Figure 31:
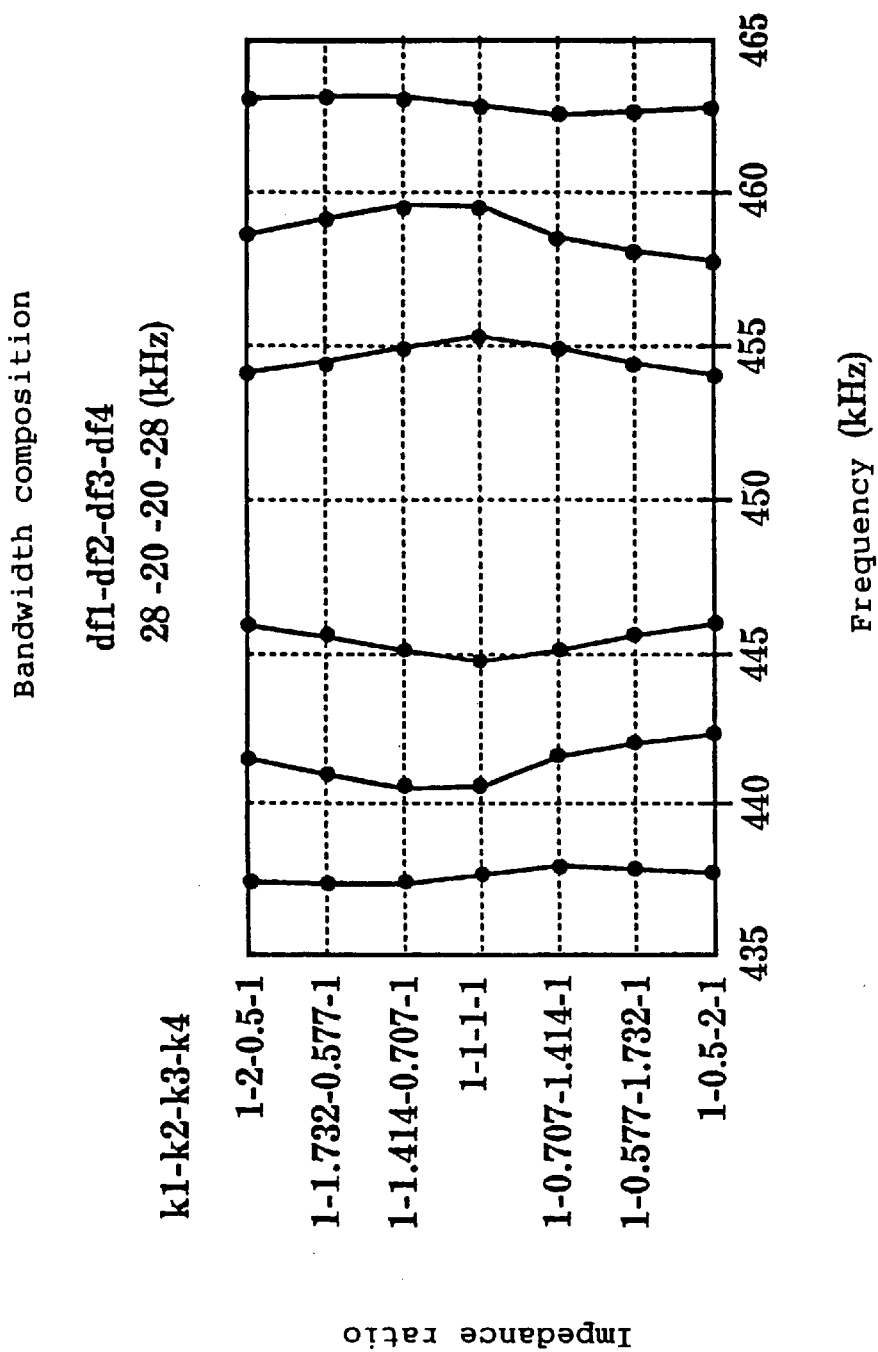
FIG. 31 is an explanatory diagram showing changes of specific point of phase rotation in the ladder type piezoelectric filter in embodiment 14.

FIG. 31 shows the position of a specific point of phase rotation in the ladder type piezoelectric filter of the embodiment, in which the impedance composition of the units is changed when the bandwidth of the constituent units is df1=df4=28 kHz, df2=df3=20 kHz.

Herein, the axis of abscissas denotes the frequency, and the axis of ordinates represents the composition of impedance ratio of the units.

Comparing FIG. 31 and the case shown in FIG. 24 of embodiment 12 (all units are equal in bandwidth), it is clear that the position of specific point relative to the impedance is largely different. For example, taking note of the third specific point to the outside as seen from the center frequency, when the impedance of the second unit is larger than the impedance of the third unit, as compared with the uniform bandwidth constitution, the specific point is located at a frequency further from the center frequency in this embodiment. Hence, the interval of the second and third specific points is larger and is closer to the interval of the first and second specific point, and therefore the group delay deviation in this frequency interval is smaller (see FIG. 29(b)).

To the contrary, when the impedance of the second unit is smaller than the impedance of the third unit, the first, second and third specific points are all located at the center frequency side, and the interval of the first and second specific points is smaller than the interval of the center frequency and first specific point, and therefore the group delay characteristic forms the ripple at a frequency closer to the center frequency (see FIG. 30(b)).

That is, by manipulating the frequency composition of each unit and impedance composition simultaneously, the group delay characteristic can be improved more effectively.

Thus, according to the embodiment, the group delay characteristic may be manipulated more effectively without sacrificing the symmetricity of filter characteristic. Moreover, unlike the conventional method of composing with resonators differing in Δf or Qm, the filter characteristic is improved by changing the matching impedance of the units, and therefore the same piezoelectric materials can be used, and the manufacturing process is simplified.

The design parameters and number of constituent units in the embodiment are only a specific example of the invention, and the values of design parameters and number of constituent units are not intended to limit the technical scope of the invention.

Hence, according to the embodiment, the specific points for π/2 rotation of the phase of the ladder type piezoelectric filter can be located at frequency points symmetrical to the center frequency. Since the group delay characteristic is realized by differentiating the phase by frequency, when the specific points are symmetrical, the attenuation characteristic and group delay characteristic symmetrical to the center frequency of the filter are realized. Moreover, by combining the bandwidth composition of units and the impedance composition in the above constitution, the interval can be kept uniform within the band while maintaining the symmetricity of the specific points to the center frequency. In order that the group delay characteristic be flat, the phase rotation should change linearly, and hence the specific point interval is equal on the frequency. Hence, a flat group delay characteristic symmetrical to the center frequency is realized in the band.

Therefore, without using conductive rubber or damping resistance, the group delay characteristic of the filter can be controlled by composing the same piezoelectric materials, the number of parts is decreased and the manufacture is easy, and moreover it eliminates the process accompanied by complicated control such as change of difference Δf of resonance frequency and antiresonance frequency. At the same time, favorable group delay characteristic and attenuation characteristic symmetrical to the center frequency can be realized, and it is not necessary to reduce the mechanical quality Qm of material by damping resistance or conductive rubber in order to improve the group delay characteristic, and hence a characteristic of small insertion loss is realized.

In the foregoing embodiments, the number of units is four stages, but the number of units is not limited to this. The number of units may be also an odd number.

In the tenth and fourteenth embodiments, the bandwidth of the input and output stage units is larger than the bandwidth of the intermediate stage unit, but nothing is explained about the smaller case, but as clear from FIG. 12 (see the lower side portion of (22-26-26-22) of the bandwidth composition shown in FIG. 21), the effects are nearly same as in the tenth embodiment, and the same holds true with the bandwidth composition of the units in the fourteenth embodiment.

(Embodiment 15)

An intermediate frequency filter in a fifteenth embodiment of the invention is described below by reference to the drawings.

As explained in the prior art, when a ceramic filter made of piezoelectric ceramic material is used as an intermediate frequency filter of communication appliance in digital radio communication system, it is extremely difficult to realize root roll-off characteristic free from inter-code interference in the ceramic filter in 450 kHz band used in the digital mobile communication appliance because it is not easy to design and manufacture for reducing the code error rate derived from inter-code interference, while possessing excellent filter characteristics.

Herein, therefore, by investigating the effects of filter characteristics on the transmission system characteristics if going out of the root roll-off characteristics, preferred characteristics of the ceramic filter when the ceramic filter is used as such intermediate frequency filter were studied, and the results are described below.

The filter characteristics were evaluated by simulating the modulation precision expressing the deviation from the ideal signal (state free from inter-code interference), that is, (absolute value of vector amplitude error) / (absolute value of ideal signal amplitude).

First of all, in evaluating the filter characteristics by modulation precision, the outline procedure of modulation precision simulation employed in the simulation is briefly described below. The procedure of this modulation precision simulation consists of the following steps:

(1) Creating random data by using 15-stage M series.
(2) Converting binary code into gray code.
(3) Mapping gray code into π/4 shift QPSK.
(4) Determining the impulse response of root roll-off filter.
(5) Creating repeated waveforms for FFT.
(6) Integrating convolution.
(7) Amplifying by passing through linear amplifier.
(8) Determining the maximum, minimum, and average power.
(9) Determining the frequency region by FFT.
(10) Creating plotting data in frequency region.
(11) Passing reception filter in frequency region.
(12) Determining the time region in FFT.
(13) Plotting data on phase plane.
(14) Determining amplitude error and phase error.
(15) Calculating the modulation precision.
(16) Changing the inclination of filter phase.

Herein, integration of step (6) is conducted by passing through a root roll-off filter, and the reception filter characteristic of (11) is taken in from the ceramic filter design program or measured data, and the filter characteristic is given by the amplitude and phase. In π/4 shift QPSK modulation, modulation is applied by relative displacement of phase, and hence the inclination of filter phase does not matter, but what matters is how much the phase is deviated from the linearity. Hence, the phase is given by the difference of the reference line and take-in data. The inclination of the reference line is determined to minimize the modulation precision by repeating steps (11) to (16).

Figure 32:
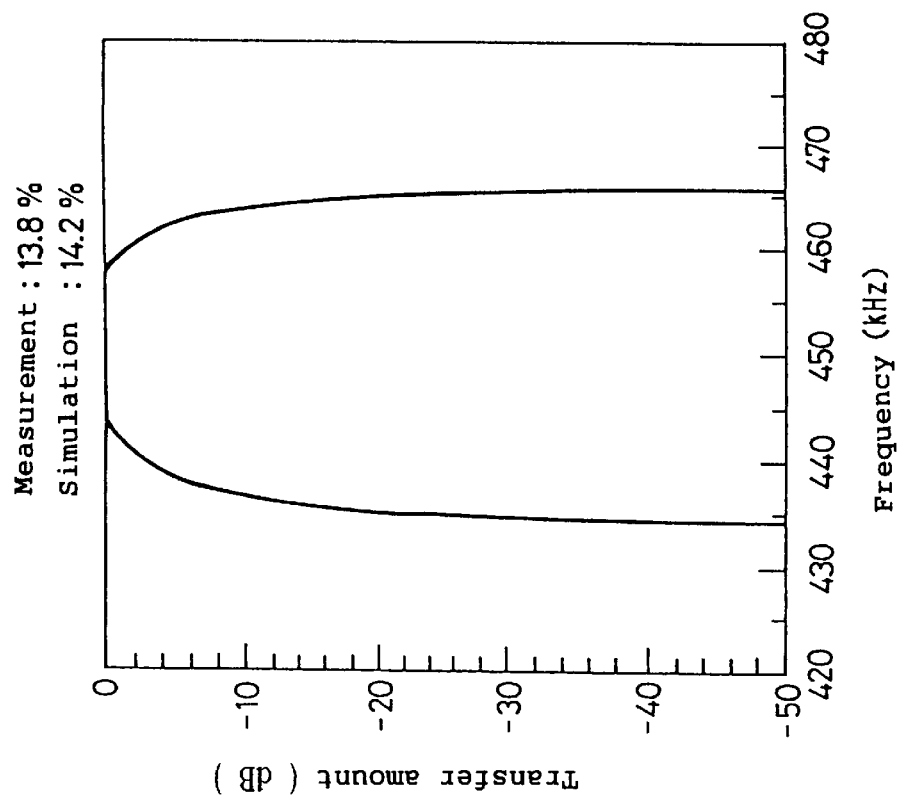
FIG. 32 is a root roll-off characteristic diagram between transmission and reception used in modulation precision simulation in the invention.
Figure 33:
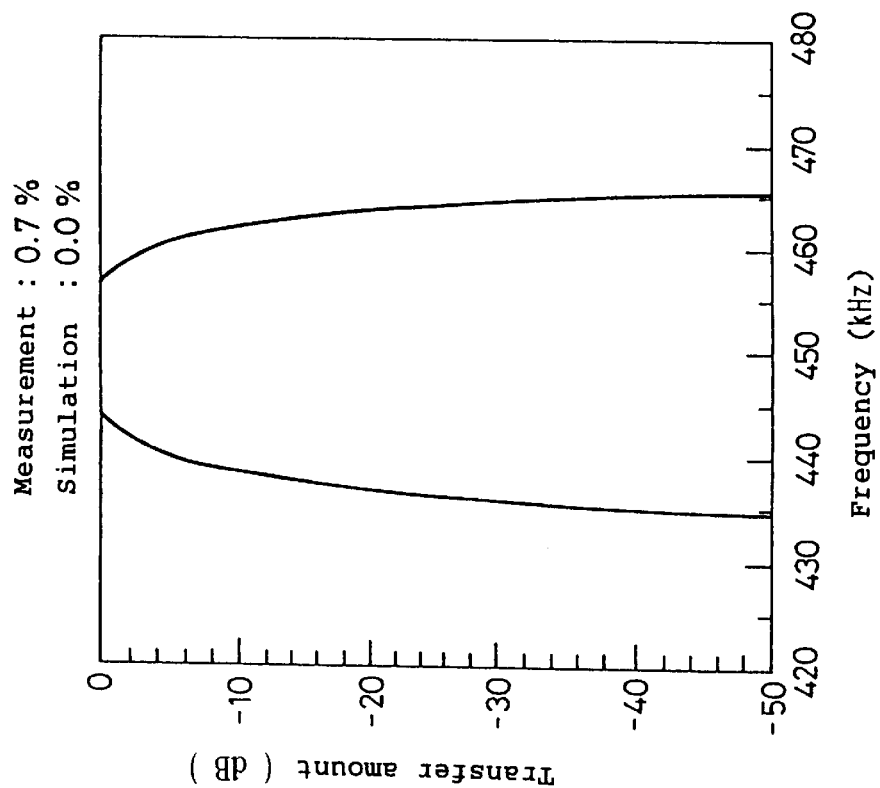
FIG. 33 is a root roll-off characteristic diagram between transmission and reception used in the simulation
Figure 34:
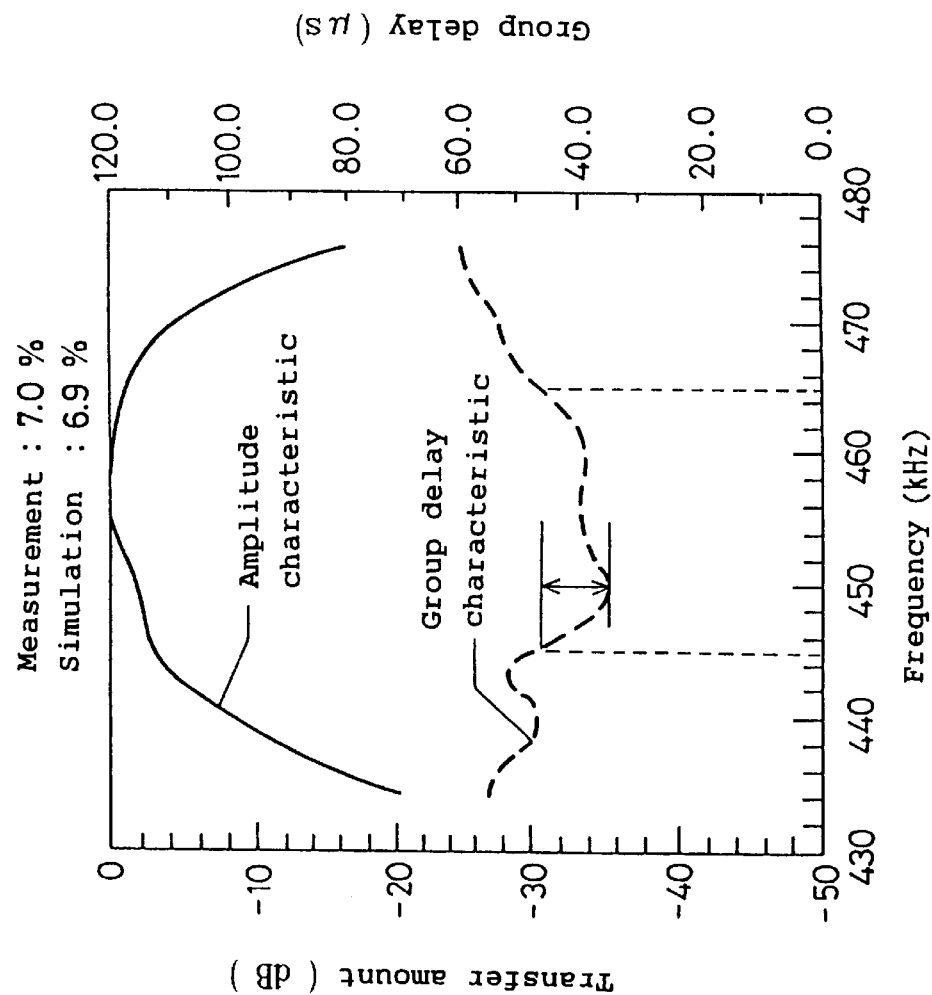
FIG. 34 is a transmission side root roll-off and reception side A characteristic diagram used in the simulation.
Figure 35:
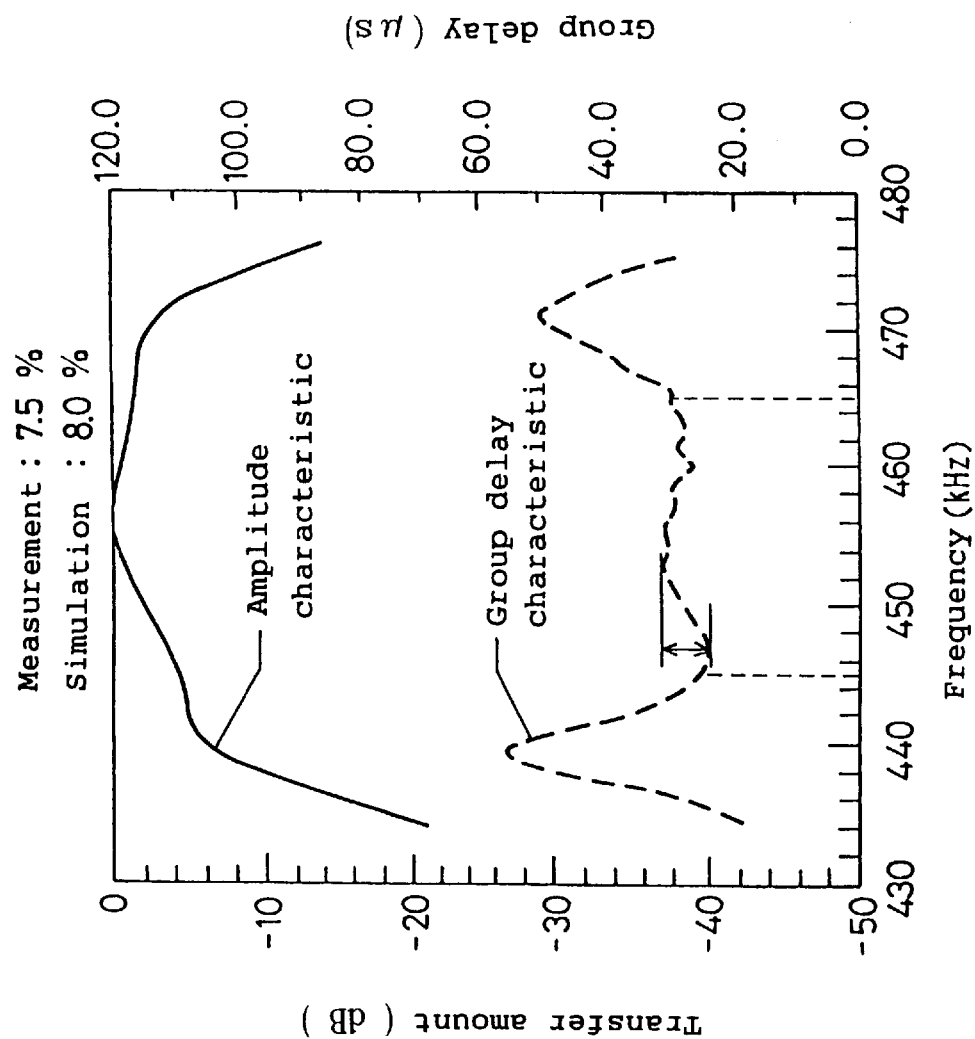
FIG. 35 is a transmission side root roll-off and reception side B characteristic diagram used in the simulation.
Figure 36:
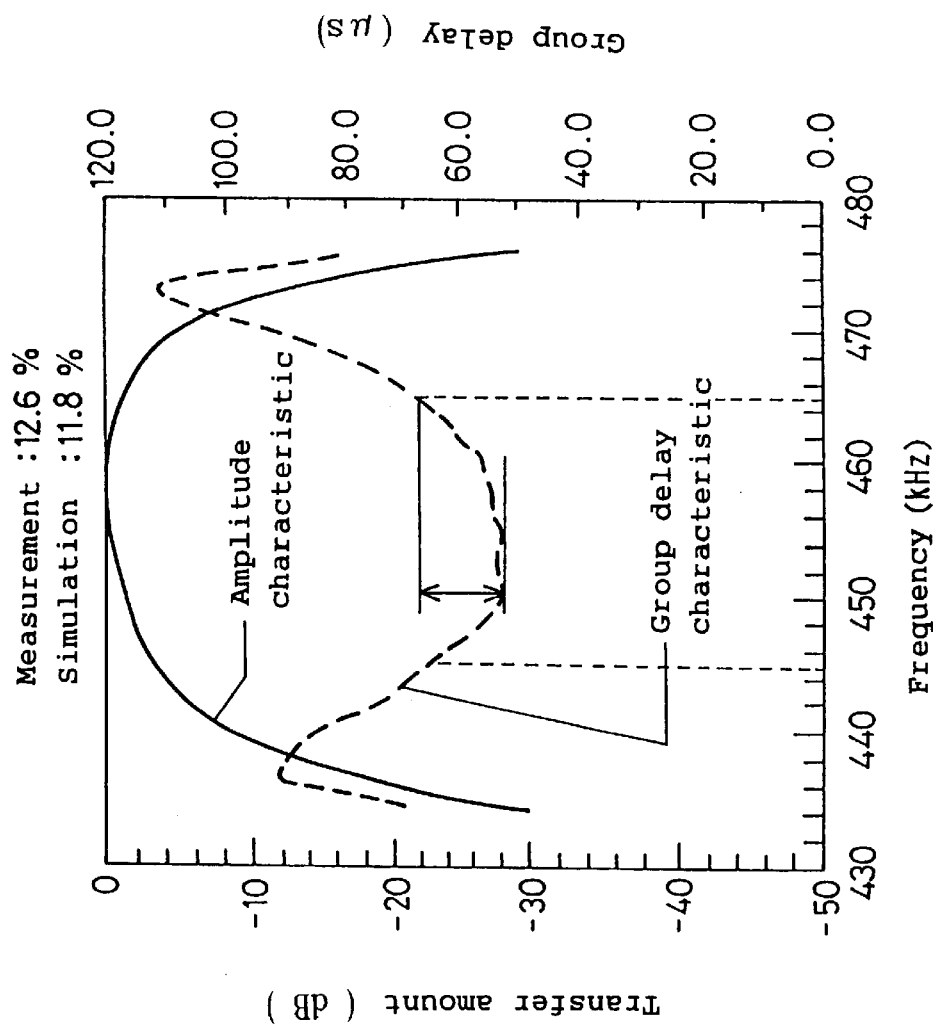
FIG. 36 is a transmission side root roll-off and reception side C characteristic diagram used in the simulation.

This simulation was conducted in the combination of various filter characteristics shown in FIG. 32 to FIG. 38. FIG. 32 relates to a root roll-off characteristic between transmission and reception side, FIG. 33 to a case of roll-off characteristic between transmission and reception side, FIG. 34 to a case of root roll-off characteristic of transmission side filter and A-characteristic of reception side filter, FIG. 35 to a case of root roll-off characteristic of transmission side filter and B-characteristic of reception side filter, and FIG. 36 to a case of root roll-off characteristic of transmission side filter and C-characteristic of reception side filter. Of these filter characteristics, the measured values of modulation precision and results of simulation are compared in Table 1.

TABLE 1

|  | Root roll-off between transmission and reception side | Roll-off characteristic between transmission and reception side | Root roll-off filter of transmission side | | |
|---|---|---|---|---|---|
|  |  |  | A-characteristic of reception side | B-characteristic of reception side | C-characteristic of reception side |
| Measured value | 13.8% | 0.7% | 7.0% | 7.5% | 12.6% |
| Simulation | 14.2% | 0.0% | 6.9% | 8.0% | 11.8% |

As clear from Table 1, a fair coincidence between measurement and simulation of modulation precision is confirmed. Hence, in this embodiment, the filter characteristic is evaluated by simulation of modulation precision.

For downsizing of 450 kHz band ceramic filter, as the filter element, it is effective to use a rectangular plate resonator making use of length expander mode of piezoelectric resonator. However, when making use of length vibration, the interval of resonance frequency and antiresonance frequency is smaller than in spread vibration, and it involves a problem of difficulty of design of wide-band filter. Accordingly, effects of bandwidth changes on the modulation precision were studied.

In this study, using an intermediate frequency filter with root roll-off filter characteristic of 3 dB bandwidth=±10.5 kHz and roll-off factor $\alpha=0.5$ in the transmission system, the 3 dB bandwidth and roll-off factor $\alpha$ of the root roll-off filter for giving the characteristic as the intermediate frequency filter in the reception system were varied, and the modulation precision was evaluated. The root roll-off filter in the reception system is the ceramic filter to be evaluated. Herein, the characteristic of each filter is supposed to have a linear phase characteristic. The results of study in these conditions are shown in Table 2 and Table 3.

TABLE 2

| Roll-off factor $\alpha$ | Bandwidth ± 8.5 kHz | Bandwidth ± 9.0 kHz | Bandwidth ± 9.5 kHz | Bandwidth ± 10.0 kHz | Bandwidth ± 10.5 kHz |
|---|---|---|---|---|---|
| 0.5 | 18.1% | 12.2% | 7.2% | 3.2% | 0.0% |
| 0.6 | 14.9% | 9.9% | 5.9% | 2.7% | 0.3% |
| 0.7 | 12.4% | 8.3% | 5.0% | 2.3% | 0.6% |
| 0.8 | 10.5% | 7.1% | 4.4% | 2.2% | 1.4% |
| 0.9 | 9.1% | 6.2% | 3.9% | 2.3% | 1.9% |
| 1.0 | 7.8% | 5.4% | 3.6% | 2.5% | 2.4% |

TABLE 3

| Roll-off factor $\alpha$ | Bandwidth ± 11.0 kHz | Bandwidth ± 11.5 kHz | Bandwidth ± 12.0 kHz | Bandwidth ± 12.5 kHz | Bandwidth ± 13.0 kHz |
|---|---|---|---|---|---|
| 0.5 | 2.6% | 4.7% | 6.4% | 7.8% | 9.0% |
| 0.6 | 2.2% | 4.0% | 5.5% | 6.8% | 7.9% |
| 0.7 | 2.1% | 3.6% | 4.9% | 6.0% | 7.0% |
| 0.8 | 2.2% | 3.4% | 4.6% | 5.6% | 6.4% |
| 0.9 | 2.6% | 3.5% | 4.5% | 5.4% | 6.1% |
| 1.0 | 3.0% | 3.8% | 4.6% | 5.4% | 6.0% |

Table 2 and Table 3 prove that the best modulation precision is obtained when the 3 dB bandwidth is ±10.5 kHz, and that the modulation precision is inferior when the 3 dB bandwidth is either larger or smaller, and it also suggests that the same holds true in all roll-off factors.

The degree of deterioration is smaller when the 3 dB bandwidth is wider than when narrower, and when the 3 dB bandwidth is designed wider, it is known advantageous because the degree of deterioration by fluctuations of frequency is smaller. Concerning the roll-off factor, there is an optimum value of roll-off factor for achieving the best modulation precision depending on the 3 dB bandwidth. When the 3 dB bandwidth is narrower, by increasing the roll-off factor, the rate of deterioration of modulation precision tends to be smaller.

Thus, when the 3 dB bandwidth is narrow, by increasing the roll-off factor, deterioration of modulation precision may be lessened, but as compared with the case of wide 3 dB bandwidth, it is estimated that the frequency deviation by temperature characteristic may adversely affect the modulation precision.

Generally, the energy distribution of transmission signal is considered to be concentrated in the 3 dB bandwidth of the filter. Therefore, when the filter characteristic in the 3 dB bandwidth is changed, as a matter of course, variation of modulation precision is predicted.

Figure 37:
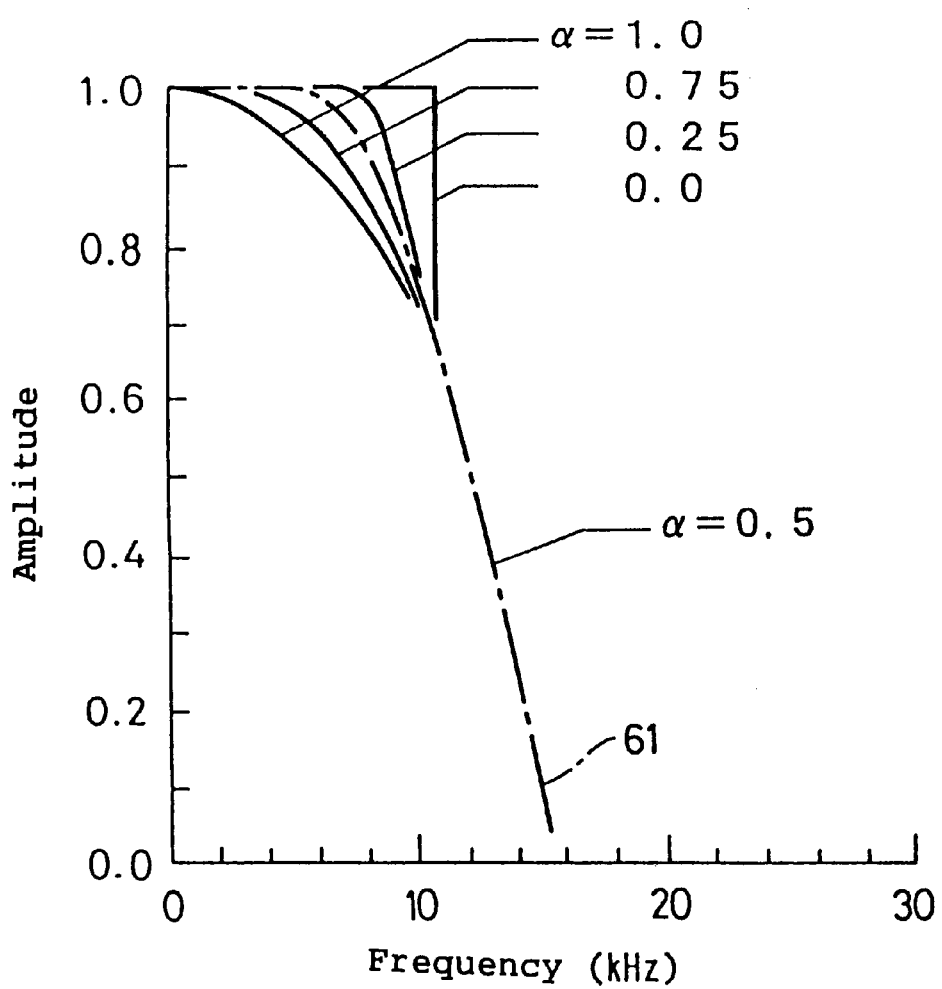
FIG. 37 is a filter characteristic diagram used in evaluation of changes of modulation precision.
Figure 38:
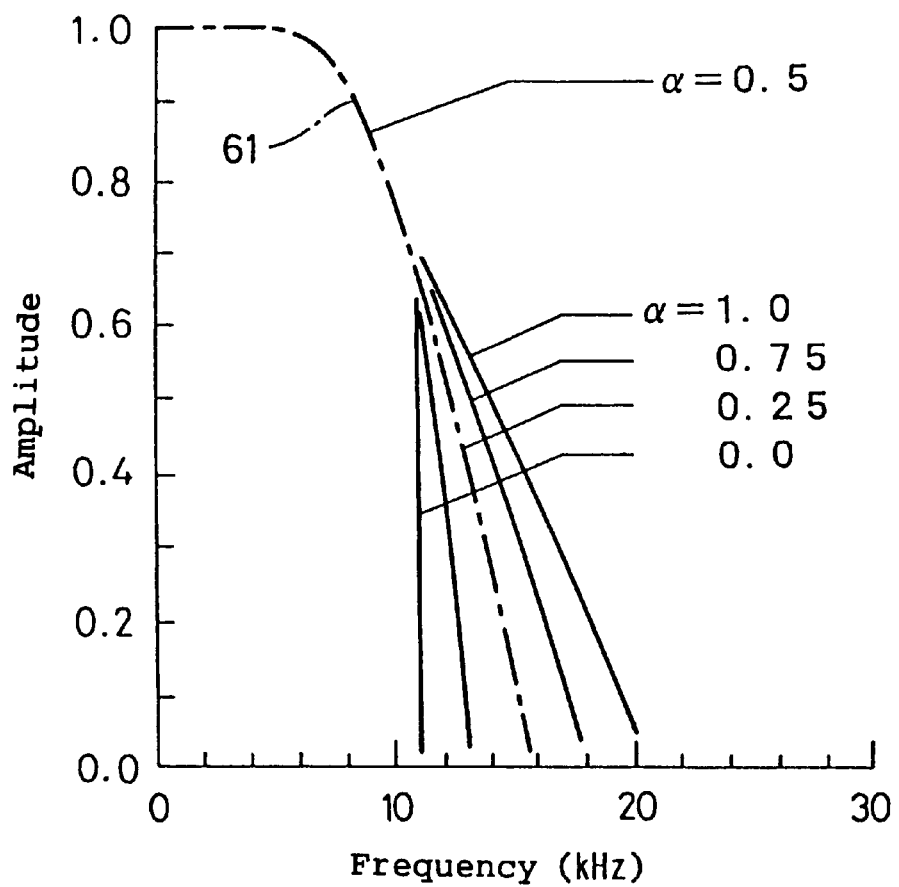
FIG. 38 is a filter characteristic diagram used in the evaluation.

FIG. 37 and FIG. 38 are characteristic diagrams of low frequency filter for evaluating the change of modulation precision. FIG. 37 and FIG. 38 are based on same low frequency filter, and show characteristic diagrams of low frequency filters varying the roll-off factor inside and outside the 3 dB bandwidth.

This filter characteristic is based on the root roll-off filter with 3 dB bandwidth=10.5 kHz and roll-off factor $\alpha$=0.5. FIG. 37 shows the filter characteristic when the roll-off factor $\alpha$ is changed to 0, 0.25, 0.75, and 1.0 in a frequency band lower than 10.5 kHz, and FIG. 38 is a case of changing the roll-off factor $\alpha$ to 0, 0.25, 0.75, and 1.0 in a frequency band higher than 10.5 kHz. The phase is assumed to be constant, and the group delay characteristic is not taken into consideration. A single-dot chain line 61 in FIG. 37 and FIG. 38 represents the filter characteristic of root roll-off filter with roll-off factor $\alpha$=0.5 in each transmission system.

Figure 39:
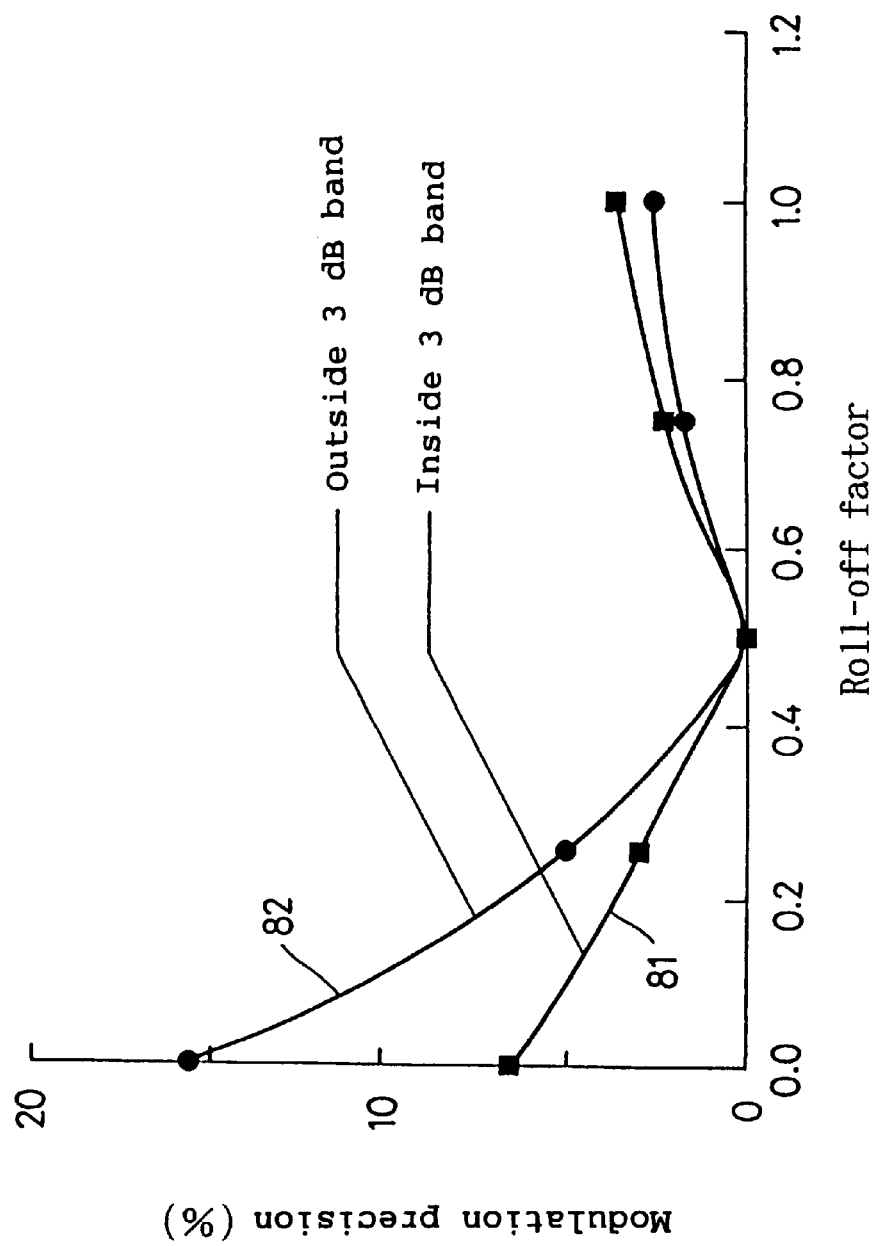
FIG. 39 is a modulation precision characteristic diagram in terms of roll-off factor.

Evaluation results of modulation index in the transmission system of the filter characteristics shown in FIG. 37 and FIG. 38 are recorded in FIG. 39. According to FIG. 39, in the modulation precision characteristic 81 when the roll-off factor is changed within the 3 dB bandwidth, deterioration of modulation precision is slightly smaller when the roll-off factor $\alpha$ is larger than 0.5 than when smaller, and in the modulation precision characteristic 82 when the roll-off factor is changed outside the 3 dB bandwidth, deterioration of modulation precision is extremely smaller when the roll-off factor $\alpha$ is larger than 0.5 than when smaller.

In other words, in the case of a filter of which 3 dB bandwidth is ±10.5 kHz, deterioration of modulation precision is smaller in the filter characteristic of which transmission amount within the 3 dB bandwidth is smaller than the transmission amount of the root roll-off characteristic at roll-off factor of 0.5, as compared with the filter characteristics being larger, and deterioration of modulation precision is smaller in the filter characteristic of which transmission amount outside the 3 dB bandwidth is larger than the transmission amount of the root roll-off characteristic at roll-off factor of 0.5, as compared with the filter characteristic being smaller. The degree of deterioration is extreme when the transmission amount outside the 3 dB bandwidth is smaller than the transmission amount of the root roll-off characteristics at roll-off factor of 0.5.

The filter characteristic smaller in the roll-off factor $\alpha$ is an extremely steep cut-off characteristic, which is hard to realize, and the actual roll-off factor is likely to be larger than 0.5. Therefore, the characteristic within the 3 dB bandwidth is important from the viewpoint of enhancing the modulation precision.

So far is explained the review result of amplitude characteristic of filter, and the analysis result of group delay characteristic discussed below.

The group delay characteristic of ceramic filter is dominated by the absolute group delay time and group delay ripple deviation. The absolute group delay time is to define the timing of transmission and reception in the transmission system, and has no effect on the modulation precision. By contrast, the group delay ripple deviation is a cause of waveform distortion when a signal passes through the filter, and has a direct effect on the modulation precision.

The number of group delay ripples in the 3 dB bandwidth of the filter (the number of peaks in group delay on the frequency axis) varies somewhat depending on the design technique. In the present regulation of the group delay characteristic, the ripple deviation is determined, but the number of ripples is not defined. Herein, the relation of the group delay ripple deviation and modulation precision is investigated, and, moreover, when the ripple deviations are equal, the effects on the modulation precision by different number of ripples are also studied.

The object of review is the root roll-off characteristic of which 3 dB bandwidth is ±10.5 kHz and roll-off factor $\alpha$ is 0.5. The phase characteristic was given as ph(x)=x−sinx.

Figure 40:
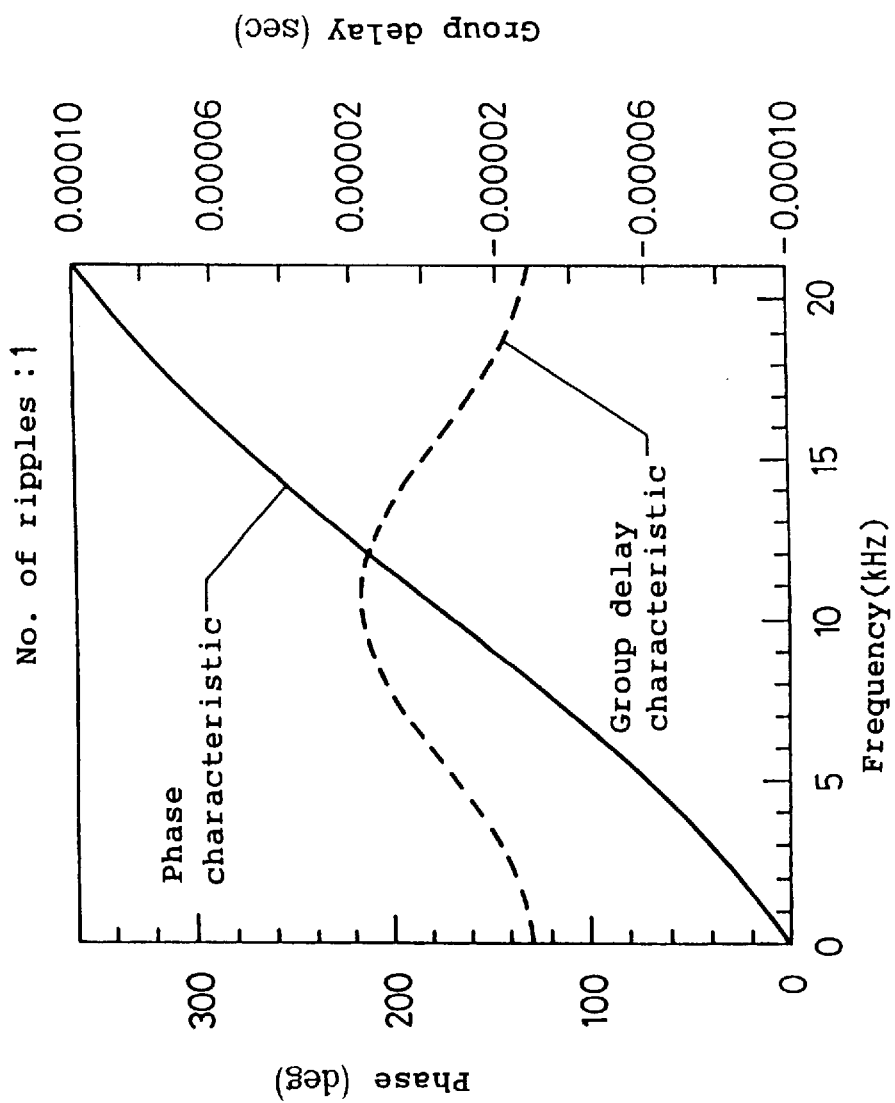
FIG. 40 is a group delay characteristic diagram in the case of one group delay ripple.
Figure 41:
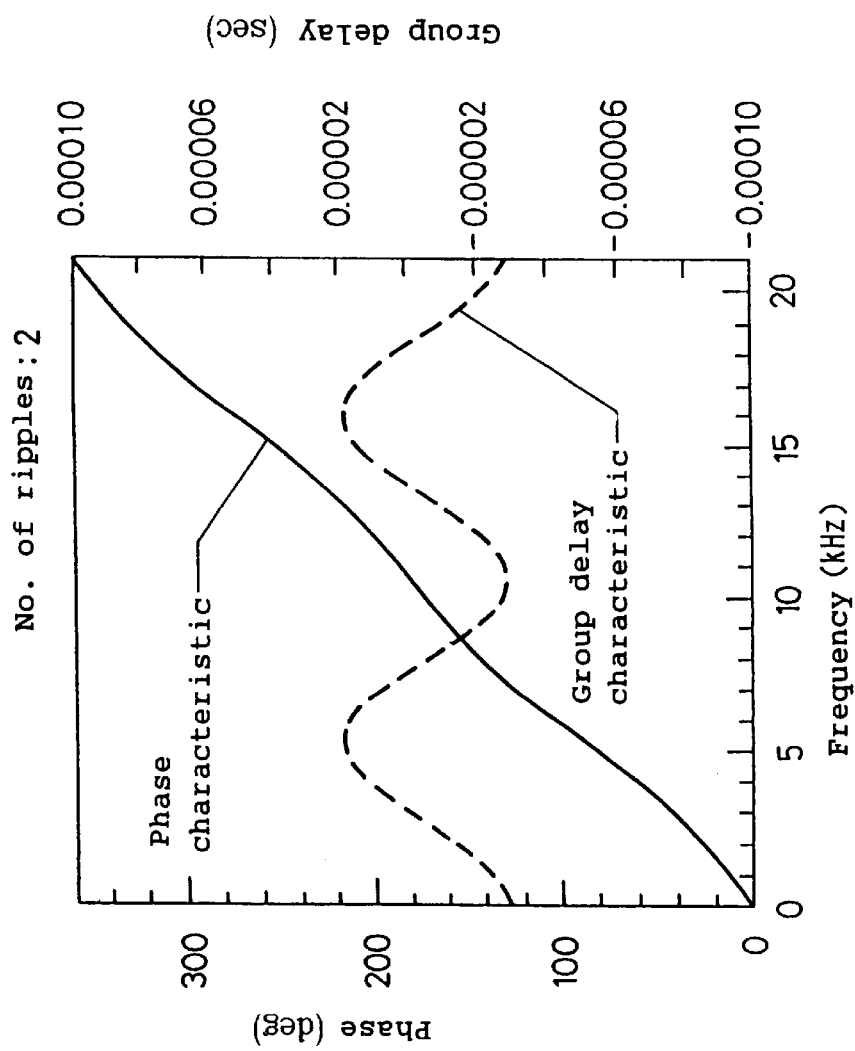
FIG. 41 is a group delay characteristic diagram in the case of two group delay ripples.
Figure 42:
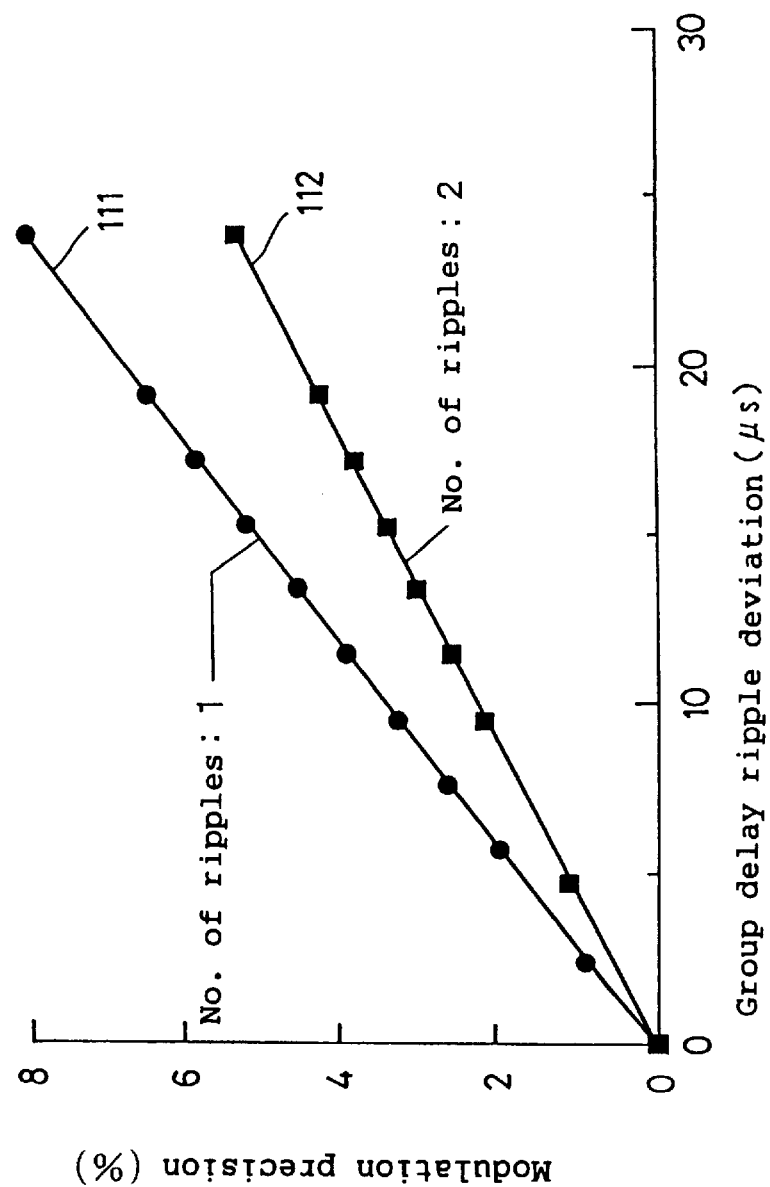
FIG. 42 is a modulation precision characteristic diagram in terms of group delay ripple deviation.

FIG. 40 shows a characteristic when the number of group delay ripples is 1 which is a typical feature of the ceramic filter, and FIG. 42 shows a characteristic when the number of group delay ripples is 2. In FIG. 40 and FIG. 41, the solid line refers to the phase characteristic, and the broken line indicates the group delay characteristic.

FIG. 42 is a modulation precision characteristic diagram relative to the group delay ripple deviation. FIG. 42 suggests that the group delay ripple deviation and the modulation precision are in a relation of linear proportion. Herein, it is evidently shown that curve 112 with two ripples is smaller in deterioration of modulation precision relative to the same group delay ripple deviation, as compared with curve 111 with one ripple. Similar results were obtained when the number of ripples was more than 2.

When the group delay ripple deviations are equal, the absolute value of the amplitude of the phase is smaller when the number of ripples is greater, and hence the modulation precision is regarded to depend on the absolute value of the phase amplitude, not on the group delay ripple deviation. That is, if the group delay ripple deviations are identical, it is advantageous for the improvement of modulation precision when the number of ripples is greater.

It is estimated from the above analysis result that the factor directly affecting the modulation precision is not the group delay ripple deviation, but the phase deviation. Accordingly, the relation between phase characteristic and modulation precision is studied. The object of review is the root roll-off characteristic with the 3 dB bandwidth of 10.5 kHz and roll-off factor $\alpha$ of 0.5, same as in the case of group delay ripple deviation.

Figure 43:
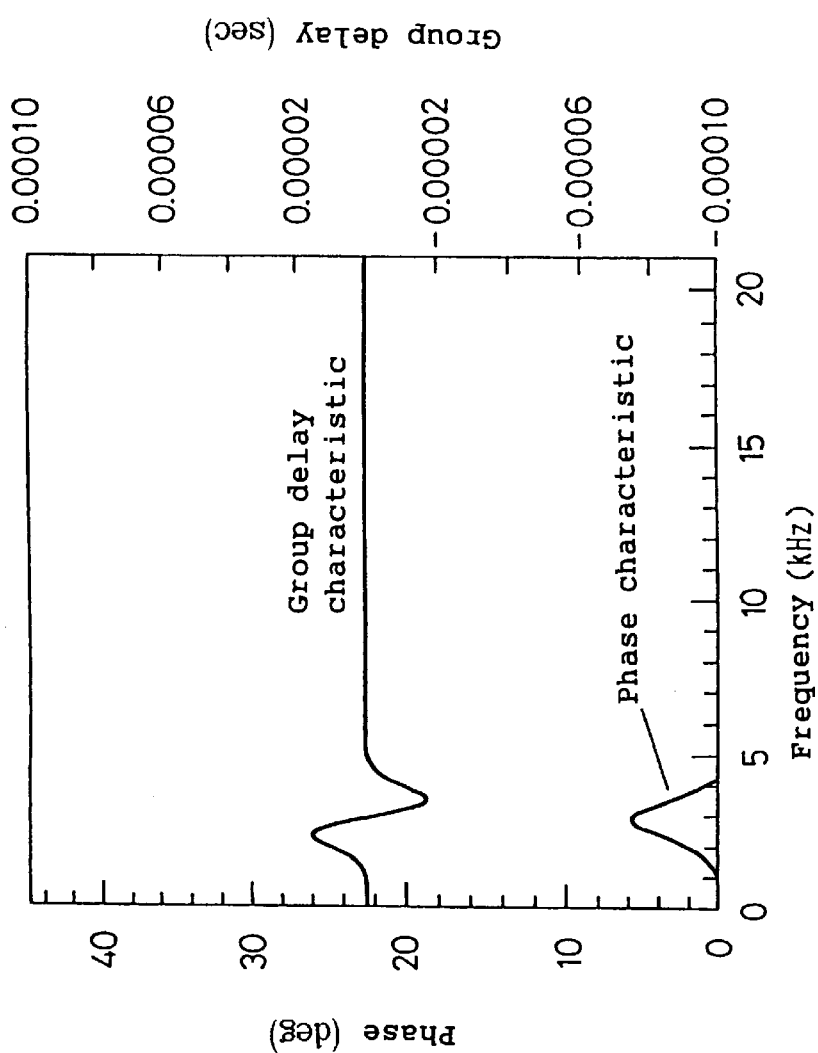
FIG. 43 is a phase deviation and group delay characteristic diagram in the presence of phase deviation in specific frequency range (moderate phase change).
Figure 44:
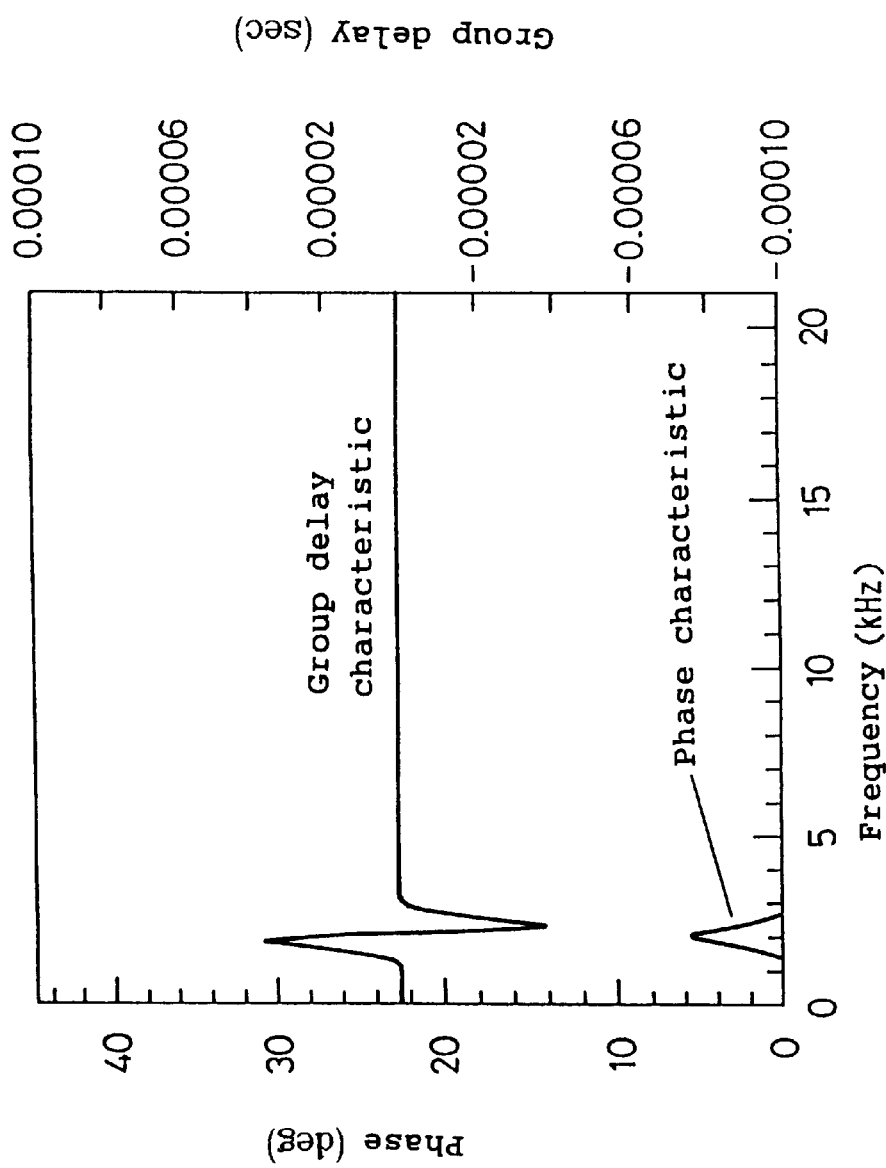
FIG. 44 is a phase deviation and group delay characteristic diagram in the presence of phase deviation in specific frequency range (steep phase change).

FIG. 43 and FIG. 44 show the phase deviation characteristic when there is phase deviation only in a certain frequency range, and the group delay characteristic corresponding to such phase deviation (the phase deviation characteristic is expressed by the portion of change from the standard line, by standardizing the region where the phase changes linearly by a straight line of phase deviation=0).

It was simulated to determine the relation between the frequency and modulation precision when the phase deviation is the maximum value by varying the frequency at which the phase deviation is maximum without changing the profile of phase deviation (that is, moving the profile of phase deviation parallel on the frequency axis). The result is shown in FIG. 45.

Figure 55:
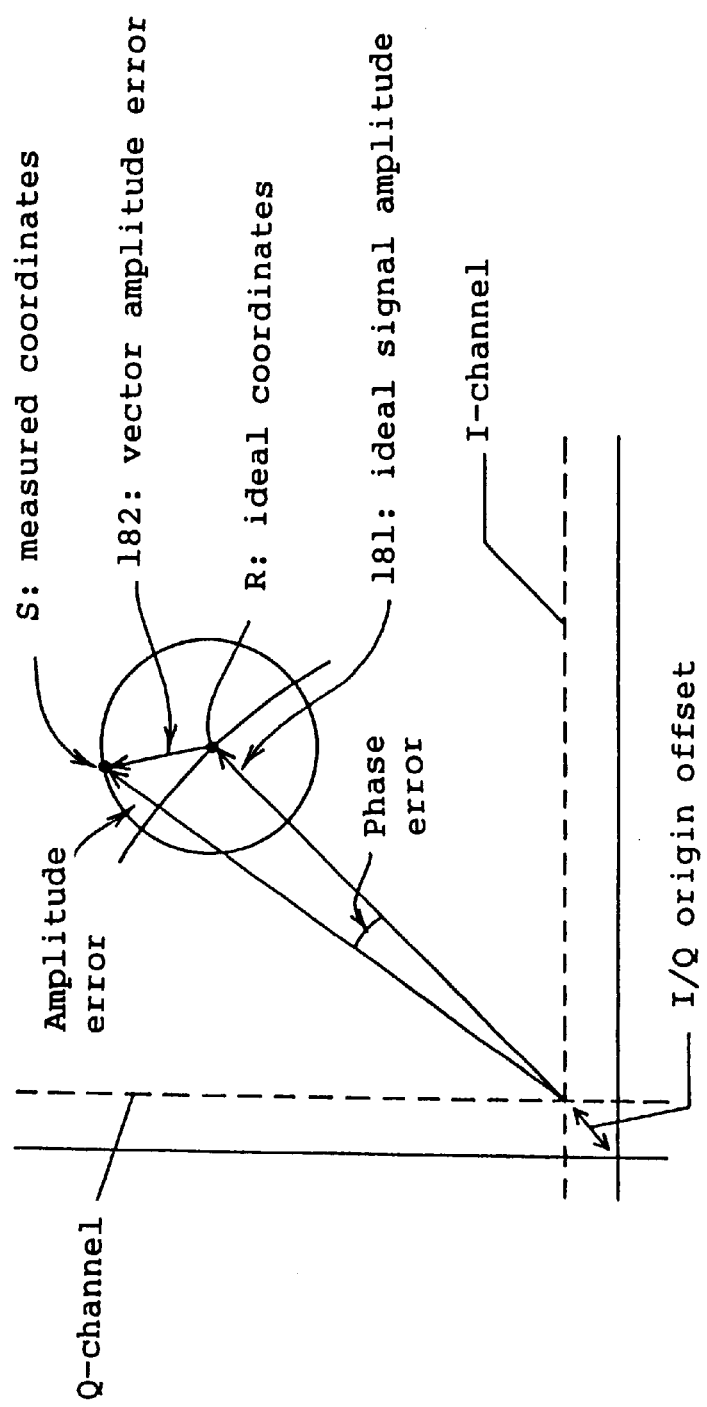
FIG. 55 is an explanatory diagram of vector amplitude error for defining the modulation precision.

As a tendency, it is known that the effect on the modulation precision is smaller when the phase deviation is remoter from the center frequency. FIG. 43 and FIG. 44 show the phase characteristic having the same maximum phase deviation, but FIG. 55 shows a steeper phase change, and hence its group delay deviation is about two times larger than in FIG. 43.

Figure 45:
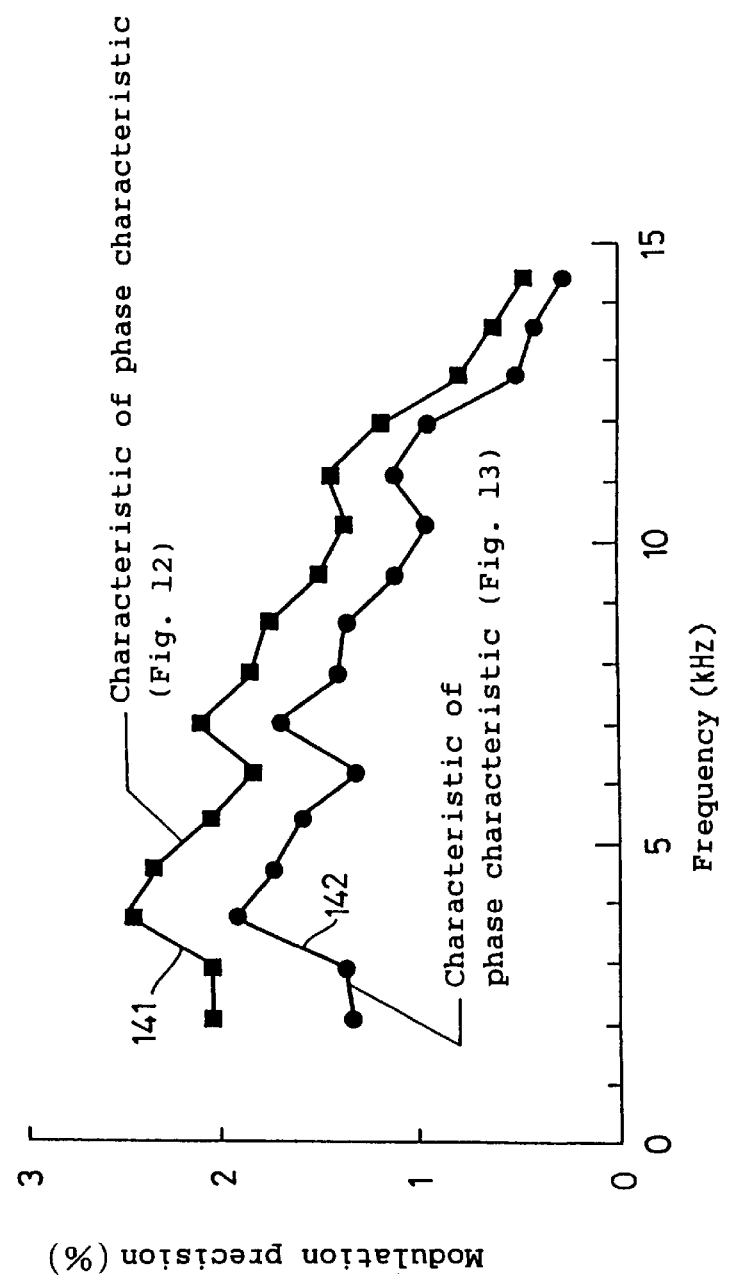
FIG. 45 is a relative diagram of phase deviation maximum frequency and modulation precision.
Figure 46:
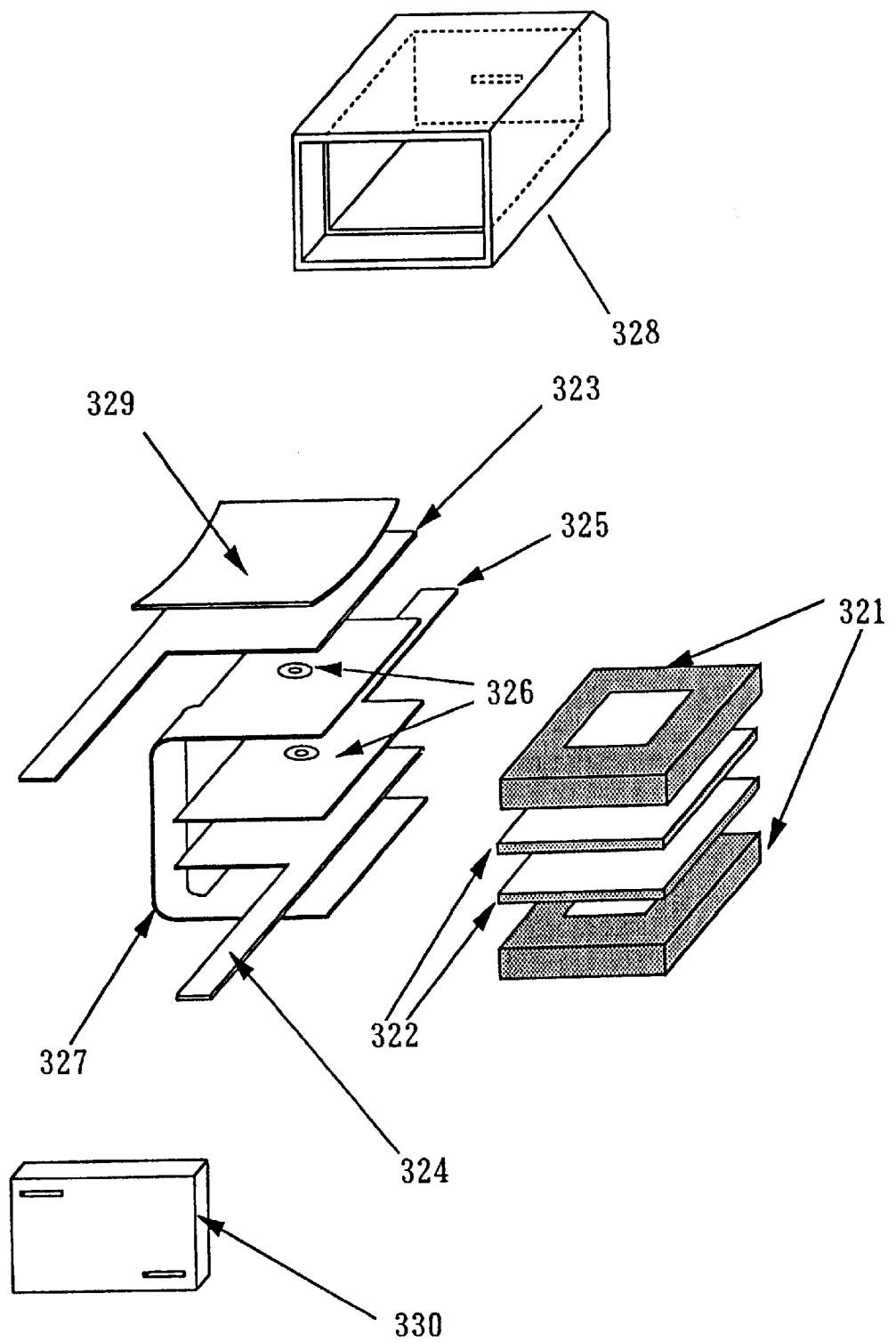
FIG. 46 is a perspective exploded view showing a constitution of a conventional ladder type piezoelectric filter.
Figure 47:
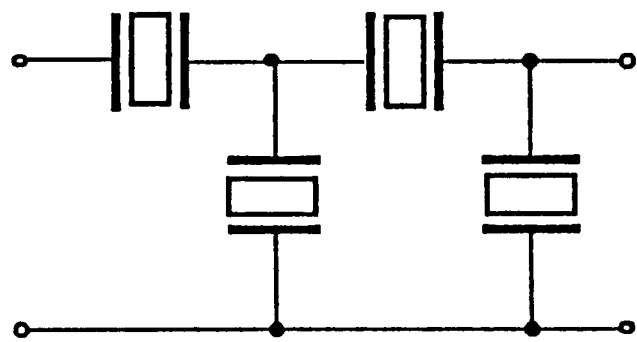
FIG. 47 is an equivalent circuit diagram of the conventional ladder type piezoelectric filter in FIG. 46.
Figure 48:
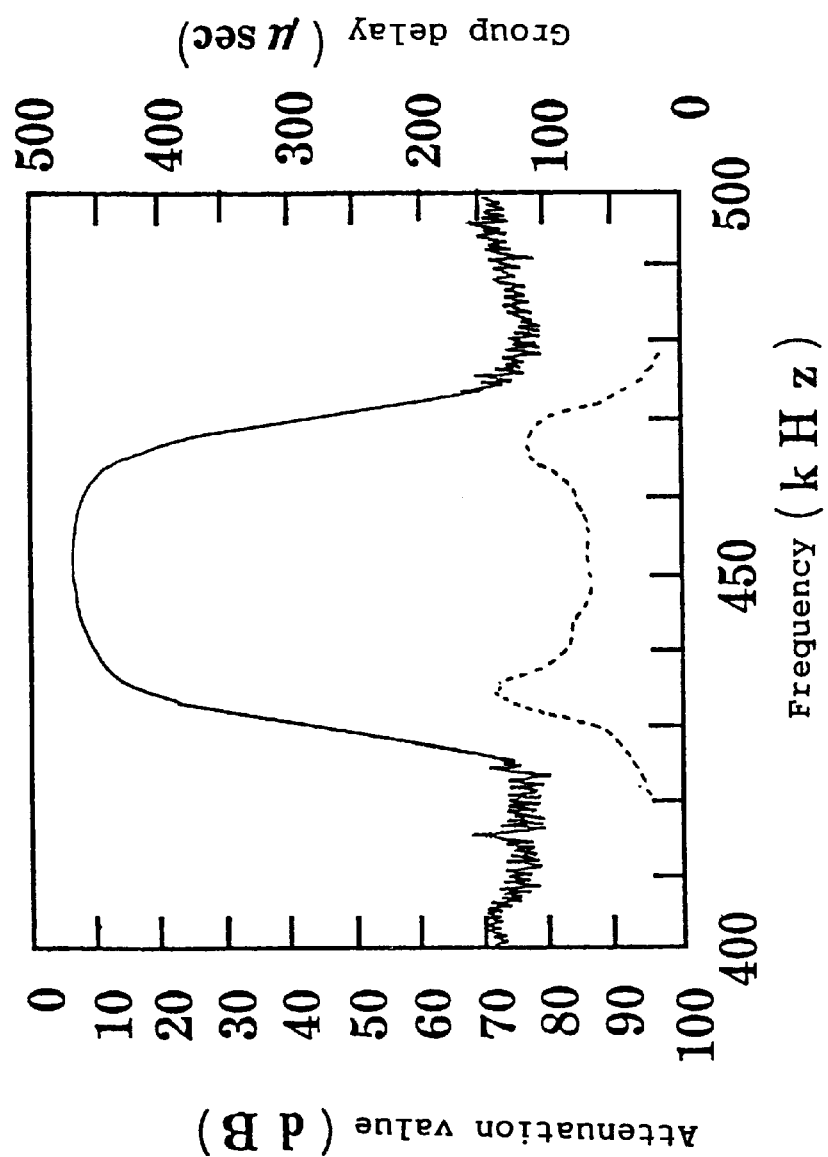
FIG. 48 is a characteristic diagram of the conventional ladder type piezoelectric filter.
Figure 49:
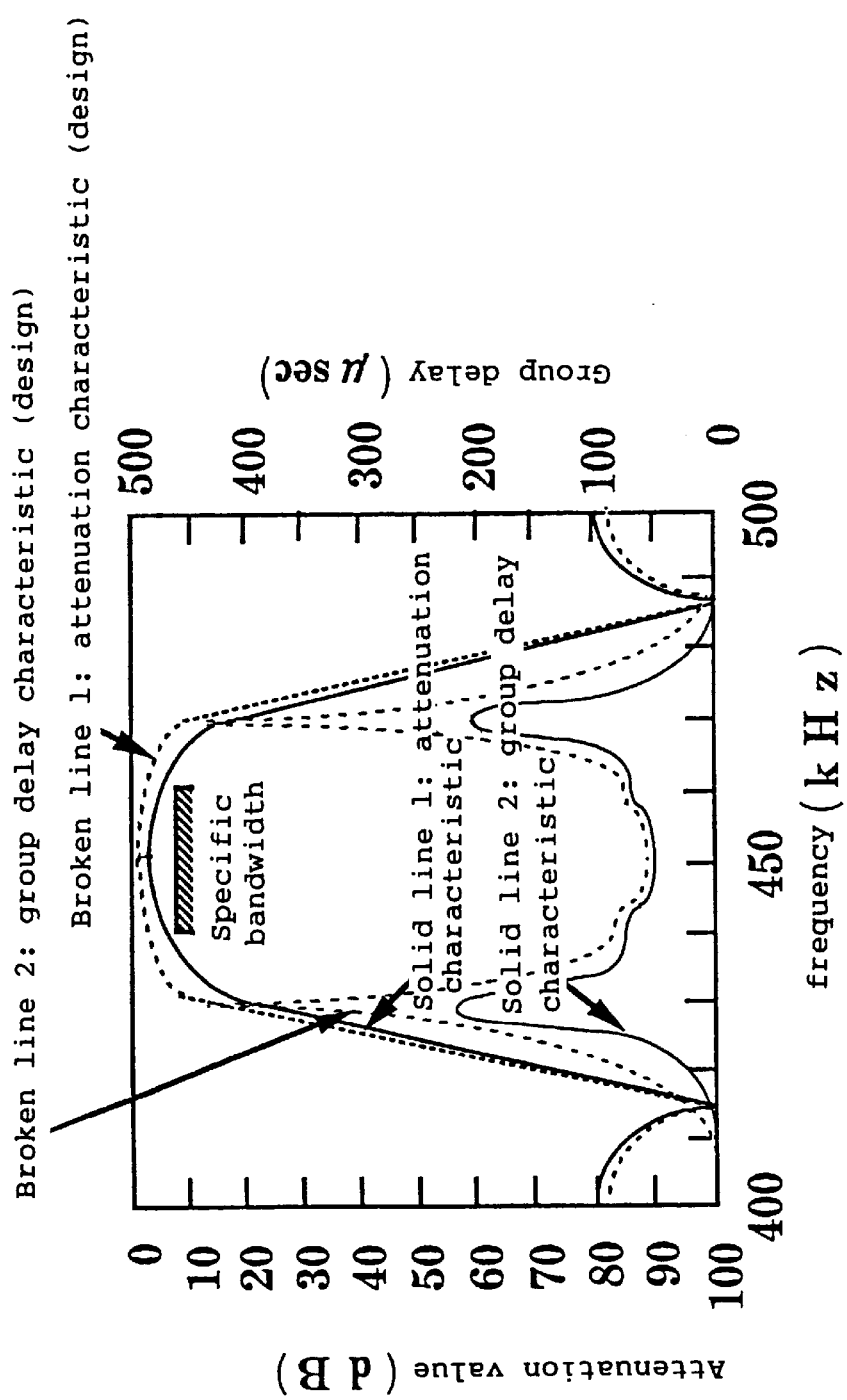
FIG. 49 is a filter characteristic diagram for explaining a design technique of the conventional ladder type piezoelectric filter.
Figure 50:
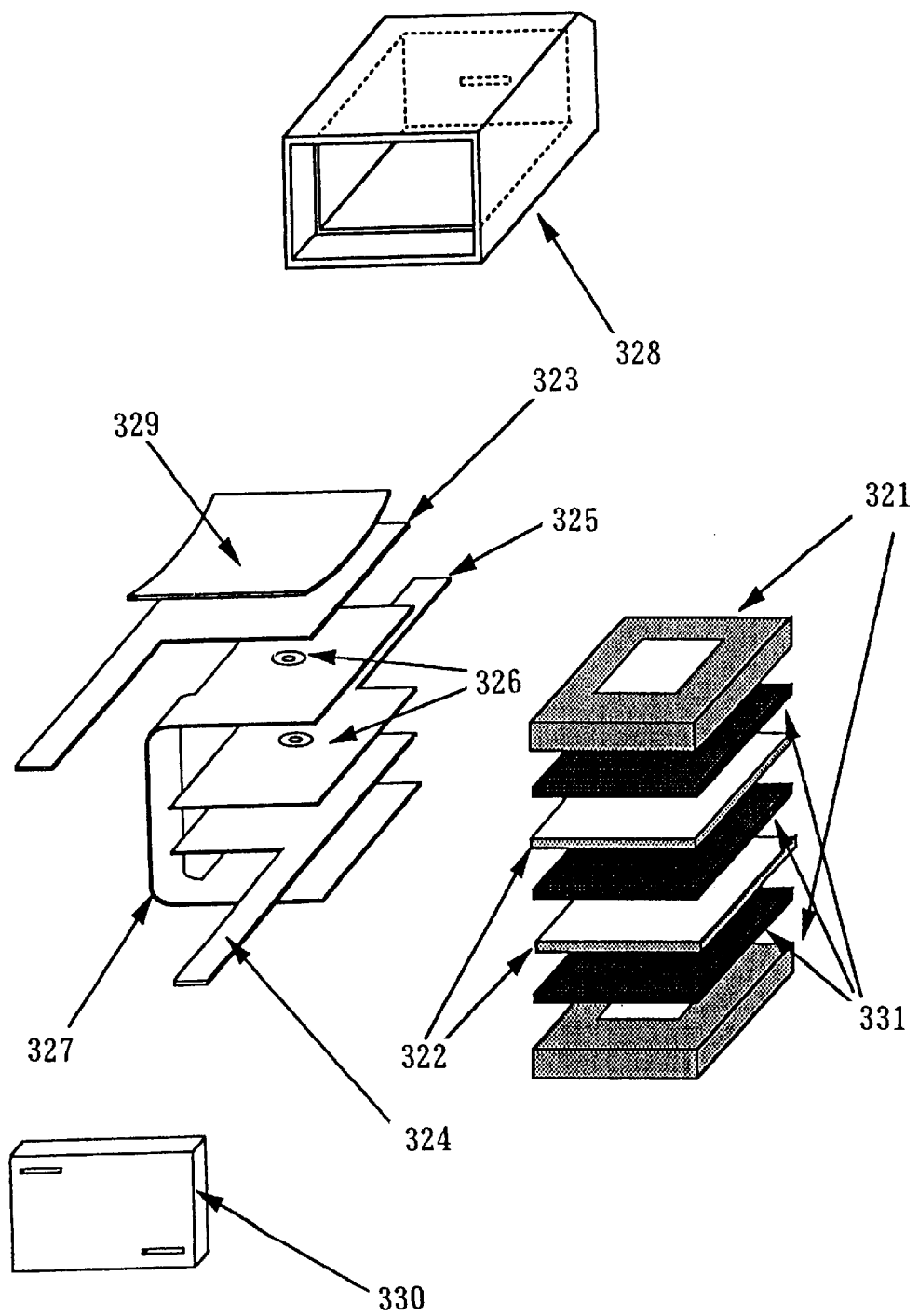
FIG. 50 if a structural diagram showing an example of method of improving the filter characteristic of the conventional ladder type piezoelectric filter.
Figure 51:
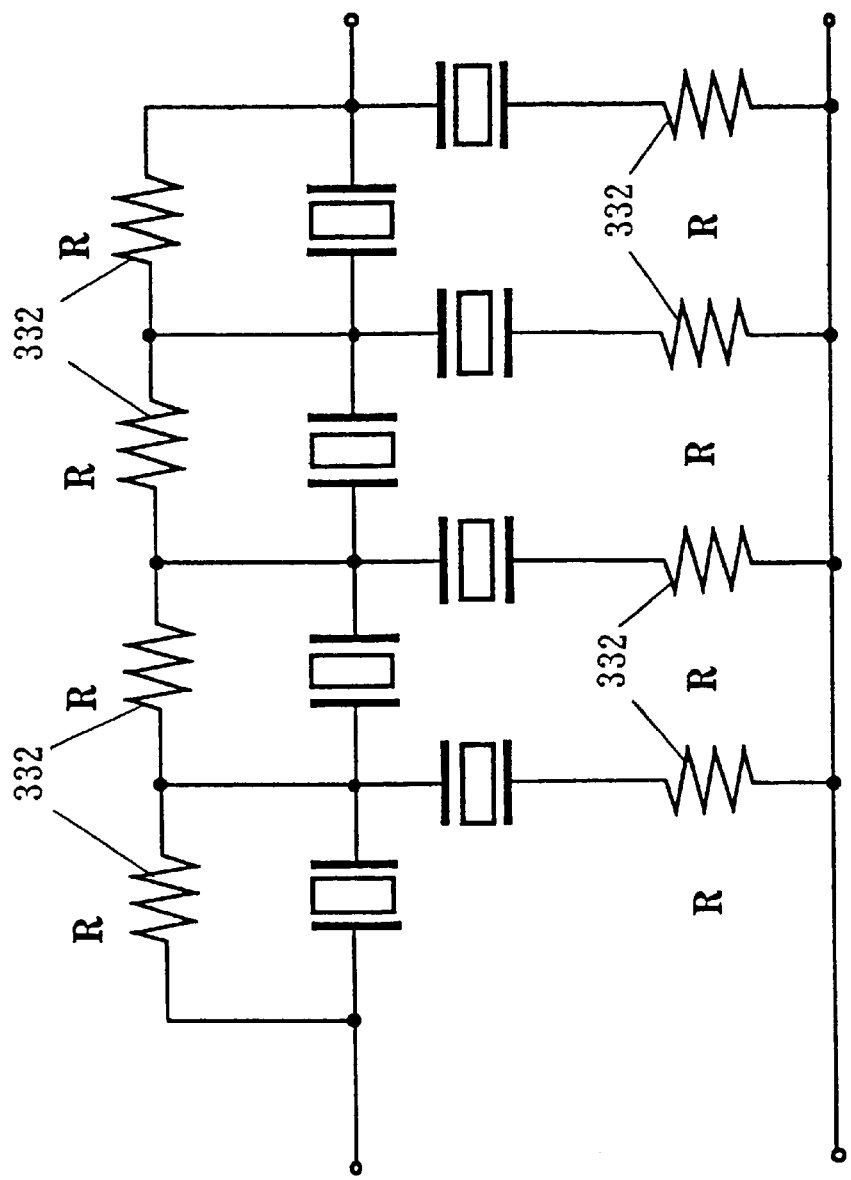
FIG. 51 is a structural diagram showing other example of method of improving the filter characteristic of the conventional ladder type piezoelectric filter.
Figure 52:
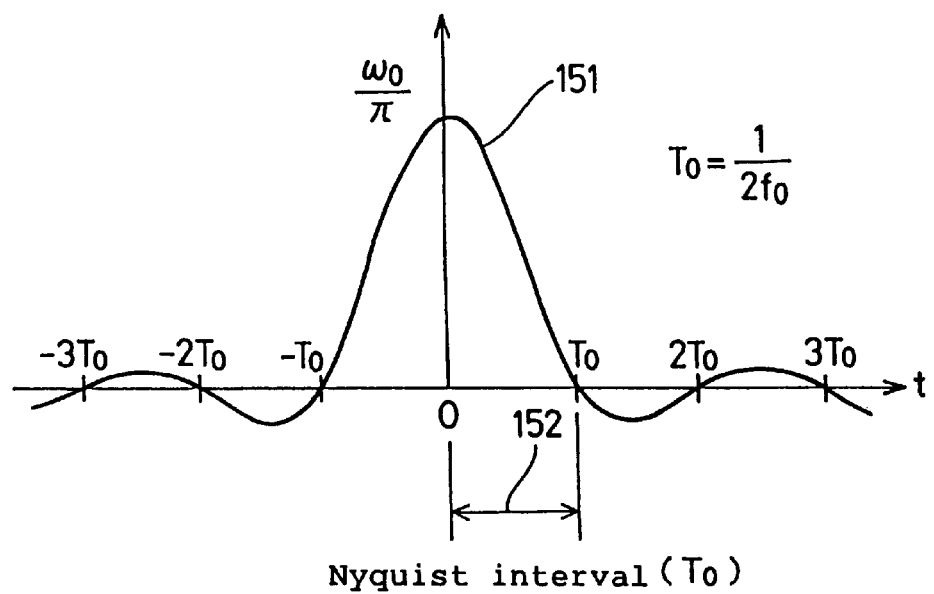
FIG. 52 is an impulse response waveform of an ideal low frequency filter.
Figure 53:
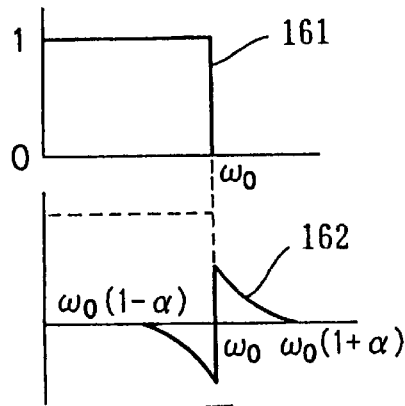
FIG. 53 is a schematic diagram for explaining roll-off addition to the ideal low frequency filter.
Figure 53:
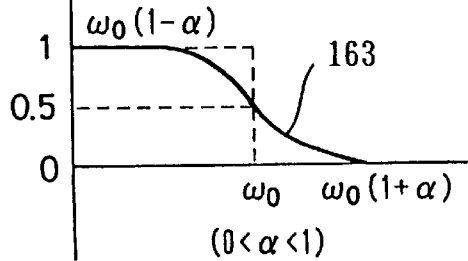
Figure 53:
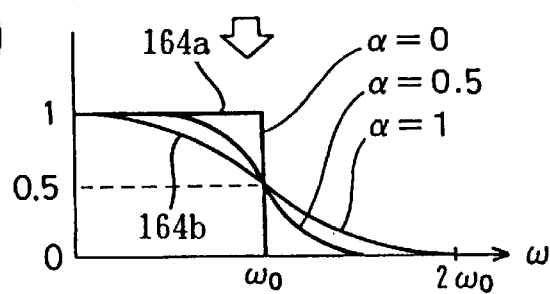
Figure 53:
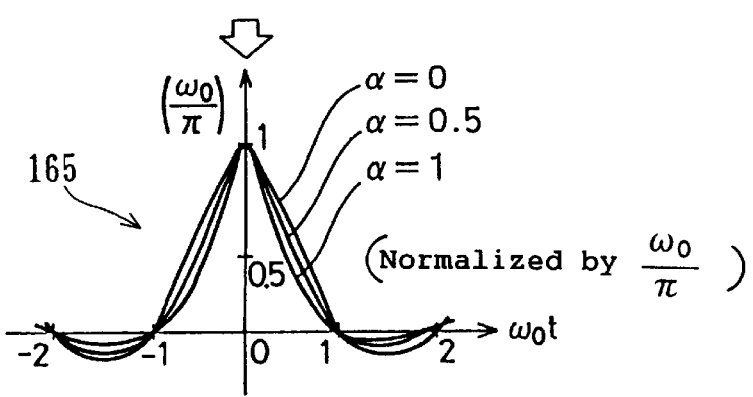
Figure 54:
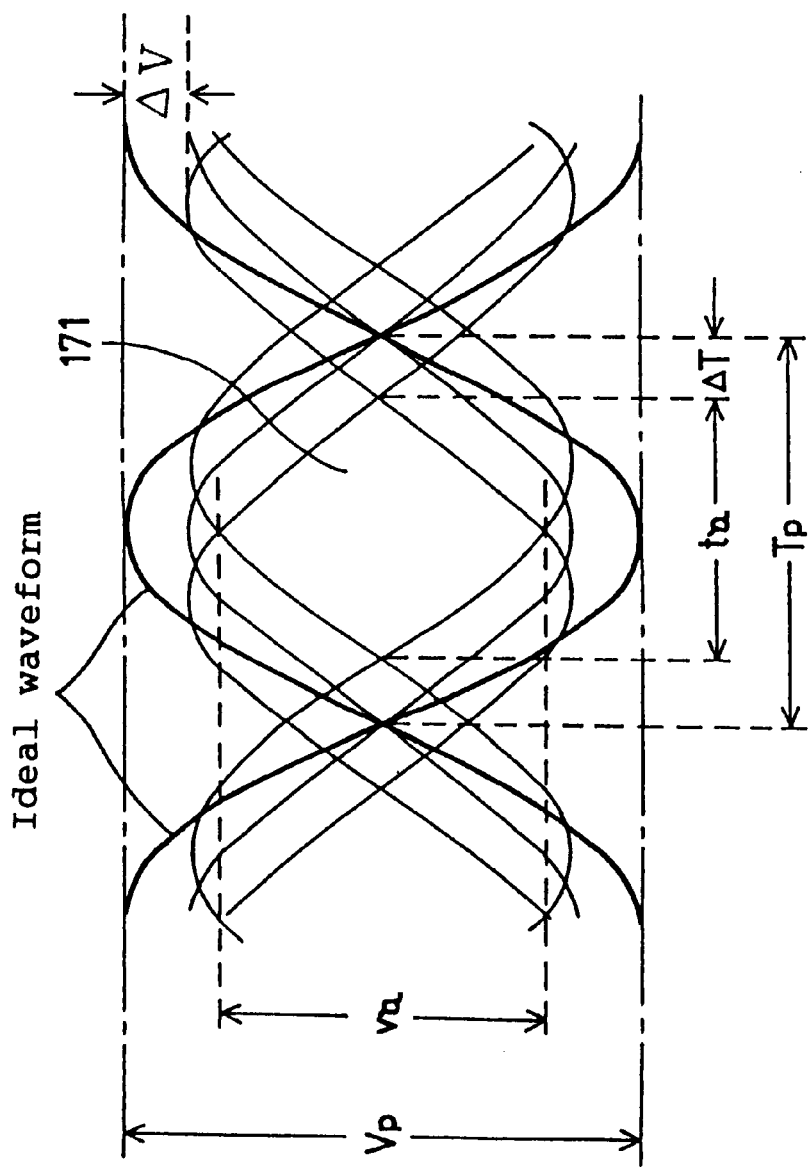
FIG. 54 is a schematic diagram of an eye diagram.

Incidentally, FIG. 45 suggests that the characteristic 142 in FIG. 44 is more preferable as the modulation precision than the characteristic 141 in FIG. 43. Hence, when the phase deviation is equal, it is known insufficient to evaluate the modulation precision by the group delay deviation (the phase differentiated by frequency) alone. Furthermore, when the phase deviation is equal, it is confirmed that the sudden change of phase is effective for improvement of modulation precision.

Thus, in the intermediate frequency filter of the embodiment, by evaluating the filter characteristic from the aspect of modulation precision, the following facts have been disclosed.

1. Concerning the amplitude characteristic:
   (1) When the 3 dB bandwidth is narrower than in the root roll-off characteristic, the deterioration of modulation precision is smaller when the roll-off factor is larger.
   (2) As the amplitude characteristic, the root roll-off characteristic is ideal, but if out of this characteristic, the deterioration of modulation precision is smaller when the band is narrower than in the root roll-off characteristic within the 3 dB band, and when the band is wider than in the root roll-off characteristic outside the 3 dB band.
   (3) The largest rate of deterioration is confirmed when the band is narrower than in the root roll-off characteristic outside the 3 dB band.
   (4) When actually composing a filter, it is hard to keep the roll-off factor below 0.5, and therefore the amplitude characteristic within the 3 dB band is effective for the modulation precision.
   (5) When the roll-off factors are equal, the degree of deterioration of modulation precision is smaller when the 3 dB bandwidth is wider with respect to the reference value (±10.5 kHz) than when narrower. Hence, by designing the bandwidth wider preliminarily, a filter smaller in effect on the frequency deviation is obtained.

2. Concerning the group delay characteristic:
   (1) Provided the group delay ripple deviations are same, the greater number of ripples is more advantageous to the modulation precision. Hence, the modulation precision is estimated to be related with the phase deviation.
   (2) When there is a phase deviation, the effect on the modulation precision is smaller when the phase position is remoter from the center frequency of the filter.
   (3) If the phase deviation is extreme, the modulation precision is superior when the phase changes in a narrow frequency range (the phase characteristic is steep), as compared with the case of phase change in a wide frequency range. Hence, the group delay deviation is not regarded to be related directly with the modulation precision.

On the basis of the review result of the filter characteristic for digital signal transmission from the aspect of the modulation precision evaluation mentioned above, a trial piece of eight-element ceramic filter was fabricated at the filter center frequency of 450 kHz, using a resonator of length expander mode. The modulation precision obtained by using this ceramic filter as intermediate frequency filter ranged from 4.9% to 6.8%, which proved to satisfy the practical characteristic sufficiently.

In the intermediate frequency filter of the embodiment, an example of ceramic filter is explained, but by using any other elements having the same functions, such as elastic surface wave element, CCD, various semiconductor functional elements, integrated switched capacitor element, and others, the same intermediate frequency filter as the intermediate frequency filter disclosed in the embodiment can be composed, and the same effects can be obtained.

What is claimed is:

1. A ladder type piezoelectric filter characterized by connecting plural stages of units connecting series elements and parallel elements using piezoelectric resonators in an L-form, wherein the bandwidth of the input stage unit and the bandwidth of the output stage unit of the plural stages of units are substantially the same, and the bandwidth is larger than the bandwidth of the intermediate stage unit.

2. A ladder type piezoelectric filter of claim 1, wherein the connected units are an even number of four units or more, and the bandwidth of each unit is set so as to increase gradually from the middle to the input side and to the output side, symmetrically to the middle of the input stage unit and output stage unit.

3. A ladder type piezoelectric filter comprising plural stare units including piezoelectric resonators in an L-form, the filter having an input side matching impedance and an output side matching impedance that are substantially equal, and the filter having an input stage unit and an output stare unit, wherein a value of a matching impedance of the output stage unit is the same as a value of the square of the input side matching impedance or the output side matching impedance divided by a matching impedance of the input stage unit, and a product of matching impedances of any pair of stage units at symmetrical positions about a center of connecting plural stage units is substantially equal to a product of the matching impedance of the output stage unit and the matching impedance of the input stage unit.

4. A ladder type piezoelectric filter of claim 3, wherein the matching impedance of the input stage unit and the matching impedance of the output stage unit are substantially equal, and the value of the matching impedances of the input stage unit and the output stage unit are equal to a matching impedance of the filter.

5. A ladder type piezoelectric filter of claim 3, wherein the number of units is four units, and a matching impedance of a second unit from the input stare unit is larger than a matching impedance of a third unit from the input stage unit.

6. A ladder type piezoelectric filter of claim 3, wherein the number of units is four units, and a matching impedance of a second unit from the input stage unit is smaller than a matching impedance of a third unit from the input stage unit.

7. A ladder type piezoelectric filter comprising plural stage units including piezoelectric resonators in an L-form, the filter having an input stage unit and an output stage unit, wherein a bandwidth of the input stage unit and a bandwidth of the output stage unit are substantially the same, the bandwidths of the input stage unit and the output stage unit are larger than the bandwidth of an intermediate stage unit, an input side matching impedance and an output side matching impedance are substantially equal, and a value of the matching impedance of the output stage unit is the same as a value of a square of the input side matching impedance or the output side matching impedance divided by a matching impedance of the input stage unit, and a product of matching impedances of any pair of stage units at symmetrical positions about a center of connecting plural stage units is substantially equal to a product of the matching impedance of the output stage unit and the matching impedance of the input stage unit.

8. A ladder type piezoelectric filter of claim 7, wherein a number of units is an even number of at least four units, and the bandwidth of each unit is set so as to increase gradually from a middle stage unit out to the input and output sides.

9. A ladder type piezoelectric filter comprising plural stages of units including piezoelectric resonators in an L-form, wherein a bandwidth of an input stage unit and a bandwidth of an output stage unit are substantially the same, and the bandwidths of the input stage unit and the output stage unit are smaller than a bandwidth of an intermediate stage unit, and further an input side matching impedance and an output side matching impedance are substantially equal, and a value of a matching impedance of the output stage unit is a value of a square of the input side matching impedance or the output side matching impedance divided by a matching impedance of the input stage unit, and a product of matching impedances of any pair of stare units at symmetrical positions about a center of connecting plural stage units is substantially equal to a product of the matching impedance of the output stage unit and the matching impedance of the input stage unit.

10. A ladder type piezoelectric filter of claim 9, wherein the connected units are an even number of at least four units, and a bandwidth of each unit is set so as to decrease gradually from a middle stage unit out to the input and output sides.

11. A ladder type piezoelectric filter of claim 7, wherein the number of units is four units, and a second unit from the input stare unit and a third unit from the input stage unit are substantially equal in bandwidth, the input side matching impedance and the output side matching impedance are substantially equal, and a product of a matching impedance of the second unit and a matching impedance of the third unit is substantially equal to a product of the matching impedance of the output stage unit and the matching impedance of the input stage unit.

\* \* \* \* \*